US012690409B2

(12) United States Patent
Ikenoue et al.

(10) Patent No.: US 12,690,409 B2
(45) Date of Patent: Jul. 21, 2026

(54) MACHINE LEARNING METHOD, LASER ANNEALING SYSTEM, AND LASER ANNEALING METHOD

(71) Applicants: Kyushu University, National University Corporation, Fukuoka (JP); Gigaphoton Inc., Tochigi (JP)

(72) Inventors: Hiroshi Ikenoue, Fukuoka (JP); Akira Mizutani, Oyama (JP)

(73) Assignees: Kyushu University, National University Corporation, Fukuoka (JP); Gigaphoton Inc., Tochigi (JP)

( * ) Notice: Subject to any disclaimer, the term of this patent is extended or adjusted under 35 U.S.C. 154(b) by 439 days.

(21) Appl. No.: 18/351,675

(22) Filed: Jul. 13, 2023

(65) Prior Publication Data

US 2023/0377916 A1     Nov. 23, 2023

Related U.S. Application Data

(63) Continuation of application No. PCT/JP2021/003721, filed on Feb. 2, 2021.

(51) Int. Cl.
*H10P 72/00* (2026.01)
*G06N 3/08* (2023.01)
(Continued)

(52) U.S. Cl.
CPC ........... *H10P 72/0436* (2026.01); *G06N 3/08* (2013.01); *H10P 34/42* (2026.01); *H10P 72/7618* (2026.01)

(58) Field of Classification Search
CPC ............. H01L 21/67115; H01L 21/268; H01L 21/68764; H01L 22/12; H01L 22/14;
(Continued)

(56) References Cited

U.S. PATENT DOCUMENTS

2009/0291511 A1   11/2009   Umezu et al.
2016/0148850 A1    5/2016   David
(Continued)

FOREIGN PATENT DOCUMENTS

CN       101587840 A     11/2009
CN       107004060 A      8/2017
(Continued)

OTHER PUBLICATIONS

International Search Report issued in PCT/JP2021/003721; mailed Mar. 23, 2021.
(Continued)

*Primary Examiner* — Thanh Luu
*Assistant Examiner* — Mai Thi Ngoc Tran
(74) *Attorney, Agent, or Firm* — Studebaker Brackett PLLC

(57) ABSTRACT

A machine learning method includes acquiring image data generated from reflected light of illumination light radiated to a first region of a semiconductor film on a substrate, the first region annealed by pulse laser light, acquiring data on a measured semiconductor property of the first region, generating training data including the image data as input and the measured data as output associated with each other, and performing machine learning using a neural network based on the training data to generate a learned model.

15 Claims, 28 Drawing Sheets

(51) Int. Cl.
  H10P 34/42      (2026.01)
  H10P 72/76      (2026.01)

(58) Field of Classification Search
  CPC . H01L 21/20; G06N 3/08; G06N 3/09; B23K
      26/03; H10P 72/0436; H10P 34/42; H10P
        72/7618; H10P 74/203; H10P 74/207;
                              H10P 14/20
  See application file for complete search history.

(56)                References Cited

U.S. PATENT DOCUMENTS

| | | |
|---|---|---|
| 2017/0270434 A1 | 9/2017 | Takigawa et al. |
| 2017/0345140 A1 | 11/2017 | Zhang et al. |
| 2018/0350622 A1* | 12/2018 | Ikenoue ............ H01L 21/02532 |
| 2022/0281029 A1* | 9/2022 | Mizumura ............... H05K 3/08 |

FOREIGN PATENT DOCUMENTS

| | | |
|---|---|---|
| JP | 2012-119512 A | 6/2012 |
| JP | 2016-129171 A | 7/2016 |
| JP | 2017-164801 A | 9/2017 |
| WO | 2006/055003 A1 | 5/2006 |
| WO | 2021/005907 A1 | 1/2021 |

OTHER PUBLICATIONS

International Preliminary Report On Patentability and Written Opinion issued in PCT/JP2021/003721; issued Aug. 3, 2023.
van der Wilt, Paul C., Excimer-Laser Annealing: Microstructure Evolution and a Novel Characterization Technique, Invited Paper, SID 2014 DIGEST, 2014, pp. 149-152.
Office Action issued in CN 202180088721.0; mailed by the State Intellectual Property Office of the People's Republic of China on Apr. 18, 2026.

* cited by examiner

10 LASER ANNEALING SYSTEM

14 LASER ANNEALING APPARATUS

LASER ANNEALING PROCESSOR ~100

102

101

CPU

MEMORY

150

113

112

120

134

130

136

122

124

123

121

140

115

114

13

145

143

144

146

111

12 LASER
APPARATUS

Sr(k)

SUB

170

176

172

174

Z

X ⊙ Y

140

141

Z ⊙ Y

X

RADIATION CONDITIONS

| RADIATION RECEIVING REGIONS | TARGET FLUENCE VALUES | NUMBER OF RADIATION PULSES |
|---|---|---|
| Sr(1) | Ft(1) | Np(1) |
| Sr(2) | Ft(2) | Np(2) |
| Sr(3) | Ft(3) | Np(3) |
| . . . | . . . | . . . |
| Sr(Kmax) | Ft(Kmax) | Np(Kmax) |

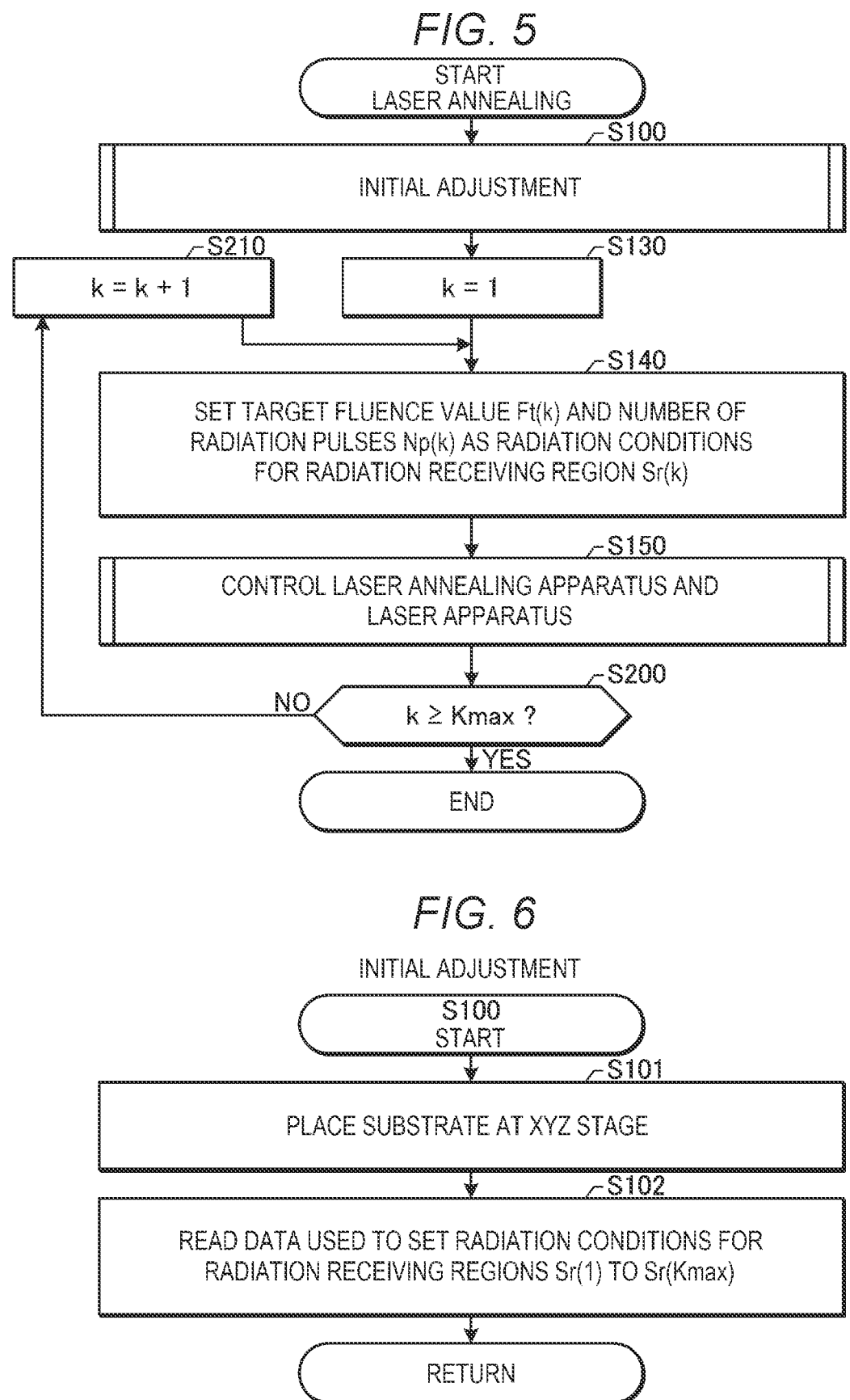

*FIG. 5*

START
LASER ANNEALING

S100

INITIAL ADJUSTMENT

S210
k = k + 1

S130
k = 1

S140

SET TARGET FLUENCE VALUE Ft(k) AND NUMBER OF
RADIATION PULSES Np(k) AS RADIATION CONDITIONS
FOR RADIATION RECEIVING REGION Sr(k)

S150

CONTROL LASER ANNEALING APPARATUS AND
LASER APPARATUS

S200

NO — k ≥ Kmax ?

YES

END

*FIG. 6*

INITIAL ADJUSTMENT

S100
START

S101

PLACE SUBSTRATE AT XYZ STAGE

S102

READ DATA USED TO SET RADIATION CONDITIONS FOR
RADIATION RECEIVING REGIONS Sr(1) TO Sr(Kmax)

RETURN

FIG. 7

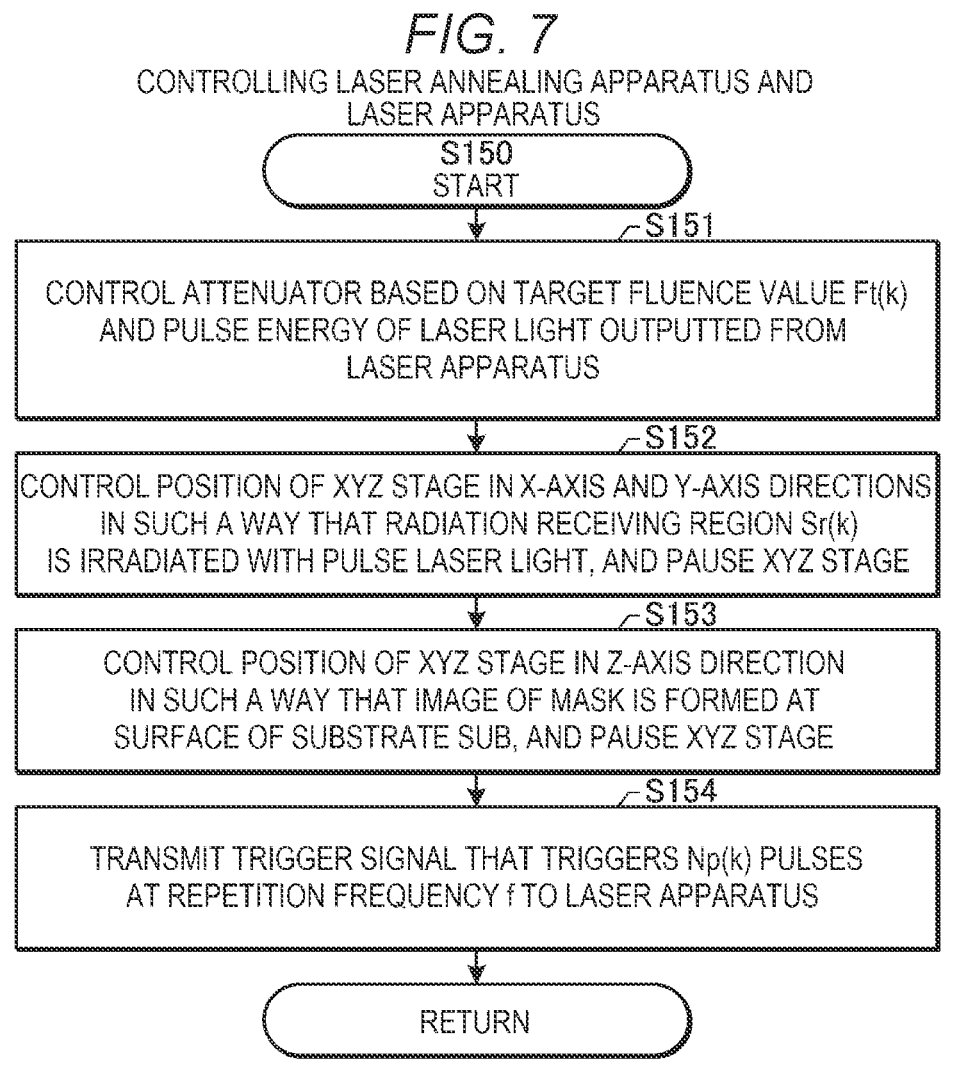

CONTROLLING LASER ANNEALING APPARATUS AND
LASER APPARATUS

S150
START

S151

CONTROL ATTENUATOR BASED ON TARGET FLUENCE VALUE Ft(k)
AND PULSE ENERGY OF LASER LIGHT OUTPUTTED FROM
LASER APPARATUS

S152

CONTROL POSITION OF XYZ STAGE IN X-AXIS AND Y-AXIS DIRECTIONS
IN SUCH A WAY THAT RADIATION RECEIVING REGION Sr(k)
IS IRRADIATED WITH PULSE LASER LIGHT, AND PAUSE XYZ STAGE

S153

CONTROL POSITION OF XYZ STAGE IN Z-AXIS DIRECTION
IN SUCH A WAY THAT IMAGE OF MASK IS FORMED AT
SURFACE OF SUBSTRATE SUB, AND PAUSE XYZ STAGE

S154

TRANSMIT TRIGGER SIGNAL THAT TRIGGERS Np(k) PULSES
AT REPETITION FREQUENCY f TO LASER APPARATUS

RETURN

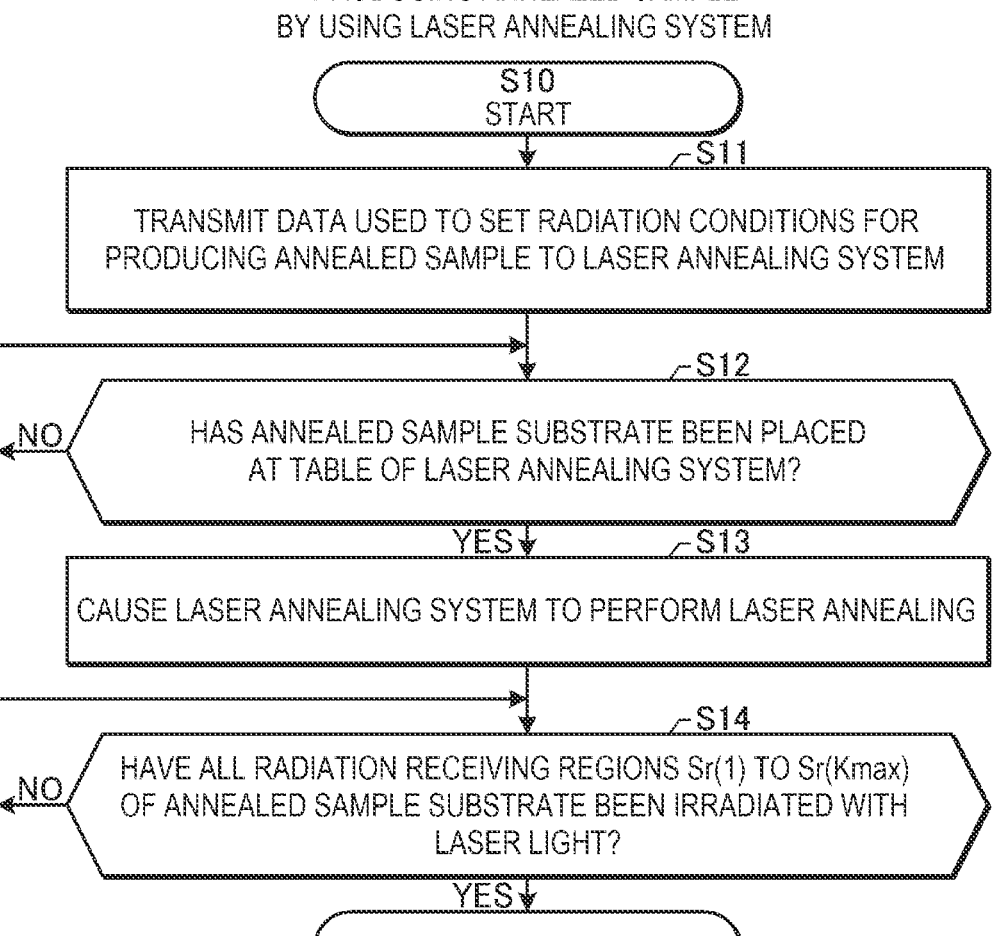

FIG. 10

PRODUCING ANNEALED SAMPLE
BY USING LASER ANNEALING SYSTEM

S10
START

S11

TRANSMIT DATA USED TO SET RADIATION CONDITIONS FOR
PRODUCING ANNEALED SAMPLE TO LASER ANNEALING SYSTEM

S12

NO — HAS ANNEALED SAMPLE SUBSTRATE BEEN PLACED
AT TABLE OF LASER ANNEALING SYSTEM?

YES

S13

CAUSE LASER ANNEALING SYSTEM TO PERFORM LASER ANNEALING

S14

NO — HAVE ALL RADIATION RECEIVING REGIONS Sr(1) TO Sr(Kmax)
OF ANNEALED SAMPLE SUBSTRATE BEEN IRRADIATED WITH
LASER LIGHT?

YES

RETURN

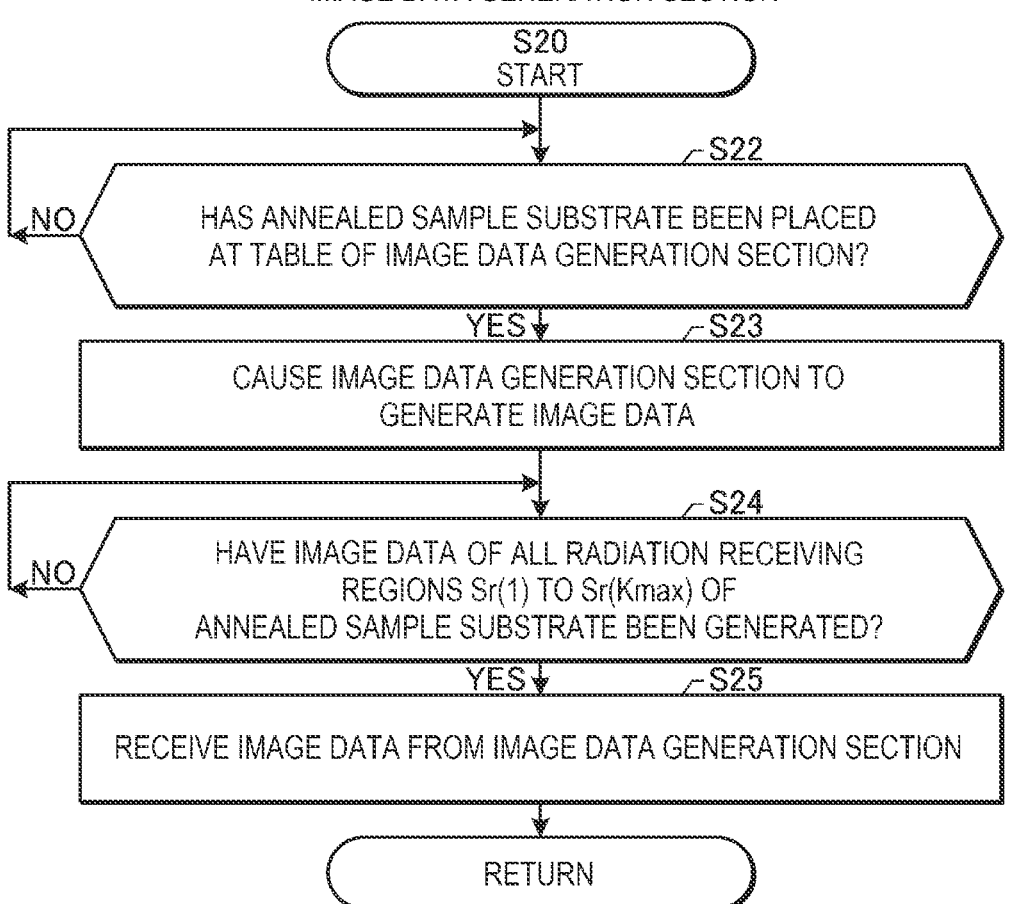

*FIG. 11*

ACQUIRING IMAGE DATA OF ANNEALED SAMPLE BY USING
IMAGE DATA GENERATION SECTION

S20
START

S22
NO — HAS ANNEALED SAMPLE SUBSTRATE BEEN PLACED
AT TABLE OF IMAGE DATA GENERATION SECTION?

YES — S23
CAUSE IMAGE DATA GENERATION SECTION TO
GENERATE IMAGE DATA

S24
NO — HAVE IMAGE DATA OF ALL RADIATION RECEIVING
REGIONS Sr(1) TO Sr(Kmax) OF
ANNEALED SAMPLE SUBSTRATE BEEN GENERATED?

YES — S25
RECEIVE IMAGE DATA FROM IMAGE DATA GENERATION SECTION

RETURN

FIG. 12

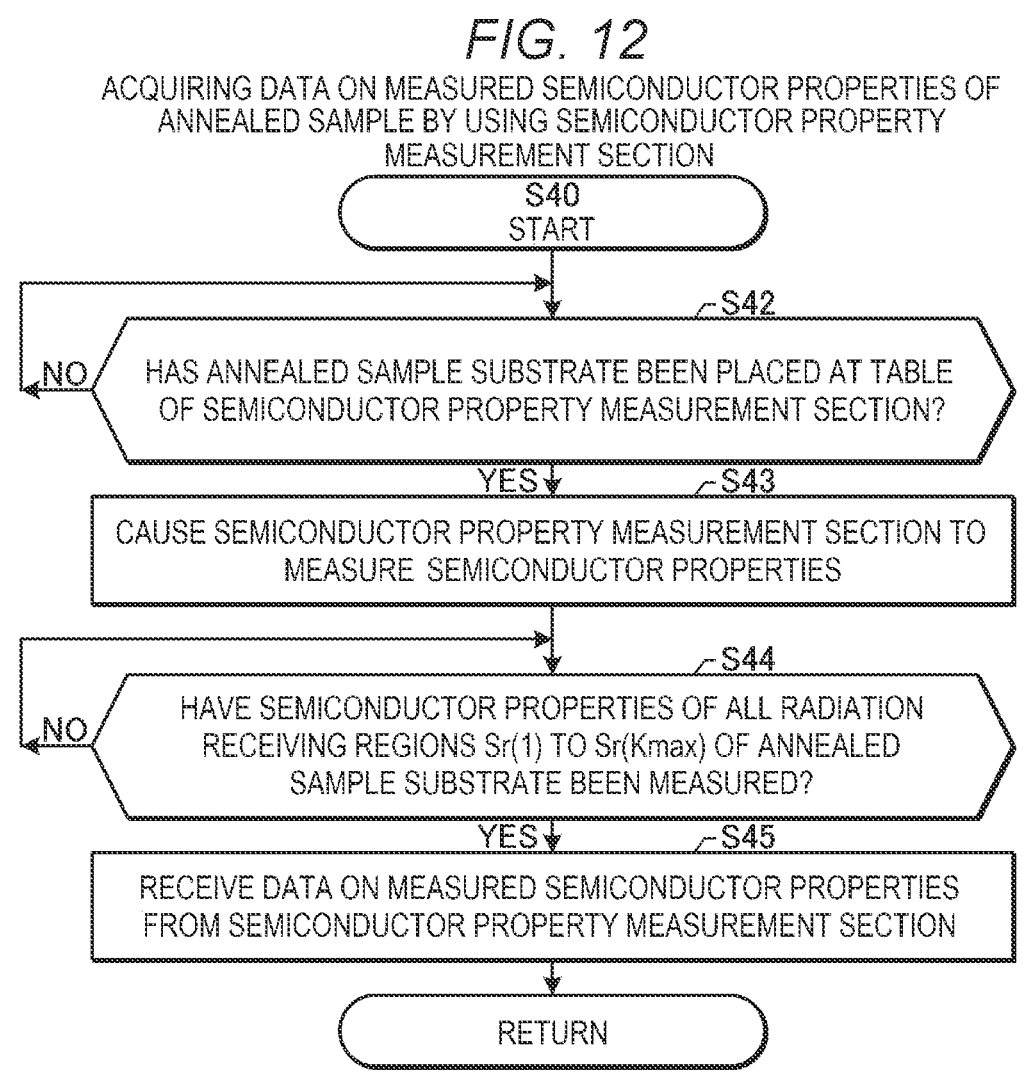

ACQUIRING DATA ON MEASURED SEMICONDUCTOR PROPERTIES OF
ANNEALED SAMPLE BY USING SEMICONDUCTOR PROPERTY
MEASUREMENT SECTION

S40
START

S42
HAS ANNEALED SAMPLE SUBSTRATE BEEN PLACED AT TABLE
OF SEMICONDUCTOR PROPERTY MEASUREMENT SECTION?

NO

YES
S43
CAUSE SEMICONDUCTOR PROPERTY MEASUREMENT SECTION TO
MEASURE SEMICONDUCTOR PROPERTIES

S44
HAVE SEMICONDUCTOR PROPERTIES OF ALL RADIATION
RECEIVING REGIONS Sr(1) TO Sr(Kmax) OF ANNEALED
SAMPLE SUBSTRATE BEEN MEASURED?

NO

YES
S45
RECEIVE DATA ON MEASURED SEMICONDUCTOR PROPERTIES
FROM SEMICONDUCTOR PROPERTY MEASUREMENT SECTION

RETURN

FIG. 13

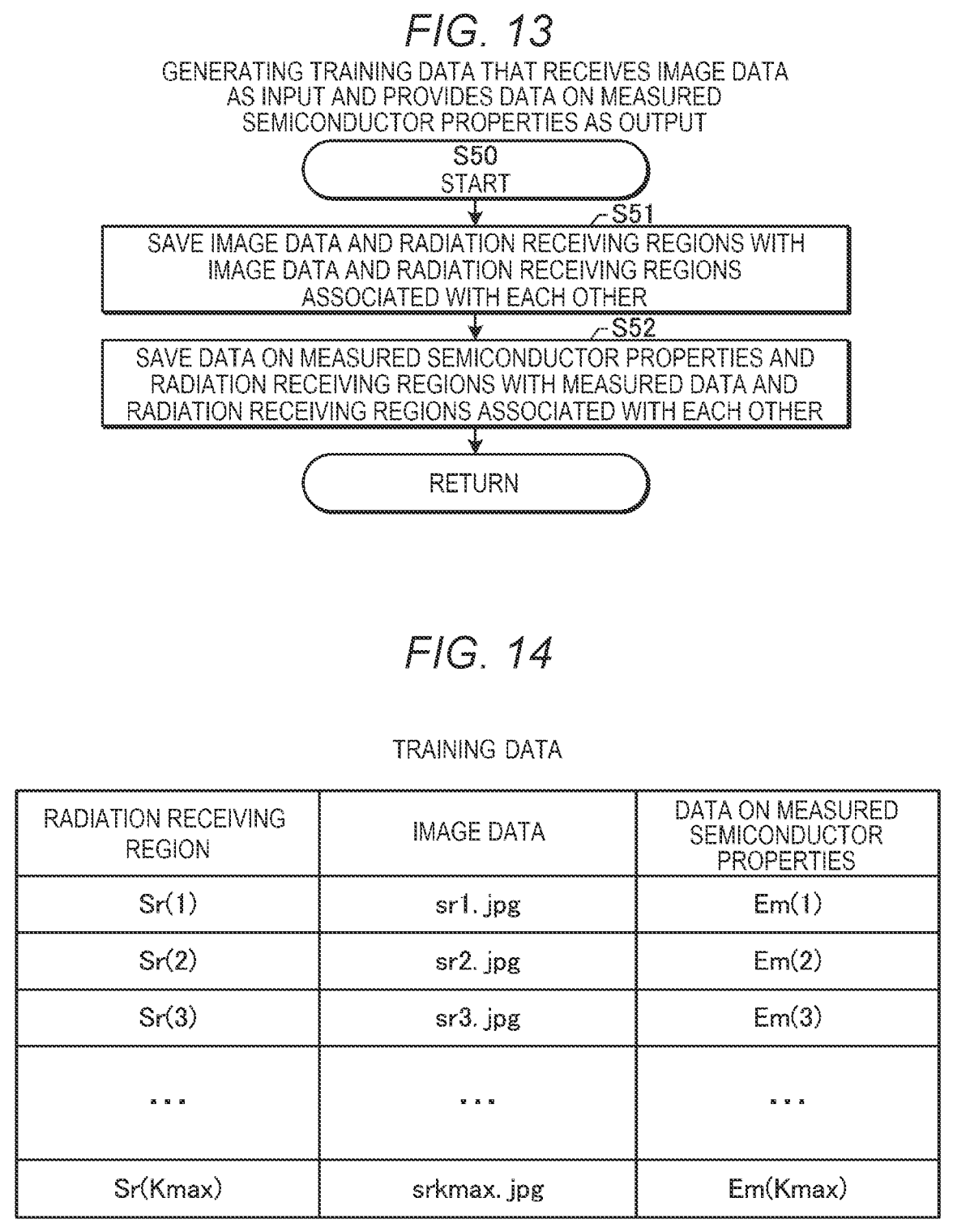

GENERATING TRAINING DATA THAT RECEIVES IMAGE DATA
AS INPUT AND PROVIDES DATA ON MEASURED
SEMICONDUCTOR PROPERTIES AS OUTPUT

S50
START

S51

SAVE IMAGE DATA AND RADIATION RECEIVING REGIONS WITH
IMAGE DATA AND RADIATION RECEIVING REGIONS
ASSOCIATED WITH EACH OTHER

S52

SAVE DATA ON MEASURED SEMICONDUCTOR PROPERTIES AND
RADIATION RECEIVING REGIONS WITH MEASURED DATA AND
RADIATION RECEIVING REGIONS ASSOCIATED WITH EACH OTHER

RETURN

FIG. 14

TRAINING DATA

| RADIATION RECEIVING REGION | IMAGE DATA | DATA ON MEASURED SEMICONDUCTOR PROPERTIES |
|---|---|---|
| $Sr(1)$ | sr1.jpg | $Em(1)$ |
| $Sr(2)$ | sr2.jpg | $Em(2)$ |
| $Sr(3)$ | sr3.jpg | $Em(3)$ |
| ... | ... | ... |
| $Sr(Kmax)$ | srkmax.jpg | $Em(Kmax)$ |

FIG. 15

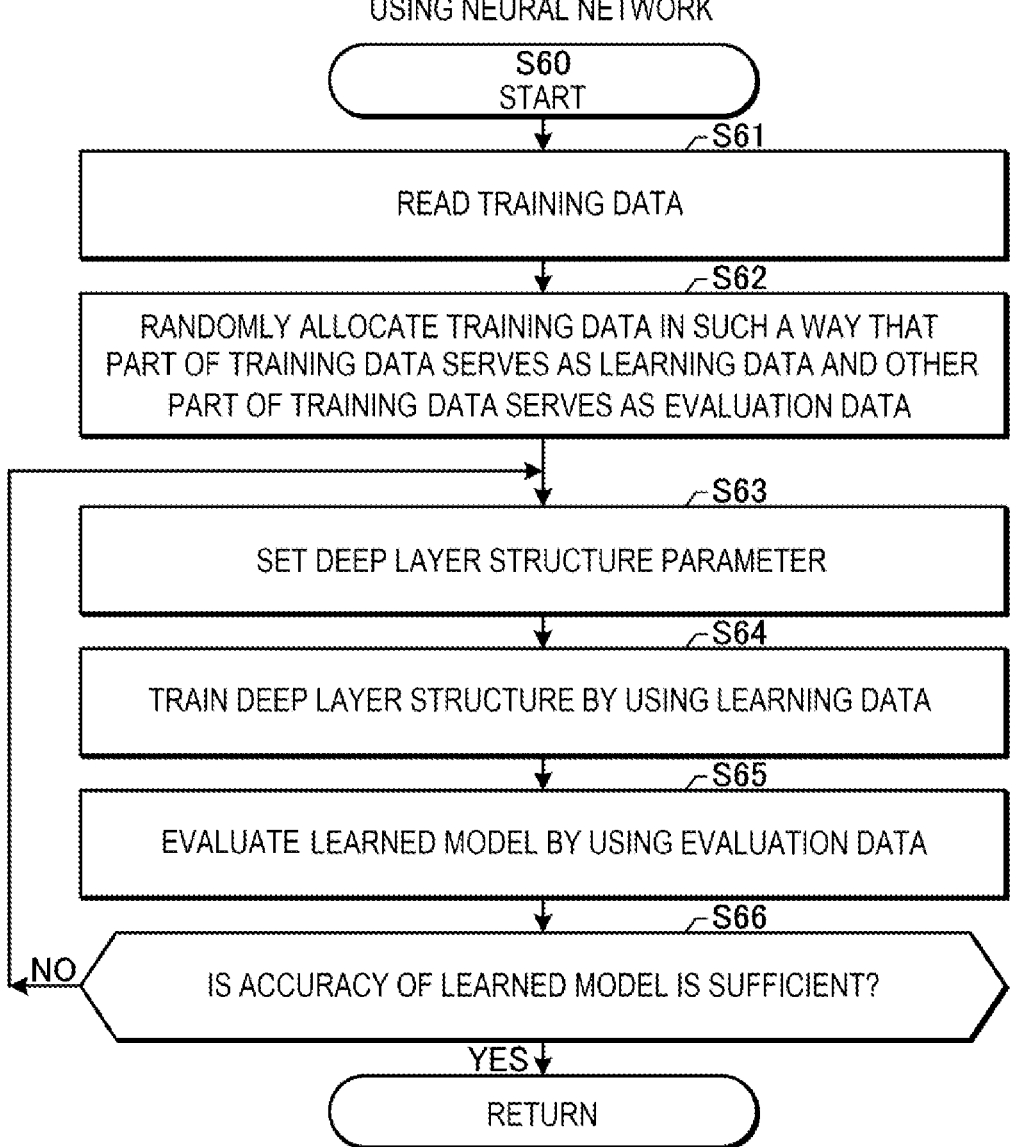

GENERATING LEARNED MODEL BY PERFORMING MACHINE LEARNING USING NEURAL NETWORK

S60
START

S61
READ TRAINING DATA

S62
RANDOMLY ALLOCATE TRAINING DATA IN SUCH A WAY THAT PART OF TRAINING DATA SERVES AS LEARNING DATA AND OTHER PART OF TRAINING DATA SERVES AS EVALUATION DATA

S63
SET DEEP LAYER STRUCTURE PARAMETER

S64
TRAIN DEEP LAYER STRUCTURE BY USING LEARNING DATA

S65
EVALUATE LEARNED MODEL BY USING EVALUATION DATA

S66
IS ACCURACY OF LEARNED MODEL IS SUFFICIENT?

NO

YES

RETURN

10b  LASER ANNEALING SYSTEM

14  LASER ANNEALING APPARATUS

LASER ANNEALING PROCESSOR ～100

102                    101

CPU        MEMORY

150

180    182    113    112

181                    130    120

134                    122
136                    124
                       123
140                    121

115b                   114

145
143
144
146

Sr(k)        SUB    170
            176    172
            174

13

12  LASER
APPARATUS

Figure 21:
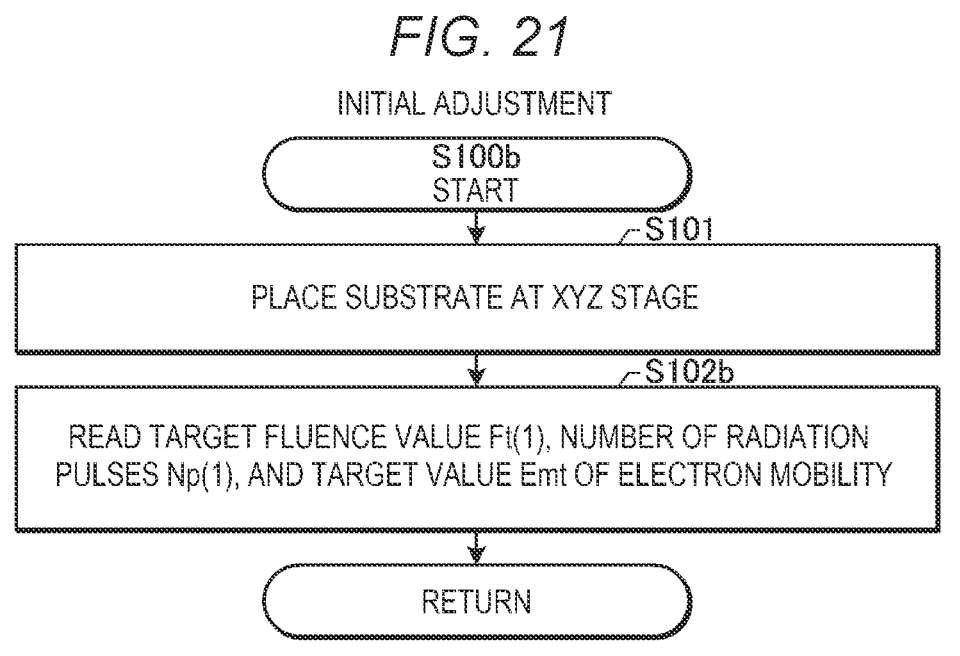

INITIAL ADJUSTMENT

S100b
START

S101

PLACE SUBSTRATE AT XYZ STAGE

S102b

READ TARGET FLUENCE VALUE Ft(1), NUMBER OF RADIATION
PULSES Np(1), AND TARGET VALUE Emt OF ELECTRON MOBILITY

RETURN

FIG. 22

CALCULATING ESTIMATED VALUE Eme(k) OF ELECTRON MOBILITY
BY USING IMAGE DATA AND LEARNED MODEL

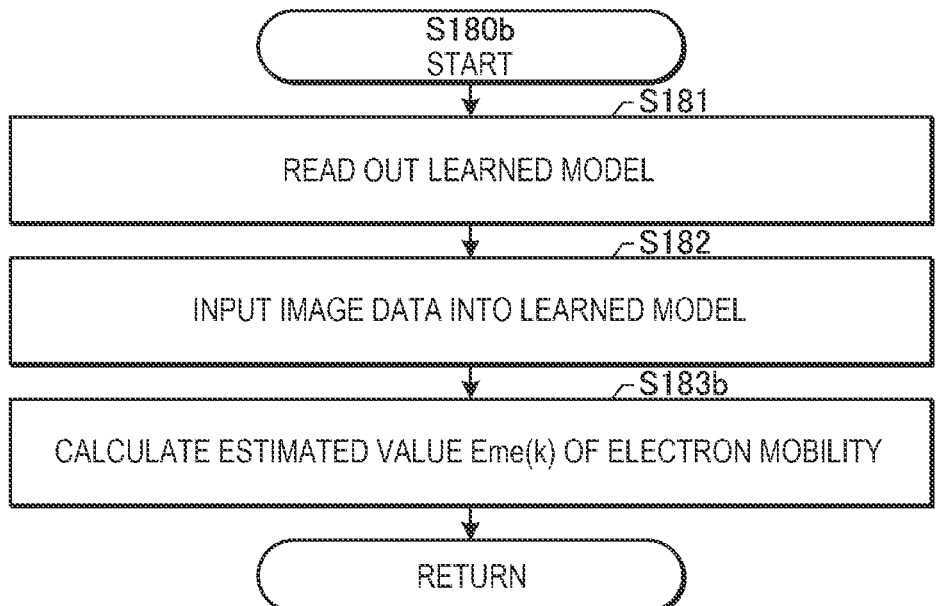

S180b
START

┌─ S181
READ OUT LEARNED MODEL

┌─ S182
INPUT IMAGE DATA INTO LEARNED MODEL

┌─ S183b
CALCULATE ESTIMATED VALUE Eme(k) OF ELECTRON MOBILITY

RETURN

FIG. 23

UPDATING RADIATION CONDITIONS

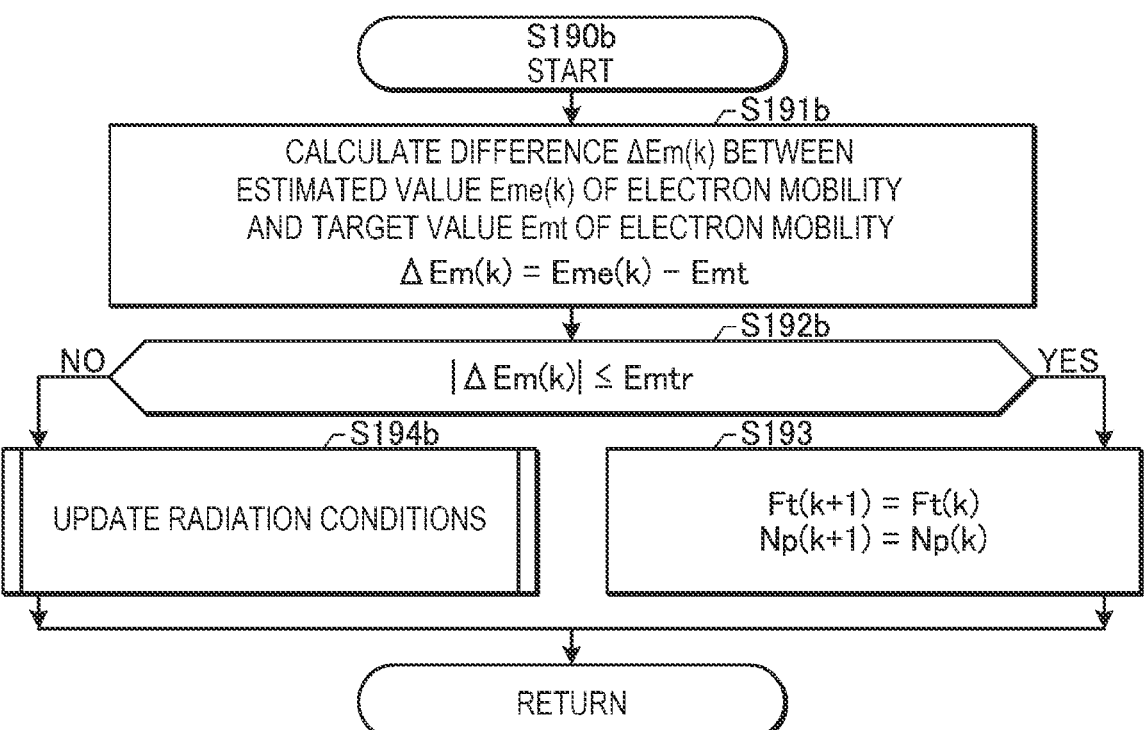

S190b
START

┌─ S191b
CALCULATE DIFFERENCE $\Delta Em(k)$ BETWEEN
ESTIMATED VALUE Eme(k) OF ELECTRON MOBILITY
AND TARGET VALUE Emt OF ELECTRON MOBILITY
$\Delta Em(k) = Eme(k) - Emt$ ┌─ S192b
NO    $|\Delta Em(k)| \leq Emtr$    YES ┌─ S194b
UPDATE RADIATION CONDITIONS ┌─ S193
$Ft(k+1) = Ft(k)$
$Np(k+1) = Np(k)$

RETURN

FIG. 24
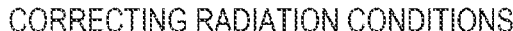
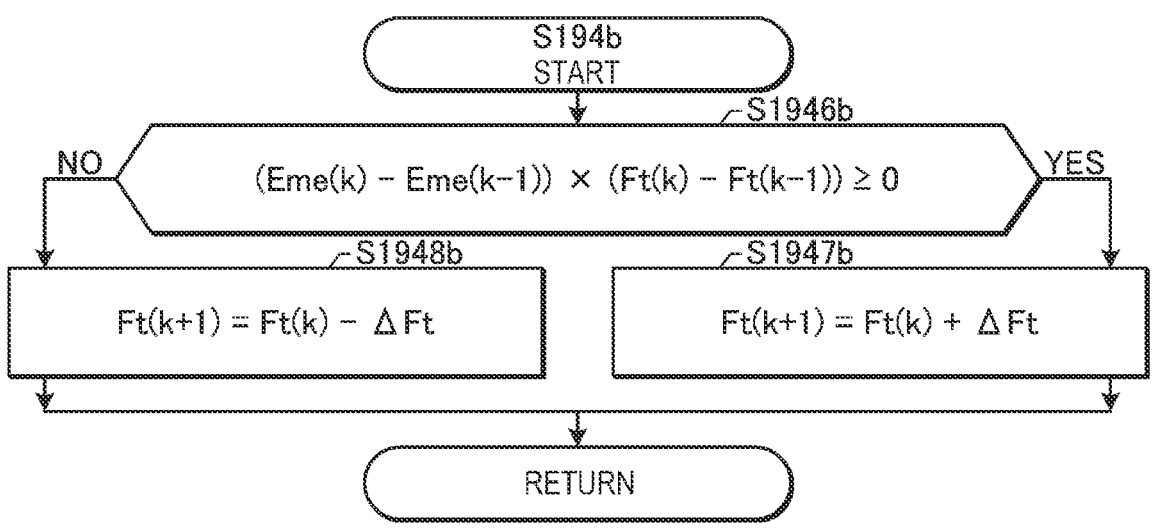
FIG. 25
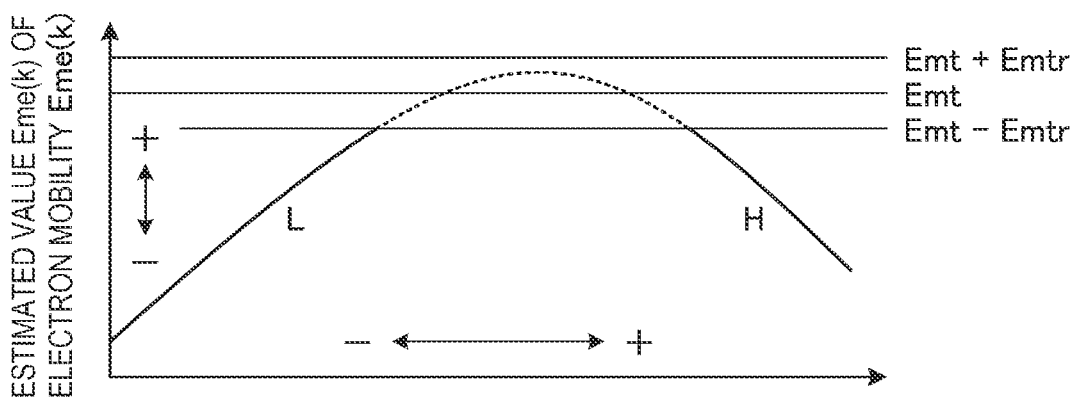
FIG. 26
| DIRECTION OF CHANGE IN TARGET FLUENCE VALUE Ft(k) | + | + | − | − |
|---|---|---|---|---|
| DIRECTION OF CHANGE IN ESTIMATED VALUE Eme(k) OF ELECTRON MOBILITY | + | − | + | − |
| (Eme(k) − Eme(k−1)) × (Ft(k) − Ft(k−1)) | + | − | − | + |
| CURRENT VALUE OF TARGET FLUENCE VALUE Ft(k) | L | H | H | L |
| DIRECTION IN WHICH TARGET FLUENCE VALUE Ft(k) IS CONTROLLED | + | − | − | + |

CORRECTING RADIATION CONDITIONS

FIG. 31

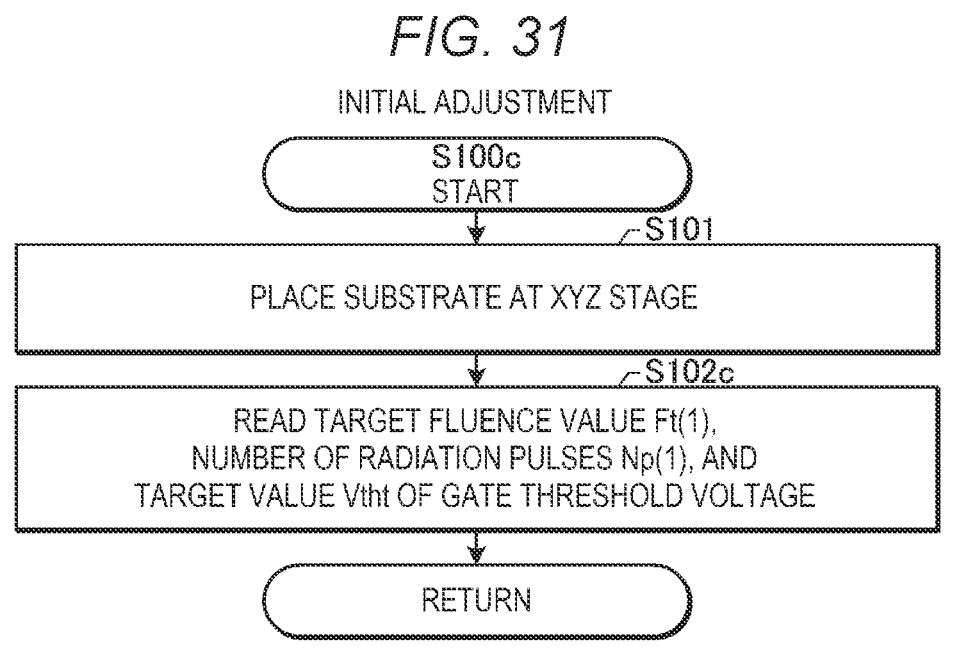

INITIAL ADJUSTMENT

S100c
START

S101

PLACE SUBSTRATE AT XYZ STAGE

S102c

READ TARGET FLUENCE VALUE Ft(1),
NUMBER OF RADIATION PULSES Np(1), AND
TARGET VALUE Vtht OF GATE THRESHOLD VOLTAGE

RETURN

FIG. 32

CALCULATING ESTIMATED VALUE Vthe(k) OF GATE THRESHOLD
VOLTAGE BY USING IMAGE DATA AND LEARNED MODEL

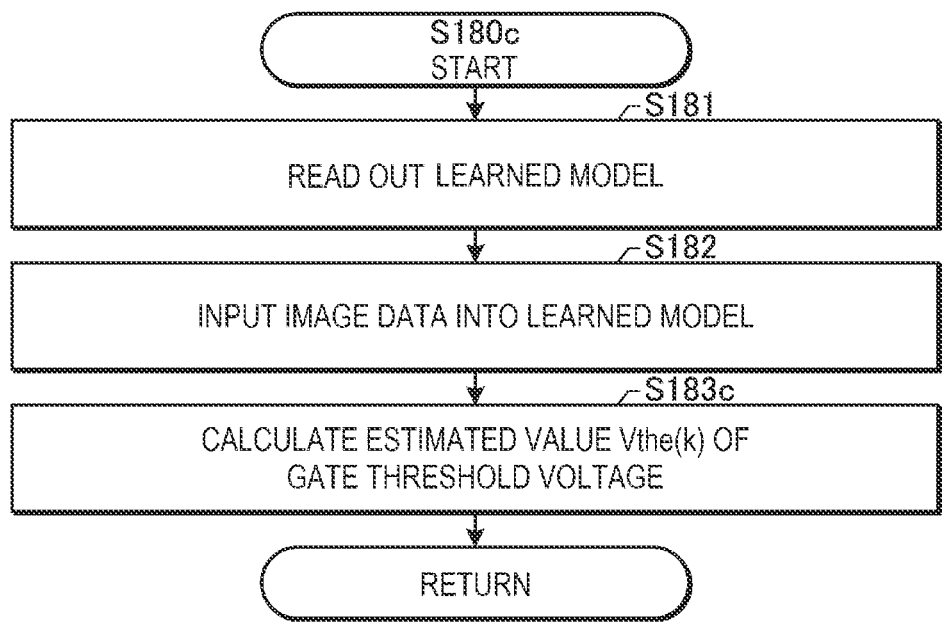

S180c
START

S181

READ OUT LEARNED MODEL

S182

INPUT IMAGE DATA INTO LEARNED MODEL

S183c

CALCULATE ESTIMATED VALUE Vthe(k) OF
GATE THRESHOLD VOLTAGE

RETURN

FIG. 33

UPDATING RADIATION CONDITIONS

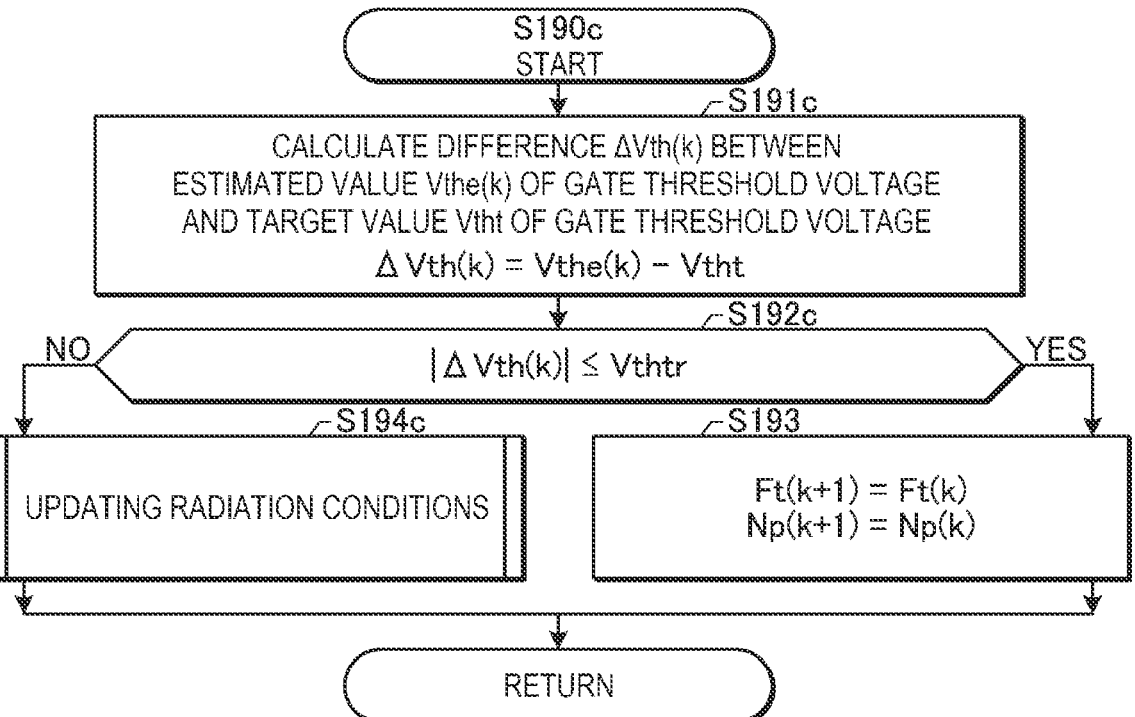

S190c
START

S191c

CALCULATE DIFFERENCE $\Delta$Vth(k) BETWEEN
ESTIMATED VALUE Vthe(k) OF GATE THRESHOLD VOLTAGE
AND TARGET VALUE Vtht OF GATE THRESHOLD VOLTAGE
$\Delta$ Vth(k) = Vthe(k) − Vtht S192c NO ◁ |$\Delta$ Vth(k)| ≤ Vthtr ▷ YES S194c

UPDATING RADIATION CONDITIONS

S193

Ft(k+1) = Ft(k)
Np(k+1) = Np(k)

RETURN

FIG. 34

CORRECTING RADIATION CONDITIONS

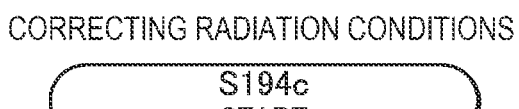

S194c
START

S1946c $(Vthe(k) - Vthe(k-1)) \times (Ft(k) - Ft(k-1)) \geq 0$

NO                                                                          YES

S1948c                                          S1947c $Ft(k+1) = Ft(k) + \Delta Ft$                    $Ft(k+1) = Ft(k) - \Delta Ft$

RETURN

FIG. 35

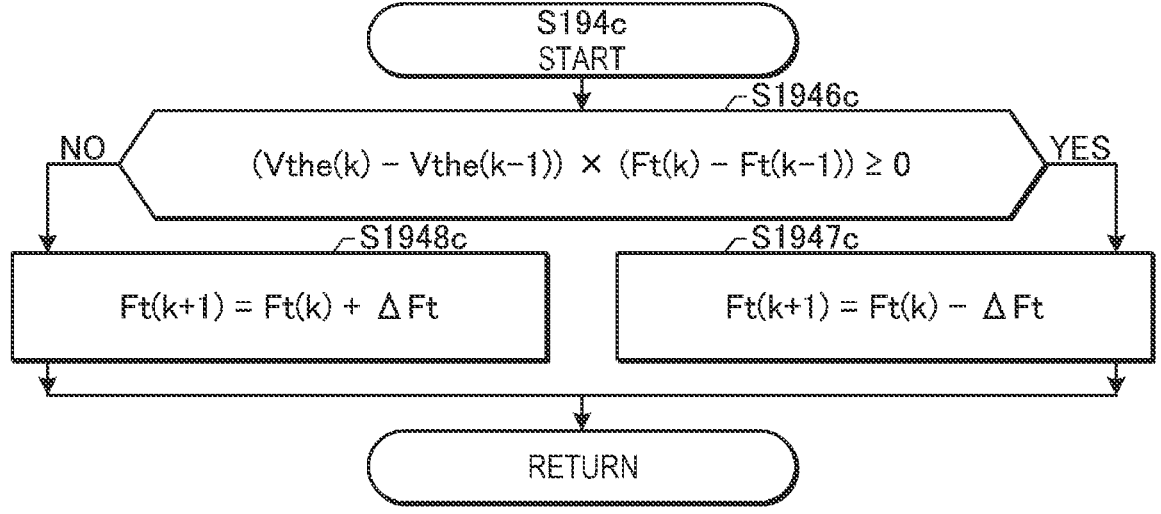

ESTIMATED VALUE Vthe(k) OF GATE THRESHOLD VOLTAGE

+

−

L                                    H

Vtht + Vthtr
Vtht
Vtht − Vthtr

−          +

TARGET FLUENCE VALUE Ft(k)

FIG. 36

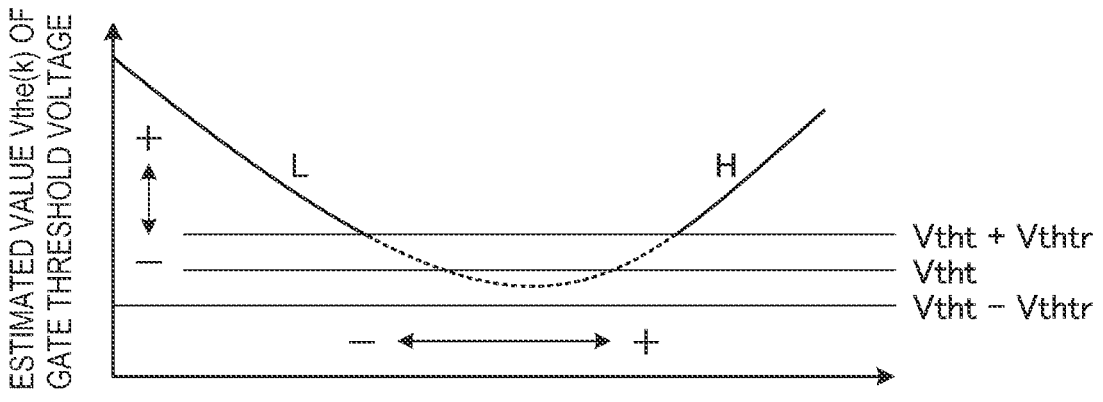

| DIRECTION OF CHANGE IN TARGET FLUENCE VALUE Ft(k) | + | + | − | − |
|---|---|---|---|---|
| DIRECTION OF CHANGE IN ESTIMATED VALUE Vthe(k) OF GATE THRESHOLD VOLTAGE | + | − | + | − |
| $(Vthe(k) - Vthe(k-1)) \times (Ft(k) - Ft(k-1))$ | + | − | − | + |
| CURRENT VALUE OF TARGET FLUENCE VALUE Ft(k) | H | L | L | H |
| DIRECTION IN WHICH TARGET FLUENCE VALUE Ft(k) IS CONTROLLED | − | + | + | − |

*FIG. 37*
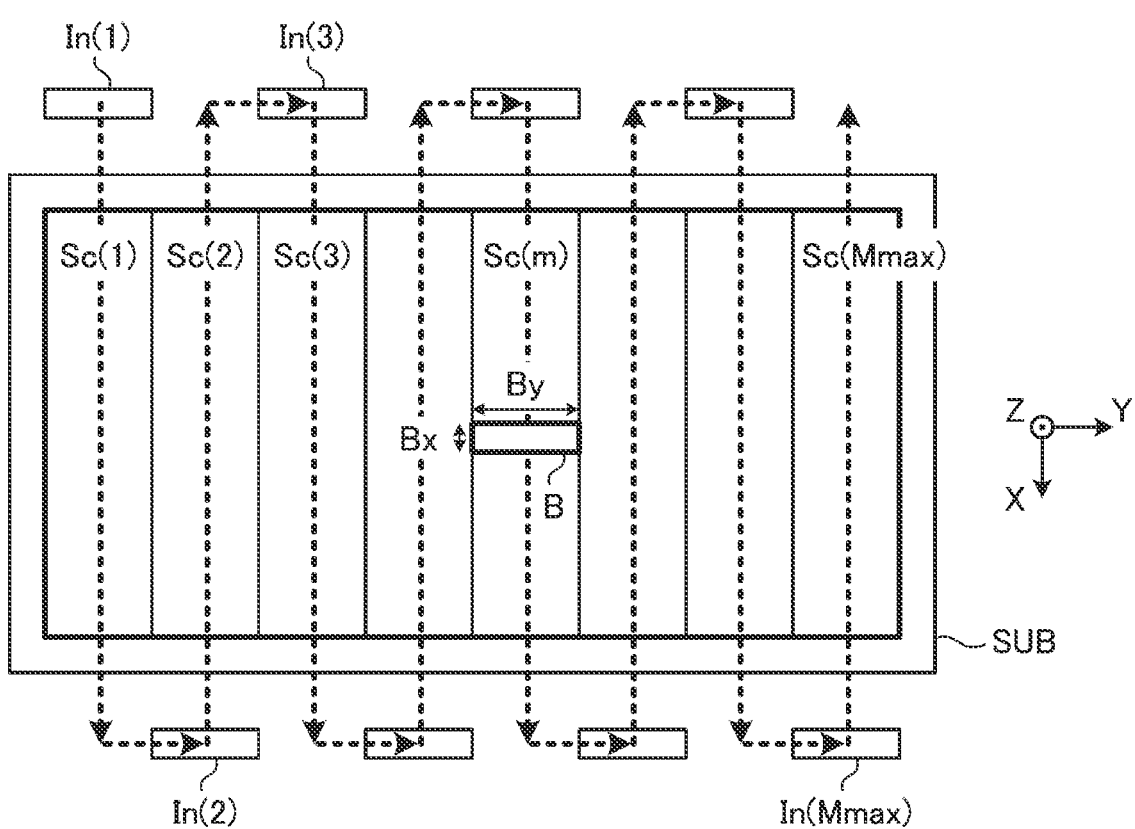
*FIG. 38*
*FIG. 39*
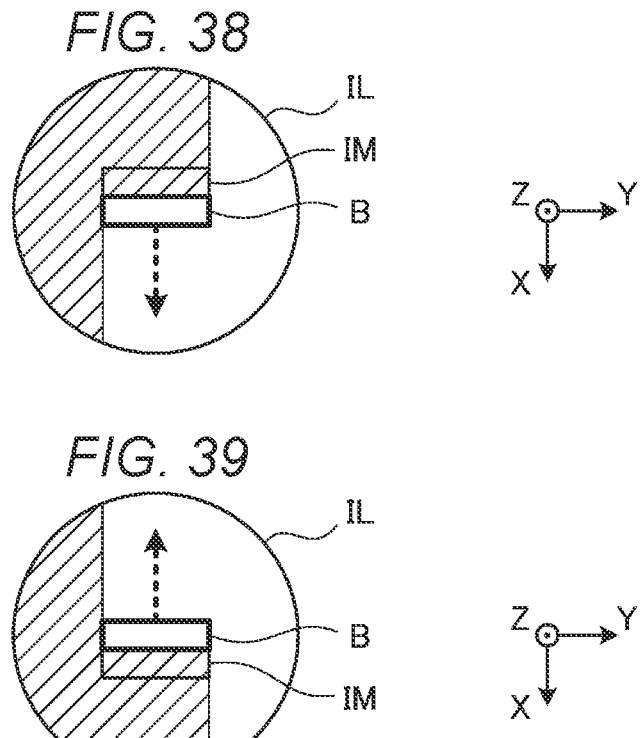

*FIG. 41*

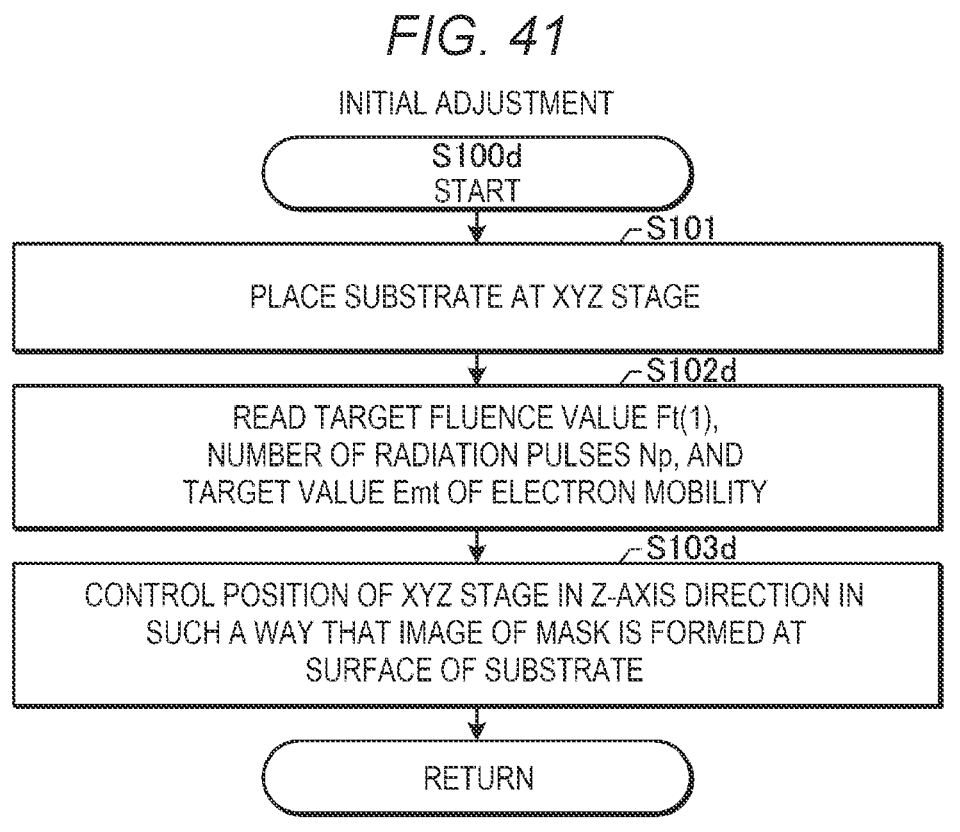

INITIAL ADJUSTMENT

S100d
START $\swarrow$ S101

PLACE SUBSTRATE AT XYZ STAGE $\swarrow$ S102d

READ TARGET FLUENCE VALUE Ft(1),
NUMBER OF RADIATION PULSES Np, AND
TARGET VALUE Emt OF ELECTRON MOBILITY $\swarrow$ S103d CONTROL POSITION OF XYZ STAGE IN Z-AXIS DIRECTION IN
SUCH A WAY THAT IMAGE OF MASK IS FORMED AT
SURFACE OF SUBSTRATE

RETURN

*FIG. 42*

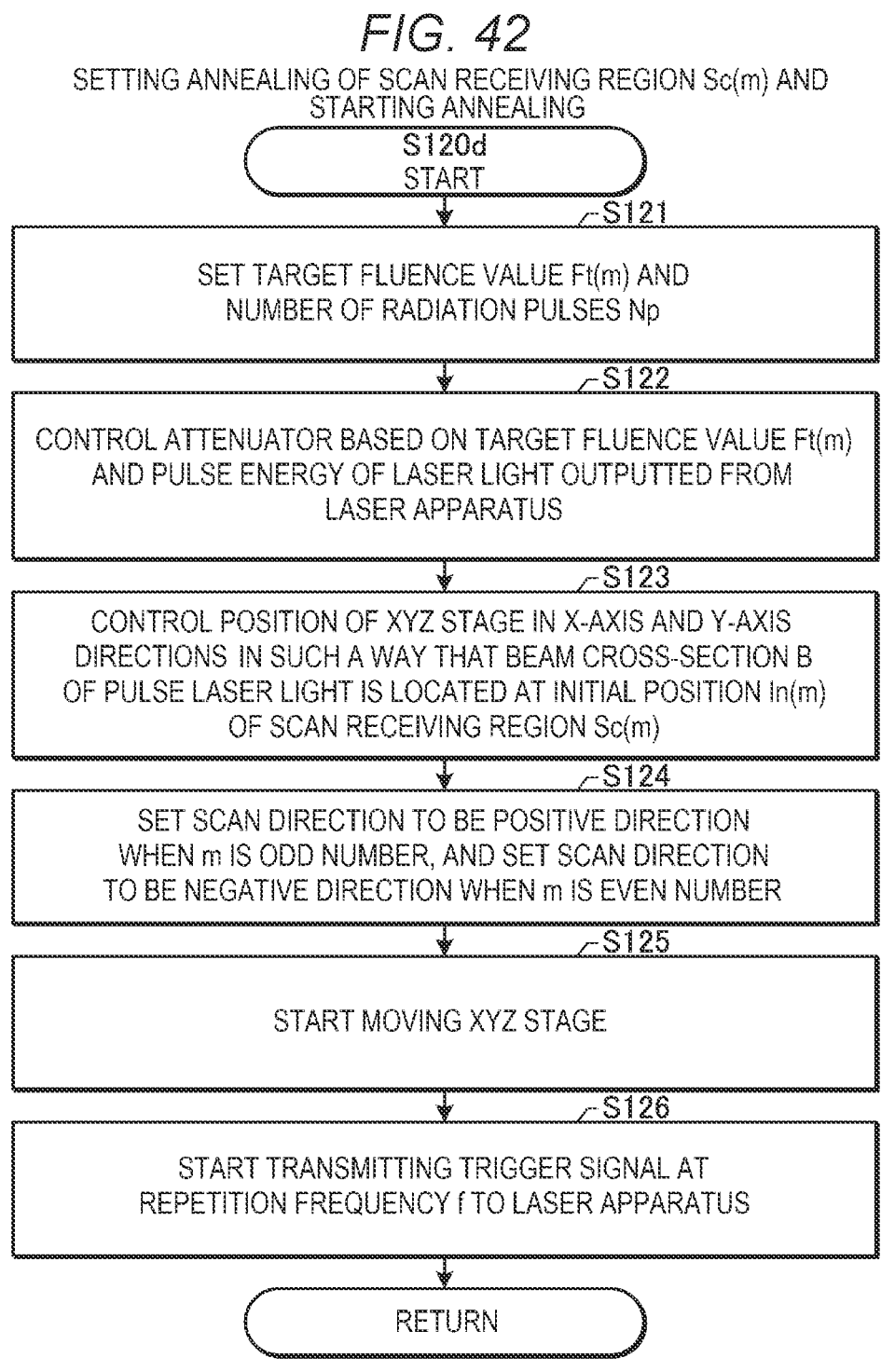

SETTING ANNEALING OF SCAN RECEIVING REGION Sc(m) AND
STARTING ANNEALING

S120d
START

S121

SET TARGET FLUENCE VALUE Ft(m) AND
NUMBER OF RADIATION PULSES Np

S122

CONTROL ATTENUATOR BASED ON TARGET FLUENCE VALUE Ft(m)
AND PULSE ENERGY OF LASER LIGHT OUTPUTTED FROM
LASER APPARATUS

S123

CONTROL POSITION OF XYZ STAGE IN X-AXIS AND Y-AXIS
DIRECTIONS IN SUCH A WAY THAT BEAM CROSS-SECTION B
OF PULSE LASER LIGHT IS LOCATED AT INITIAL POSITION In(m)
OF SCAN RECEIVING REGION Sc(m)

S124

SET SCAN DIRECTION TO BE POSITIVE DIRECTION
WHEN m IS ODD NUMBER, AND SET SCAN DIRECTION
TO BE NEGATIVE DIRECTION WHEN m IS EVEN NUMBER

S125

START MOVING XYZ STAGE

S126

START TRANSMITTING TRIGGER SIGNAL AT
REPETITION FREQUENCY f TO LASER APPARATUS

RETURN

FIG. 43

COUNTING Np+n PULSES

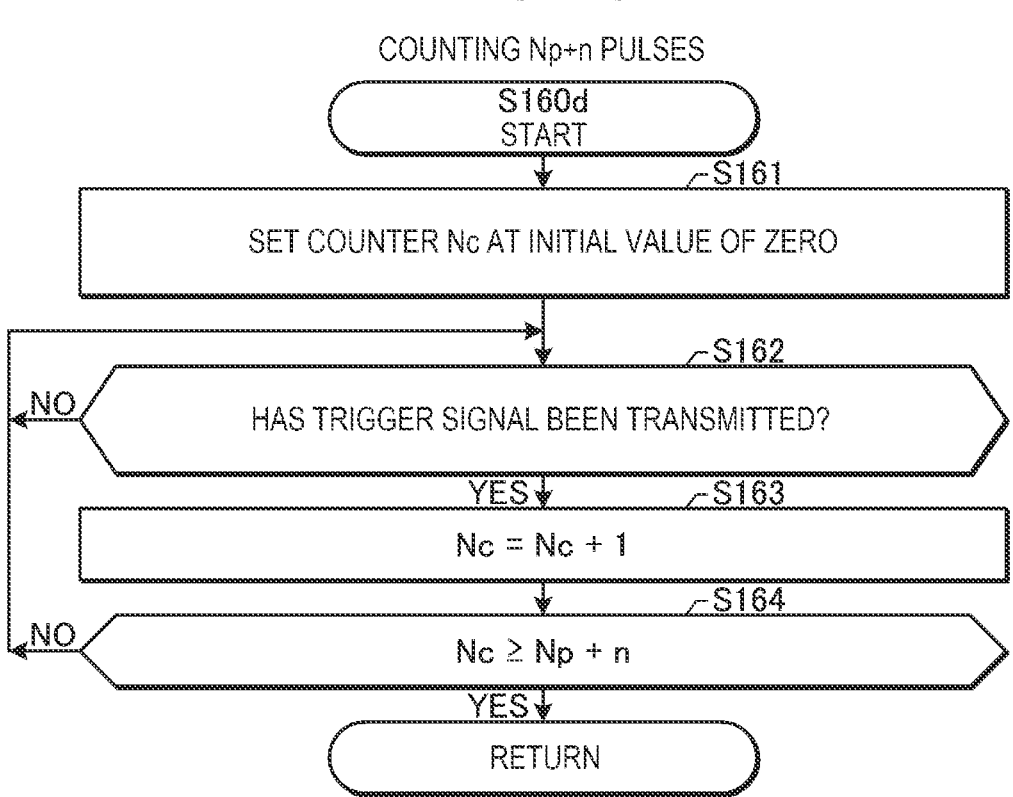

S160d
START

S161
SET COUNTER Nc AT INITIAL VALUE OF ZERO

S162
HAS TRIGGER SIGNAL BEEN TRANSMITTED?    NO

YES    S163
Nc = Nc + 1

S164
$Nc \geq Np + n$    NO

YES
RETURN

FIG. 44

ACQUIRING DATA ON IMAGE OF IMAGE ACQUISITION RANGE IM
HAVING UNDERGONE LASER ANNEALING

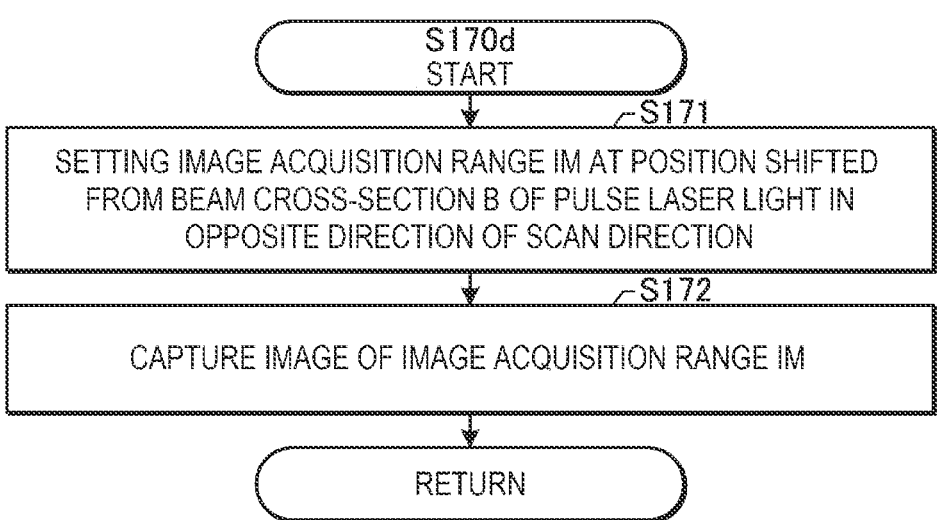

S170d
START

S171
SETTING IMAGE ACQUISITION RANGE IM AT POSITION SHIFTED
FROM BEAM CROSS-SECTION B OF PULSE LASER LIGHT IN
OPPOSITE DIRECTION OF SCAN DIRECTION

S172
CAPTURE IMAGE OF IMAGE ACQUISITION RANGE IM

RETURN

MACHINE LEARNING METHOD, LASER ANNEALING SYSTEM, AND LASER ANNEALING METHOD

CROSS-REFERENCE TO RELATED APPLICATIONS

The present application is a continuation application of International Application No. PCT/JP2021/003721, filed on Feb. 2, 2021, the entire contents of which are hereby incorporated by reference.

BACKGROUND

1. Technical Field

The present disclosure relates to a machine learning method, a laser annealing system, and a laser annealing method.

2. Related Art

Thin film transistors (TFTs) are used as drive elements of a flat panel display using a glass substrate. To achieve a high-definition display, it is necessary to produce a high driving power TFT. A semiconductor thin film that forms the channel of a TFT is made of polycrystalline silicon or indium gallium zinc oxide (IGZO). Polycrystalline silicon and IGZO have higher carrier mobility and more excellent transistor on/off characteristics than amorphous silicon.

Semiconductor thin films are also expected to be used in 3D ICs that achieve devices having more advanced functions. A 3D IC can be achieved by forming active elements, such as a sensor, an amplification circuit, and a CMOS circuit, in the top layer of an integrated circuit device. To this end, a technology for manufacturing higher quality semiconductor thin films is required.

Furthermore, diversification of information terminal instruments is creating a growing demand for flexible displays and computers that are compact and lightweight, consume less power, and can be freely folded. It is therefore required to establish a technology for forming a high-quality semiconductor thin film on a plastic substrate made, for example, of PET (polyethylene terephthalate).

To form a high-quality semiconductor thin film on a glass substrate, an integrated circuit, or a plastic substrate, it is necessary to crystallize the semiconductor thin film without thermal damage to the substrate. A process temperature of 400° C. is required for glass substrates used to form displays, 400° C. for integrated circuits, and 200° C. or lower for PET used to form plastic substrates.

Laser annealing is used as a technology for crystallizing a semiconductor thin film without thermal damage to the substrate under the semiconductor thin film. In the laser annealing, pulse ultraviolet laser light absorbed by an upper-layer semiconductor thin film is used to suppress damage to the substrate due to thermal diffusion.

When the semiconductor thin film is made of silicon, an XeF excimer laser, which emits light having a wavelength of 351 nm, an XeCl excimer laser, which emits light having a wavelength of 308 nm, a KrF excimer laser, which emits light having a wavelength of 248 nm, or any other suitable laser is used. The ultraviolet gas lasers described above are characterized in that they emit laser light having lower laser light interference, provide excellent energy uniformity at the laser light irradiated surface, and allow uniform annealing of a wide region with high pulse energy, as compared with solid-state lasers.

CITATION LIST

Patent Literature

[PTL 1] WO2006/055003
[PTL 2] U.S. Patent application Publication No. 2017/345140

Non-Patent Literature

[NPTL1] Paul C. van der Wilt, "Excimer-Laser Annealing: Microstructure Evolution and a Novel Characterization Technique", SID 2014 DIGEST, 149-152(2014)

SUMMARY

A machine learning method according to an aspect of the present disclosure includes acquiring image data generated from reflected light of illumination light radiated to a first region of a semiconductor film on a substrate, the first region annealed by pulse laser light, acquiring data on a measured semiconductor property of the first region, generating training data including the image data as input and the measured data as output associated with each other, and performing machine learning using a neural network based on the training data to generate a learned model.

A laser annealing system according to another aspect of the present disclosure includes a laser apparatus configured to output pulse laser light for performing laser annealing of a first region of a semiconductor film on a substrate, an illumination light source configured to irradiate the first region with illumination light, an imaging section configured to generate image data from reflected light of the illumination light, and a processor, and the processor is configured to have access to a learned model that accepts the image data as input and provides an estimated value of a semiconductor property as output, calculate the estimated value by using the image data and the learned model, and correct, based on the estimated value, a radiation condition under which the pulse laser light is radiated.

A laser annealing method according to another aspect of the present disclosure includes annealing a first region of a semiconductor film on a substrate with pulse laser light, irradiating the first region with illumination light to generate image data from reflected light of the illumination light, calculating an estimated value of a semiconductor property by using a learned model that accepts the image data as input and provides the estimated value as output, and correcting, based on the estimated value, a radiation condition under which the pulse laser light is radiated.

BRIEF DESCRIPTION OF THE DRAWINGS

Embodiments of the present disclosure will be described below only by way of example with reference to the accompanying drawings.

FIG. 5 is a flowchart showing the operation of a laser annealing processor in Comparative Example.

FIG. 6 is a flowchart showing the details of an initial adjustment process shown in FIG. 5.

FIG. 7 is a flowchart showing the details of the processes of controlling a laser annealing apparatus and a laser apparatus shown in FIG. 5.

FIG. 10 is a flowchart showing the details of the process of causing the laser annealing system to produce an annealed sample.

FIG. 11 is a flowchart showing the details of the process of acquiring image data by using an image data generation section.

FIG. 12 is a flowchart showing the details of the process of acquiring data on measured semiconductor properties by using a semiconductor property measurement section.

FIG. 13 is a flowchart showing the details of the process of generating training data.

FIG. 14 shows an example of the training data generated by the processes in FIG. 13.

FIG. 15 is a flowchart showing the details of the process of generating a learned model by performing machine learning.

FIG. 21 is a flowchart showing the details of an initial adjustment process shown in FIG. 20.

FIG. 22 is a flowchart showing the details of the process of calculating an estimated value Eme(k) of electron mobility shown in FIG. 20.

FIG. 23 is a flowchart showing the details of the process of updating the radiation conditions shown in FIG. 20.

FIG. 24 is a flowchart showing a first example of the process of correcting the radiation conditions shown in FIG. 23.

FIG. 25 is a graph showing a typical relationship between a target fluence value Ft(k) and the estimated value Eme(k) of the electron mobility.

FIG. 26 is a table showing a criterion for determination of the direction in which the target fluence value Ft(k) is controlled in the second embodiment.

FIG. 31 is a flowchart showing the details of an initial adjustment process shown in FIG. 30.

FIG. 32 is a flowchart showing the details of the process of calculating an estimated value Vthe(k) of a gate threshold voltage shown in FIG. 30.

FIG. 33 is a flowchart showing the details of the process of updating the radiation conditions shown in FIG. 30.

FIG. 34 is a flowchart showing a first example of the process of correcting the radiation conditions shown in FIG. 33.

FIG. 35 is a graph showing a typical relationship between the target fluence value Ft(k) and the estimated value Vthe(k) of the gate threshold voltage.

FIG. 36 is a table showing the criterion for determination of the direction in which the target fluence value Ft(k) is controlled in the third embodiment.

FIG. 37 is a plan view showing an example of the method for performing laser annealing of the substrate based on a step-and-scan scheme.

FIG. 38 is a plan view showing an illumination range of the substrate that is illuminated with illumination light from an illumination light source.

FIG. 39 is a plan view showing an illumination range of the substrate that is illuminated with the illumination light from the illumination light source.

FIG. 41 is a flowchart showing the details of an initial adjustment process shown in FIG. 40.

FIG. 42 is a flowchart showing the details of the process of setting the annealing of a scan receiving region Sc(m) and starting the annealing shown in FIG. 40.

FIG. 43 is a flowchart showing the details of the process of counting Np+n pulses shown in FIG. 40.

FIG. 44 is a flowchart showing the details of the process of acquiring the image data shown in FIG. 40.

DETAILED DESCRIPTION

Contents

Figures 1, 2:
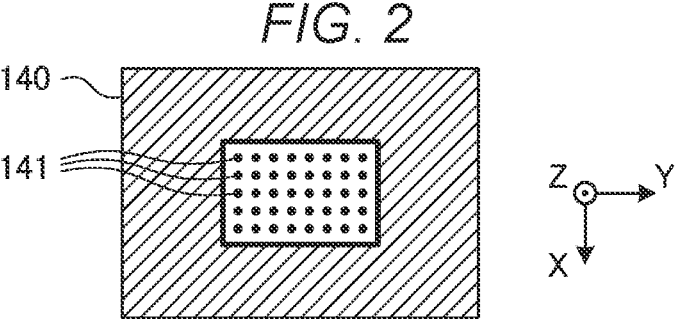
FIG. 1 schematically shows the configuration of a laser annealing system according to Comparative Example.
FIG. 2 is a plan view showing an example of a mask.

1. Comparative Example
1.1 Configuration of laser annealing system 10
1.1.1 Laser apparatus 12
1.1.2 Laser annealing apparatus 14
1.2 Operation
1.2.1 Laser apparatus 12
1.2.2 Laser annealing apparatus 14
1.2.3 Pulse laser light radiation sequence
1.2.4 Radiation conditions
1.2.5 Operation of laser annealing processor 100
1.2.5.1 Main procedure
1.2.5.2 Initial adjustment
1.2.5.3 Controlling laser annealing apparatus 14 and laser apparatus 12
1.3 Problems with Comparative Example
2. Machine learning system
2.1 Configuration
2.1.1 Laser annealing system 10
2.1.2 Image data generation section 20
2.1.3 Semiconductor property measurement section 40
2.1.4 Machine learning processor 500
2.2 Operation of machine learning
2.2.1 Main procedure
2.2.2 Producing annealed sample 2.2.3 Acquiring Image Data
2.2.4 Acquiring data on measured semiconductor properties
2.2.5 Generating training data
2.2.6 Machine learning
2.3 Effects
3. Laser annealing system 10b that corrects radiation conditions by estimating electron mobility
3.1 Configuration
3.2 Operation
3.2.1 Main procedure
3.2.2 Initial adjustment
3.2.3 Calculating estimated value Eme(k) of electron mobility
3.2.4 Updating radiation conditions
3.2.4.1 First example of process of correcting radiation conditions
3.2.4.2 Second example of process of correcting radiation conditions
3.2.4.3 Third example of process of correcting radiation conditions
3.3 Effects
3.4 Other configuration examples
4. Laser annealing system 10b that corrects radiation conditions by estimating gate threshold voltage
4.1 Configuration
4.2 Operation
4.3 Effects
5. Laser annealing system 10b based on step-and-scan scheme
5.1 Configuration
5.2 Operation
5.3 Operation of laser annealing processor 100
5.3.1 Main procedure
5.3.2 Initial adjustment
5.3.3 Setting annealing of scan receiving region Sc(m) and starting annealing
5.3.4 Counting Np+n pulses
5.3.5 Acquiring image data
5.4 Effects
5.5 Other configuration examples
6. Others Embodiments of the present disclosure will be described below in detail with reference to the drawings. The embodiments described below show some examples of the present disclosure and are not intended to limit the contents of the present disclosure. Furthermore, all configurations and operations described in the embodiments are not necessarily essential as configurations and operations in the present disclosure. The same component has the same reference character, and no redundant description of the same component will be made.

1. Comparative Example

1.1 Configuration of Laser Annealing System 10

FIG. 1 schematically shows the configuration of a laser annealing system 10 according to Comparative Example. Comparative Example in the present disclosure is an aspect that the applicant is aware of as known only by the applicant, and is not a publicly known example that the applicant is self-aware of. The laser annealing system 10 includes a laser apparatus 12, an optical path tube 13, and a laser annealing apparatus 14.

1.1.1 Laser Apparatus 12

The laser apparatus 12 is a discharge-excitation-type laser apparatus that outputs ultraviolet pulse laser light. The laser apparatus 12 is an excimer laser apparatus using a laser gas containing, for example, an argon or krypton gas as a rare gas, a fluorine gas as a halogen gas, and a neon gas as a buffer gas. The pulse laser light has a pulse period width, for example, longer than or equal to 10 ns but shorter than or equal to 100 ns.

1.1.2 Laser Annealing Apparatus 14

The laser annealing apparatus 14 includes a radiation optical system 170, a frame 172, an XYZ stage 174, and a laser annealing processor 100.

The radiation optical system 170 and the XYZ stage 174 are fixed to the frame 172. A substrate SUB is supported by a table 176 of the XYZ stage 174. The XYZ stage 174 is configured to move the substrate SUB in directions that intersect with the direction in which the pulse laser light is incident on the substrate SUB, for example, in X-axis and Y-axis directions, and in a direction having the same directional component as the light incident direction, for example, in a Z-axis direction. The XYZ stage 174 corresponds to the stage in the present disclosure.

The substrate SUB is, for example, a glass substrate, an integrated circuit, or a plastic substrate on which an amorphous silicon, IGZO, or indium zinc oxide (IZO) film is deposited.

The radiation optical system 170 includes highly reflective mirrors 111, 112, 113, 114, and 115, an attenuator 120, a shaping optical system 130, a mask 140, a projection optical system 145, a window 146, and an enclosure 150. The highly reflective mirrors 111, 112, 113, 114, and 115 are disposed in this order in the optical path of the pulse laser light having passed through the optical path tube 13.

The attenuator 120 is disposed in the optical path between the highly reflective mirror 111 and the highly reflective mirror 112. The attenuator 120 includes two partial reflection mirrors 121 and 122 and rotary stages 123 and 124. The rotary stages 123 and 124 are capable of changing the angles of incidence of the pulse laser light incident on the partial reflection mirrors 121 and 122, respectively. The transmittance of the attenuator 120 is adjusted in accordance with the angle of incidence of the pulse laser light incident on the partial reflection mirrors 121 and 122.

The shaping optical system 130 and the mask 140 are disposed in the optical path between the highly reflective mirror 113 and the highly reflective mirror 114. The shaping optical system 130 includes a fly-eye lens 134 and a condenser lens 136. The fly-eye lens 134 is so disposed that the focal plane of the fly-eye lens 134 coincides with the front focal plane of the condenser lens 136. The condenser lens 136 is so disposed that the rear focal plane of the condenser lens 136 coincides with the position of the mask 140. The mask 140 is illuminated from the shaping optical system 130 in the form of Köhler illumination.

FIG. 2 is a plan view showing an example of the mask 140. The mask 140 is, for example, a dot mask including a synthetic quartz substrate on which a large number of dot-shaped thin metal film pieces 141 are arranged in a grid pattern. The term "arranged in a grid pattern" refers to a state in which the dot-shaped thin metal film pieces 141 are disposed at the intersections of a plurality of imaginary vertical lines and a plurality of imaginary horizontal lines. The pulse laser light is blocked at the thin metal film pieces 141 and a peripheral hatched portion of the mask 140.

Referring again to FIG. 1, the projection optical system 145 is disposed in the optical path between the highly reflective mirror 115 and the substrate SUB. The projection optical system 145 may be a reduction projection optical system including a combination lens having a plurality of lenses 143 and 144.

The window 146 is disposed in the optical path between the projection optical system 145 and the substrate SUB.

The enclosure 150 may be so sealed, for example, with O rings that outside air does not enter the enclosure 150 and purged with an $N_2$ gas.

The laser annealing processor 100 is a processing apparatus including a memory 101, which stores a control program, and a CPU (central processing unit) 102, which executes the control program. The laser annealing processor 100 is particularly configured or programmed to carry out a variety of processes contained in the present disclosure.

The laser annealing processor 100 outputs data on target pulse energy Et and a trigger signal to the laser apparatus 12. The laser annealing processor 100 controls the operation of the attenuator 120 and the XYZ stage 174. The laser annealing processor 100 controls a workpiece transportation robot that is not shown but places the substrate SUB at the table 176 of the XYZ stage 174.

1.2 Operation

1.2.1 Laser Apparatus 12

The laser apparatus 12 outputs the pulse laser light that performs laser annealing on the amorphous semiconductor film on the substrate SUB. The laser apparatus 12 outputs the pulse laser light based on the data on the target pulse energy Et and the trigger signal received from the laser annealing processor 100. The laser apparatus 12 may include an energy monitor that is not shown, and perform feedback control on the pulse energy based on the result of the output from the energy monitor.

1.2.2 Laser Annealing Apparatus 14

In the laser annealing apparatus 14, the XYZ stage 174 positions the table 176 in such a way that an inverted image of the mask 140 is formed by the projection optical system 145 in a radiation receiving region Sr(k) of the substrate SUB.

The pulse laser light outputted from the laser apparatus 12 enters the laser annealing apparatus 14 through the optical path tube 13.

The pulse laser light having entered the laser annealing apparatus 14 passes through the attenuator 120 at a set transmittance.

The pulse laser light having passed through the attenuator 120 is spatially homogenized by the shaping optical system 130 in terms of light intensity distribution and incident on the mask 140.

Part of the pulse laser light is blocked in accordance with the pattern formed on the mask 140, and the other part of the pulse laser light passes through the mask 140. The pulse laser light having passed through the mask 140 enters the projection optical system 145, which projects the pulse laser light with the size thereof reduced on the surface of the substrate SUB. When the amorphous silicon film at the surface of the substrate SUB is irradiated with the laser light, the amorphous silicon film is heated and melts, then crystallizes.

When the image of the mask 140 shown in FIG. 2 is formed at the surface of the substrate SUB, an increase in temperature is suppressed in the light blocked portions blocked by the thin metal film pieces 141, so that crystallization starts earlier than in the other portion after the surface melts due to the energy of the pulse laser light. Crystal growth proceeds from each of the light blocked portions in every direction and stops when the outer edge of the crystal growth reaches the outer edge of each adjacent crystal. The crystal growth described above allows formation of a polycrystalline silicon film with small variations in crystal size and crystalline properties.

1.2.3 Pulse Laser Light Radiation Sequence

Figures 3, 4:
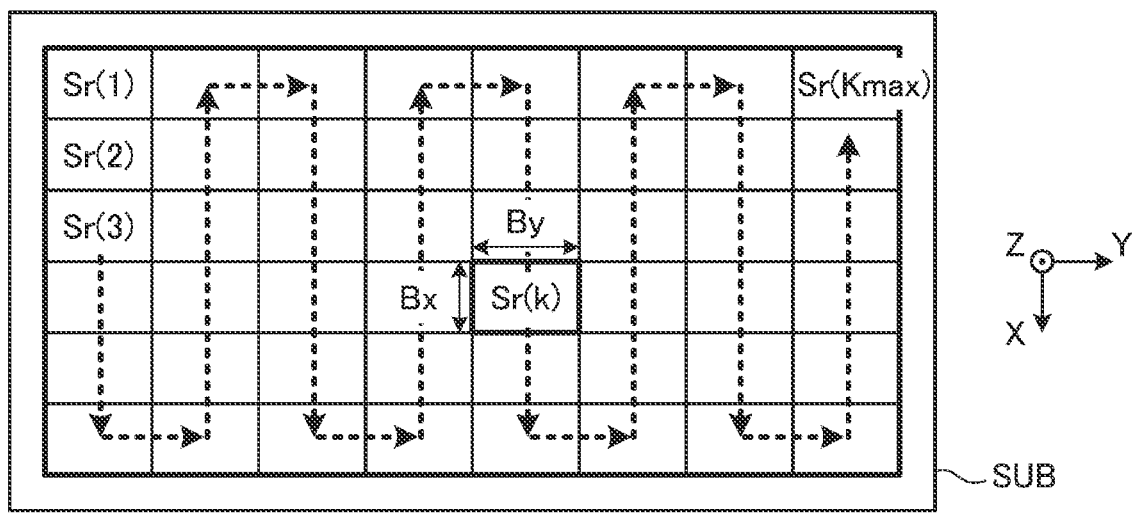
FIG. 3 is a plan view showing an example of a method for performing laser annealing of a substrate based on a step-and-repeat scheme.
FIG. 4 shows an example of data used to set radiation conditions for radiation receiving regions Sr(1) to Sr(K-max).

FIG. 3 is a plan view showing an example of a method for performing the laser annealing of the substrate SUB based on a step-and-repeat scheme. In FIG. 3, the surface of the substrate SUB has Kmax radiation receiving regions Sr(1) to Sr(Kmax). Let Sr(k) be one of the radiation receiving regions Sr(1) to Sr(Kmax). The variable k can be an integer ranging from 1 to Kmax. The shape of each of the radiation receiving regions Sr(k) corresponds to the shape of the beam cross-section of the pulse laser light at the substrate SUB. The radiation receiving region Sr(k) is an example of the first region in the present disclosure.

The broken arrows in FIG. 3 indicate the sequence of the laser annealing. For example, when the substrate SUB is moved by the XYZ stage 174 in a −X direction, the position of the beam cross-section of the pulse laser light relative to the substrate SUB moves in an X direction. The position of the XYZ stage 174 in the X-axis and Y-axis directions is controlled, so that the laser annealing of the radiation receiving regions Sr(1) to Sr(Kmax) is performed in this order.

The procedure of the laser annealing based on the step-and-repeat scheme is as follows:

The XYZ stage 174 is first operated to move the substrate SUB in such a way that the region where the inverted image of the mask 140 is formed coincides with the first radiation receiving region Sr(1), and the XYZ stage 174 is then paused. The attenuator 120 is then so controlled that the fluence of the pulse laser light at the substrate SUB becomes a target value Ft(1). The radiation receiving region Sr(1) is then irradiated via the mask 140 with the pulse laser light having the set number of radiation pulses Np(1). The emission of the pulse laser light is then paused.

The XYZ stage 174 is then operated to move the substrate SUB in such a way that the region where the inverted image of the mask 140 is formed coincides with the second radiation receiving region Sr(2), and the XYZ stage 174 is then paused. The attenuator 120 is then so controlled that the fluence of the pulse laser light becomes a target value Ft(2), and the radiation receiving region Sr(2) is irradiated via the mask 140 with the pulse laser light having the set number of radiation pulses Np(2). The emission of the pulse laser light is then paused.

The laser annealing of the radiation receiving regions Sr(3) to Sr(Kmax) is then similarly performed.

The radiation receiving regions Sr(1) to Sr(Kmax) each have a rectangular shape, and let Bx and By be the lengths of the long and short edges of the rectangular shape, respectively. Bx and By are the beam widths of the pulse laser light at the surface of the substrate SUB, and correspond to the beam widths in the X-axis and Y-axis directions, respectively. Let Ta be the transmittance of the attenuator 120, and Tt be the total transmittance of the optical system from the position where the laser apparatus 12 outputs the pulse laser light to the substrate SUB with the transmittance Ta of the attenuator 120 maximized. The fluence in each of the radiation receiving regions Sr(1) to Sr(Kmax) is determined by $Tt \cdot Ta \cdot Et/(Bx \cdot By)$. Therefore, to set the fluence in the radiation receiving region Sr(k) at a value close to the target value Ft(k), the transmittance Ta of the attenuator 120 is controlled to the value determined by the expression below.

$$Ta = Ft(k) \cdot (Bx \cdot By)/(Tt \cdot Et)$$

The method for controlling the transmittance Ta of the attenuator 120 is not limited to the method described above. An energy monitor that is not shown may be disposed in the optical path of the pulse laser light having passed through the attenuator 120, and the transmittance Ta may undergo feedback control based on the result of the output from the energy monitor.

1.2.4 Radiation Conditions

FIG. 4 shows an example of data used to set radiation conditions for the radiation receiving regions Sr(1) to Sr(Kmax). The data used to set the radiation conditions include target fluence values Ft(1) to Ft(Kmax) and the numbers of radiation pulses Np(1) to Np(Kmax). The numbers of radiation pulses Np(1) to Np(Kmax) each refer to the number of pulses that form the pulse laser light radiated to one location on the substrate SUB. The data used to set the radiation conditions are stored, for example, in the memory 101 (see FIG. 1).

To anneal different radiation receiving regions Sr(1) to Sr(Kmax), different target fluence values Ft(1) to Ft(Kmax) may be set, and different numbers of radiation pulses Np(1) to Np(Kmax) may be set. Instead, the target fluence values Ft(1) to Ft(Kmax) may be a value common to the radiation receiving regions, and the numbers of radiation pulses Np(1) to Np(Kmax) may be a value common to the radiation receiving regions.

1.2.5 Operation of Laser Annealing Processor 100

1.2.5.1 Main Procedure

FIG. 5 is a flowchart showing the operation of the laser annealing processor 100 in Comparative Example. In Comparative Example, the laser annealing based on the step-and-repeat scheme is performed in accordance with the method below.

In S100, the laser annealing processor 100 performs initial adjustment. S100 will be described later in detail with reference to FIG. 6.

In S130, the laser annealing processor 100 sets the value of k at an initial value of one. The values of k correspond to those described with reference to FIGS. 3 and 4.

In S140, the laser annealing processor 100 sets the radiation conditions for the radiation receiving region Sr(k). The radiation conditions include the target fluence value Ft(k) and the number of radiation pulses Np(k).

In S150, the laser annealing processor 100 controls the laser annealing apparatus 14 and the laser apparatus 12 in such a way that the laser annealing of the radiation receiving region Sr(k) is performed. S150 will be described later in detail with reference to FIG. 7.

In S200, the laser annealing processor 100 evaluates whether the value of k has reached Kmax.

When the value of k has not reached Kmax (NO in S200), the laser annealing processor 100 proceeds to the process in S210. In S210, the laser annealing processor 100 adds one to the value of k to update the value of k. The laser annealing processor 100 then returns to the process in S140.

When the value of k reaches Kmax (YES in S200), the laser annealing processor 100 terminates the processes in the present flowchart.

The laser annealing of the radiation receiving regions Sr(1) to Sr(Kmax) is thus performed.

1.2.5.2 Initial Adjustment

FIG. 6 is a flowchart showing the details of an initial adjustment process shown in FIG. 5. The flowchart shown in FIG. 6 corresponds to the subroutine of S100 in FIG. 5.

In S101, the laser annealing processor 100 controls the workpiece transportation robot, which is not shown, in such a way that the substrate SUB is placed at the table 176 of the XYZ stage 174.

In S102, the laser annealing processor 100 reads the data used to set the radiation conditions for the radiation receiving regions Sr(1) to Sr(Kmax). The radiation conditions have been described, for example, with reference to FIG. 4. The radiation conditions set in S140 described above are the radiation conditions corresponding to the radiation receiving region Sr(k) out of the radiation conditions read in S102.

After S102, the laser annealing processor 100 terminates the processes in the present flowchart and returns to the processes shown in FIG. 5.

1.2.5.3 Controlling Laser Annealing Apparatus 14 and Laser Apparatus 12

FIG. 7 is a flowchart showing the details of the processes of controlling the laser annealing apparatus 14 and the laser apparatus 12 shown in FIG. 5. The flowchart shown in FIG. 7 corresponds to the subroutine of S150 in FIG. 5.

In S151, the laser annealing processor 100 controls the attenuator 120 based on the target fluence value Ft(k) and the pulse energy of the pulse laser light outputted from the laser apparatus 12. The target pulse energy Et having been set in the laser apparatus 12 is used as the pulse energy of the pulse laser light. The laser annealing processor 100 controls the attenuator 120 in such a way that the transmittance Ta of the attenuator 120 is the value calculated as described above.

In S152, the laser annealing processor 100 controls the position of the XYZ stage 174 in the X-axis and Y-axis directions in such a way that the radiation receiving region Sr(k) is irradiated with the pulse laser light, and pauses the XYZ stage 174 at that position.

In S153, the laser annealing processor 100 controls the position of the XYZ stage 174 in the Z-axis direction in such a way that the image of the mask 140 is formed at the surface of the substrate SUB, and pauses the XYZ stage 174 at that position.

In S154, the laser annealing processor 100 transmits the trigger signal that triggers Np(k) pulses at a repetition frequency f to the laser apparatus 12. As a result, with the XYZ stage 174 paused, the pulse laser light having the Np(k) pulses is outputted from the laser apparatus 12 and radiated to the radiation receiving region Sr(k) to perform the laser annealing.

After S154, the laser annealing processor 100 terminates the processes in the present flowchart and returns to the processes shown in FIG. 5.

1.3 Problems with Comparative Example

In Comparative Example, the laser annealing is performed by radiating the pulse laser light to the amorphous silicon film to convert it into a polycrystalline silicon film having improved semiconductor properties. However, the semiconductor properties depend on a variety of factors, such as the thickness of the polycrystalline silicon film and the crystal grain size, and the pulse laser light radiation conditions required to provide target semiconductor properties may vary from case to case. To measure the semiconductor properties, the substrate SUB needs to be moved to a measurement instrument such as a device analyzer. Furthermore, the semiconductor properties cannot be measured in some cases until the polycrystalline silicon film is processed to produce a semiconductor device. Therefore, it is difficult to measure the semiconductor properties during the laser annealing, and it is difficult to adjust the pulse laser light radiation conditions.

Laser annealing of IGZO and IZO differs from the laser annealing of amorphous silicon in that IGZO and IZO are not crystallized. However, the laser annealing of IGZO and IZO has the same problems as those with the laser annealing of amorphous silicon.

In some embodiments described below, machine learning is performed to generate a learned model, using training data which includes image data of the radiation receiving region Sr(k) having undergone the laser annealing as inputs and measurement data of semiconductor properties as outputs with the image data and the measured data associated with each other. The learned model is used to calculate an output based on new image data to calculate estimated values of semiconductor properties.

2. Machine Learning System

2.1 Configuration

Figure 8:
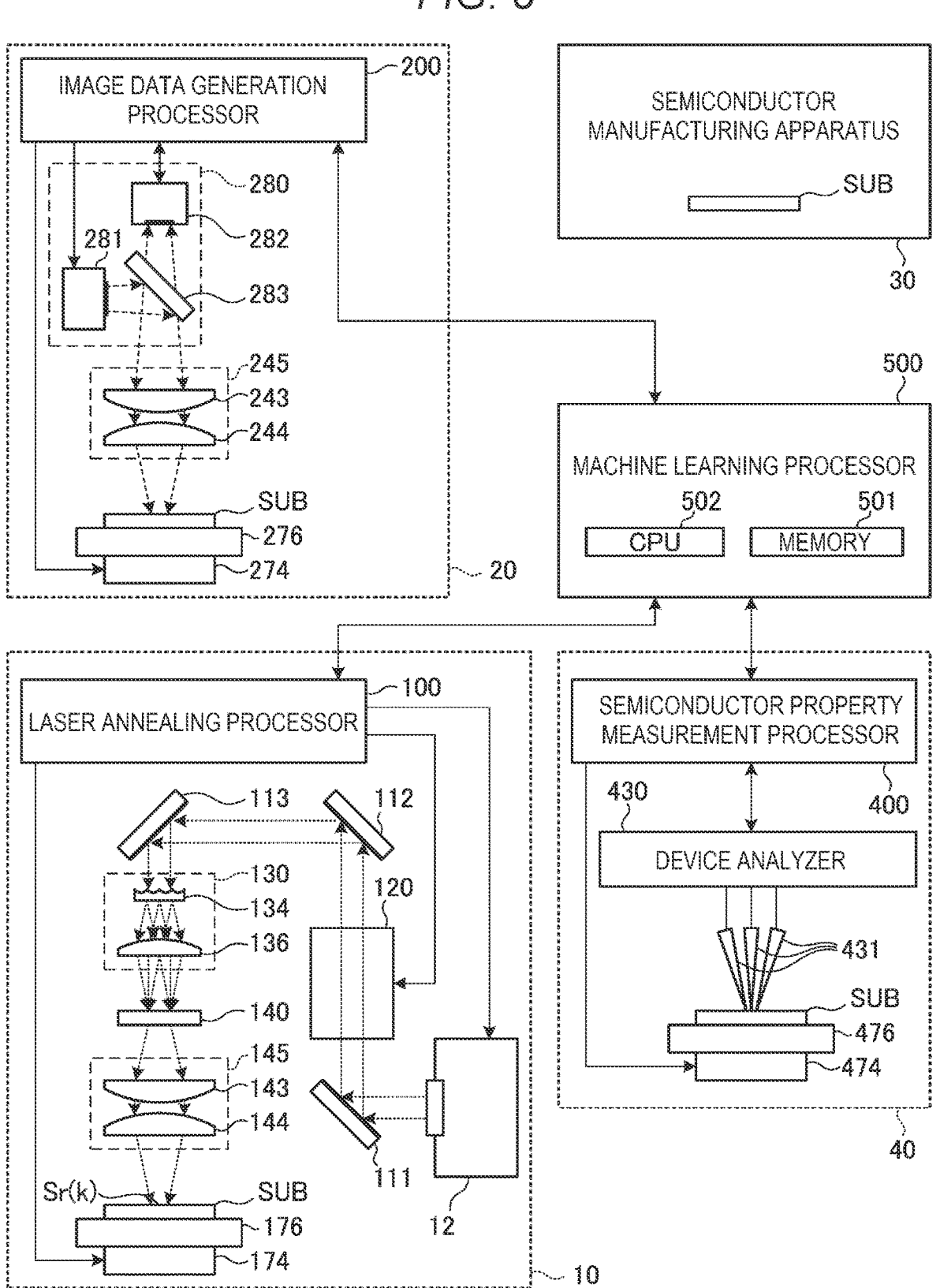
FIG. 8 schematically shows the configuration of a machine learning system according to a first embodiment.

FIG. 8 schematically shows the configuration of a machine learning system according to a first embodiment. The machine learning system includes the laser annealing system 10, an image data generation section 20, a semiconductor property measurement section 40, and a machine learning processor 500.

2.1.1 Laser Annealing System 10

The laser annealing processor 100 provided in the laser annealing system 10 receives radiation condition setting data and a laser annealing execution instruction from the machine learning processor 500. The laser annealing processor 100 notifies the machine learning processor 500 of completion of the operation of the workpiece transportation robot, which is not shown, and completion of the laser annealing. The laser annealing system 10 performs the laser annealing of an annealed sample substrate SUB.

In other respects, the configuration of the laser annealing system 10 may be the same as that described with reference to FIG. 1. FIG. 8 does not show some components of the laser annealing system 10.

2.1.2 Image Data Generation Section 20

The image data generation section 20 includes an image data generation processor 200, a transfer optical system 245, an XYZ stage 274, and an image generation unit 280.

The XYZ stage 274 is fixed to a frame that is not shown. The annealed sample substrate SUB having undergone the laser annealing is supported by a table 276 of the XYZ stage 274.

The transfer optical system 245 is disposed in the optical path between the image generation unit 280 and the substrate SUB. The transfer optical system 245 may be a reduction projection optical system including a combination lens having a plurality of lenses 243 and 244.

The image generation unit 280 includes an illumination light source 281, an imaging section 282, and a half-silvered mirror 283.

The illumination light source 281 is configured to output illumination light toward the half-silvered mirror 283. The illumination light contains a plurality of wavelength components in a visible light band. For example, the illumination light is white light. Part of the illumination light is reflected off the half-silvered mirror 283, passes through the transfer optical system 245, is radiated onto the substrate SUB, and is reflected off the substrate SUB.

The imaging section 282 includes an image sensor. The imaging section 282 receives part of the reflected illumination light via the transfer optical system 245 and the half-silvered mirror 283. An image of the surface of the substrate SUB is formed at the light receiving surface of the imaging section 282 by the transfer optical system 245. The imaging section 282 generates image data from the image formed at the light receiving surface and outputs the generated image data.

The image data generation processor 200 is configured to control the XYZ stage 274, the illumination light source 281, and the imaging section 282. The image data generation processor 200 receives the image data from the imaging section 282. The image data generation processor 200 controls a workpiece transportation robot, which is not shown but places the substrate SUB at the table 276 of the XYZ stage 274.

The image data generation processor 200 receives an image data generation instruction from the machine learning processor 500. The image data generation processor 200 notifies the machine learning processor 500 of completion of the operation of the workpiece transportation robot and completion of the generation of the image data, and transmits the image data.

2.1.3 Semiconductor Property Measurement Section 40

The semiconductor property measurement section 40 includes a semiconductor property measurement processor 400, a device analyzer 430, and an XYZ stage 474.

The XYZ stage 474 is fixed to the frame that is not shown. The annealed sample substrate SUB on which a semiconductor device has been produced is supported by a table 476 of the XYZ stage 474. The semiconductor device is produced by a semiconductor manufacturing apparatus 30.

The device analyzer 430 measures the semiconductor properties of the semiconductor device formed at the surface of the substrate SUB by bringing probes 431 into contact with terminals of the semiconductor device, and outputs the measured semiconductor properties. The semiconductor properties include, for example, electron mobility. The semiconductor properties instead include a gate threshold voltage.

The semiconductor property measurement processor 400 is configured to control the XYZ stage 474 and the device analyzer 430. The semiconductor property measurement processor 400 receives the data on the measured semiconductor properties from the device analyzer 430. The semiconductor property measurement processor 400 controls a workpiece transportation robot, which is not shown but places the substrate SUB at the table 476 of the XYZ stage 474.

The semiconductor property measurement processor 400 receives a semiconductor property measurement instruction from the machine learning processor 500. The semiconductor property measurement processor 400 notifies the machine learning processor 500 of completion of the operation of the workpiece transportation robot and completion of the measurement of the semiconductor properties, and transmits the measured data.

2.1.4 Machine Learning Processor 500

The machine learning processor 500 is a processing apparatus including a memory 501, which stores a control program, and a CPU 502, which executes the control program. The machine learning processor 500 is particularly configured or programmed to carry out a variety of processes included in the present disclosure.

2.2 Operation of Machine Learning

2.2.1 Main Procedure

Figure 9:
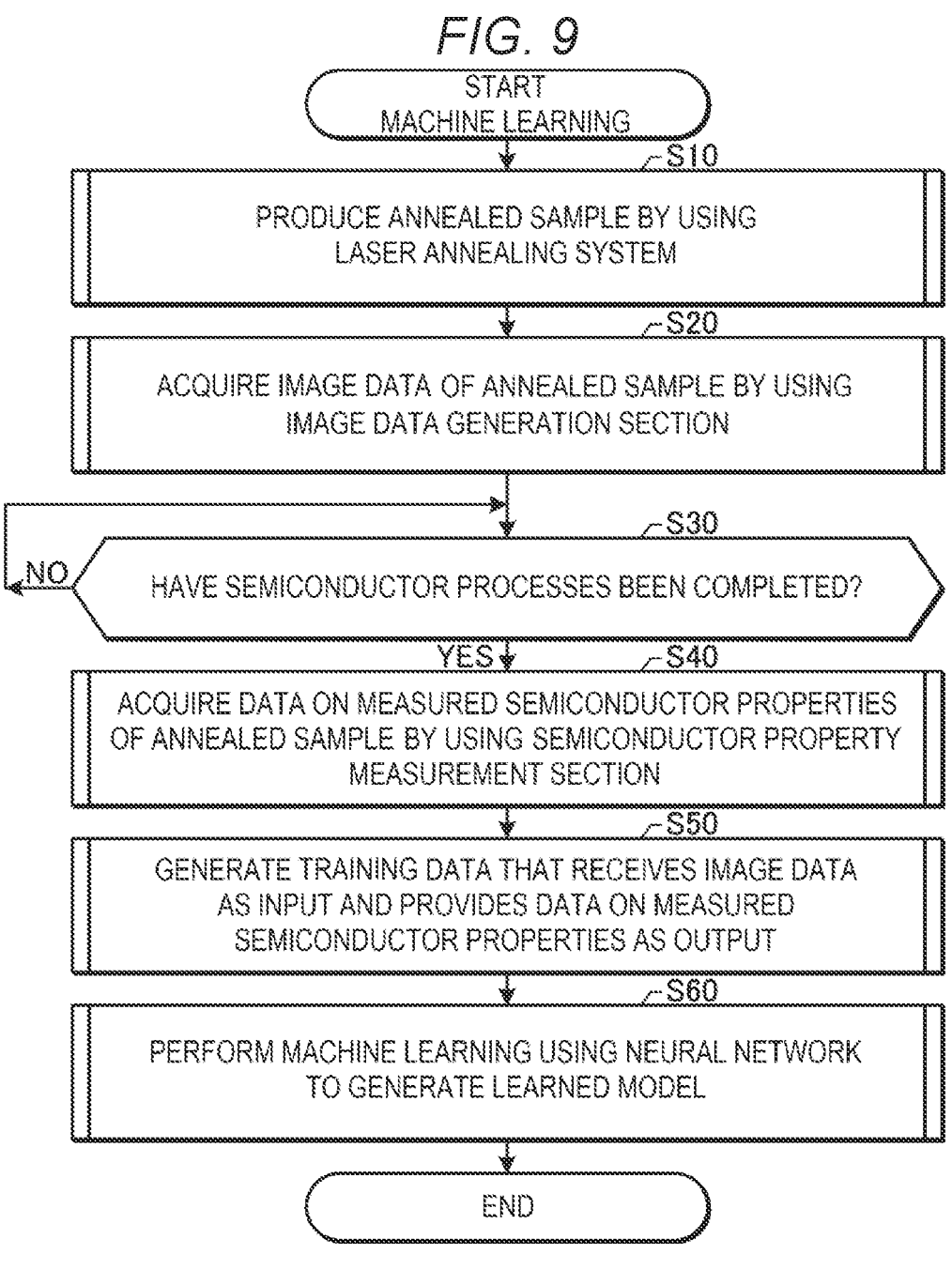
FIG. 9 is a flowchart showing the operation of a machine learning processor in the first embodiment.

FIG. 9 is a flowchart showing the operation of the machine learning processor 500 in the first embodiment. In the first embodiment, machine learning is performed in accordance with a method described below to generate a learned model.

In S10, the machine learning processor 500 causes the laser annealing system 10 to perform the laser annealing to produce an annealed sample. The laser annealing is performed by irradiating a semiconductor film on the annealed sample substrate SUB with the pulse laser light. S10 will be described later in detail with reference to FIG. 10.

In S20, the machine learning processor 500 causes the image data generation section 20 to generate image data, and acquires the image data of each of the radiation receiving regions Sr(1) to Sr(Kmax) of the annealed sample by using the image data generation section 20. The image data is generated from the reflected light of the illumination light having been radiated onto the annealed sample. S20 will be described later in detail with reference to FIG. 11.

In S30, the machine learning processor 500 evaluates whether semiconductor processes carried out by the semiconductor manufacturing apparatus 30 are completed and a semiconductor device has been produced. The semiconductor processes include the process of depositing a photoresist film and other films, an etching processes, an ion implantation process, and other processes. When the semiconductor processes have not been completed (NO in S30), the machine learning processor 500 waits until the semiconductor processes are completed. When the semiconductor processes have been completed (YES in S30), the machine learning processor 500 proceeds to the process in S40.

In S40, the machine learning processor 500 causes the semiconductor property measurement section 40 to measure the semiconductor properties, and acquires data on the measured semiconductor properties of each of the radiation receiving regions Sr(1) to Sr(Kmax) of the annealed sample by using the semiconductor property measurement section 40. S40 will be described later in detail with reference to FIG. 12.

In S50, the machine learning processor 500 generates training data that associates the image data as the input with the data on the measured semiconductor properties as the output. S50 will be described later in detail with reference to FIGS. 13 and 14.

In S60, the machine learning processor 500 performs machine learning using a neural network based on the training data to generate a learned model. S60 will be described later in detail with reference to FIGS. 15 and 16.

After S60, the machine learning processor 500 terminates the processes of the present flowchart.

2.2.2 Producing Annealed Sample

FIG. 10 is a flowchart showing the details of the process of causing the laser annealing system 10 to produce an annealed sample. The flowchart shown in FIG. 10 corresponds to the subroutine of S10 in FIG. 9.

In S11, the machine learning processor 500 transmits data used to set the radiation conditions for producing an annealed sample to the laser annealing processor 100 of the laser annealing system 10. The radiation conditions for producing an annealed sample may be the same as those described with reference to FIG. 4. However, the target fluence values Ft(1) to Ft(Kmax) are desirably set, for example, to be greater than or equal to 400 mJ/cm$^2$ but smaller than or equal to 700 mJ/cm$^2$ and not to concentrate in a range around a specific value. Furthermore, the numbers of radiation pulses Np(1) to Np(Kmax) are desirably set, for example to be greater than or equal to 1 but smaller than or equal to 15 and not to concentrate in a range around a specific value.

In S12, the machine learning processor 500 evaluates whether the annealed sample substrate SUB has been placed at the table 176 of the laser annealing system 10, that is, whether the operation of the workpiece transportation robot, which is not shown, of the laser annealing system 10 has been completed. When the substrate SUB has not been placed at the table 176 (NO in S12), the machine learning processor 500 waits until the substrate SUB is placed at the table 176. When the substrate SUB has been placed at the table 176 (YES in S12), the machine learning processor 500 proceeds to the process in S13.

In S13, the machine learning processor 500 causes the laser annealing system 10 to perform the laser annealing by transmitting the laser annealing execution instruction to the laser annealing processor 100.

In S14, the machine learning processor 500 evaluates whether all the radiation receiving regions Sr(1) to Sr(Kmax) of the annealed sample substrate SUB have been irradiated with the laser light, that is, whether the laser annealing has been completed. When all the radiation receiving regions Sr(1) to Sr(Kmax) have not been irradiated with the laser light (NO in S14), the machine learning processor 500 waits until all the radiation receiving regions Sr(1) to Sr(Kmax) are irradiated with the laser light. When all the radiation receiving regions Sr(1) to Sr(Kmax) have been irradiated with the laser light (YES in S14), the machine learning processor 500 terminates the processes of the present flowchart and returns to the processes shown in FIG. 9.

2.2.3 Acquiring Image Data

FIG. 11 is a flowchart showing the details of the process of acquiring image data by using the image data generation section 20. The flowchart shown in FIG. 11 corresponds to the subroutine of S20 in FIG. 9.

In S22, the machine learning processor 500 evaluates whether the annealed sample substrate SUB has been placed at the table 276 of the image data generation section 20, that is, whether the operation of the workpiece transportation robot, which is not shown, of the image data generation section 20 has been completed. When the substrate SUB has not been placed at the table 276 (NO in S22), the machine learning processor 500 waits until the substrate SUB is placed at the table 276. When the substrate SUB has been placed at the table 276 (YES in S22), the machine learning processor 500 proceeds to the process in S23.

In S23, the machine learning processor 500 transmits an image data generation instruction to the image data generation processor 200 to cause the image data generation section 20 to generate image data.

In S24, the machine learning processor 500 evaluates whether image data of all the radiation receiving regions Sr(1) to Sr(Kmax) of the annealed sample substrate SUB have been generated. When image data of all the radiation receiving regions Sr(1) to Sr(Kmax) have not been generated (NO in S24), the machine learning processor 500 waits until image data of all the radiation receiving regions Sr(1) to Sr(Kmax) are generated. When image data of all the radiation receiving regions Sr(1) to Sr(Kmax) have been generated (YES in S24), the machine learning processor 500 proceeds to the process in S25.

In S25, the machine learning processor 500 receives the image data from the image data generation section 20.

After S25, the machine learning processor 500 terminates the processes of the present flowchart and returns to the processes shown in FIG. 9.

2.2.4 Acquiring Data on Measured Semiconductor Properties

FIG. 12 is a flowchart showing the details of the process of acquiring data on the measured semiconductor properties by using the semiconductor property measurement section 40. The flowchart shown in FIG. 12 corresponds to the subroutine of S40 in FIG. 9.

In S42, the machine learning processor 500 evaluates whether the annealed sample substrate SUB has been placed at the table 476 of the semiconductor property measurement section 40, that is, whether the operation of the workpiece transportation robot, which is not shown, of the semiconductor property measurement section 40 has been completed. When the substrate SUB has not been placed at the table 476 (NO in S42), the machine learning processor 500 waits until the substrate SUB is placed at the table 476. When the substrate SUB has been placed at the table 476 (YES in S42), the machine learning processor 500 proceeds to the process in S43.

In S43, the machine learning processor 500 causes the semiconductor property measurement section 40 to measure the semiconductor properties by transmitting a semiconductor property measurement instruction to the semiconductor property measurement processor 400.

In S44, the machine learning processor 500 evaluates whether the semiconductor properties of all the radiation receiving regions Sr(1) to Sr(Kmax) of the substrate SUB have been measured. When the semiconductor properties of all the radiation receiving regions Sr(1) to Sr(Kmax) have not been measured (NO in S44), the machine learning processor 500 waits until the semiconductor properties of all the radiation receiving regions Sr(1) to Sr(Kmax) are measured. When the semiconductor properties of all the radiation receiving regions Sr(1) to Sr(Kmax) have been measured (YES in S44), the machine learning processor 500 proceeds to the process in S45.

In S45, the machine learning processor 500 receives data on the measured semiconductor properties from the semiconductor property measurement section 40.

After S45, the machine learning processor 500 terminates the processes of the present flowchart and returns to the processes shown in FIG. 9.

2.2.5 Generating Training Data

FIG. 13 is a flowchart showing the details of the process of generating the training data. The flowchart shown in FIG. 13 corresponds to the subroutine of S50 in FIG. 9.

In S51, the machine learning processor 500 saves the image data received from the image data generation section 20 in the memory 501 with the image data associated with the radiation receiving regions Sr(1) to Sr(Kmax).

In S52, the machine learning processor 500 saves the data on the measured semiconductor properties received from the semiconductor property measurement section 40 in the memory 501 with the measured data associated with the radiation receiving regions Sr(1) to Sr(Kmax).

After S52, the machine learning processor 500 terminates the processes of the present flowchart and returns to the processes shown in FIG. 9.

FIG. 14 shows an example of the training data generated by the processes in FIG. 13. The training data includes the image data and the data on the measured semiconductor properties with the two types of data associated with the radiation receiving regions Sr(1) to Sr(Kmax). FIG. 14 shows an example in which electron mobility Em(1) to Em(Kmax) have been measured as the semiconductor properties. The semiconductor properties may instead be the gate threshold voltage.

The training data may be created separately for each semiconductor film deposition condition and for each mask 140 used for the laser annealing. When the radiation receiving region Sr(k) is irradiated with the pulse laser light having a light intensity distribution spatially homogenized by the shaping optical system 130 without using the mask 140, the training data may be created without using the mask 140.

2.2.6 Machine Learning

FIG. 15 is a flowchart showing the details of the process of generating a learned model by performing the machine learning. The flowchart shown in FIG. 15 corresponds to the subroutine of S60 in FIG. 9.

In S61, the machine learning processor 500 reads the training data from the memory 501. The training data are those described with reference to FIGS. 13 and 14.

In S62, the machine learning processor 500 allocates the training data in such a way that a part of the training data serves as learning data and another part of the training data serves as evaluation data. For example, 90% of the Kmax data sets associated with the radiation receiving regions Sr(1) to Sr(Kmax) are allocated as the learning data, and 10% of the Kmax data sets are allocated as the evaluation data. The allocation is randomly performed in all respects except for the ratio of the allocation. The phrase "randomly performed" used in the present disclosure includes use of pseudo-random numbers created by a computer in accordance with a certain algorithm. When the radiation conditions for the radiation receiving regions Sr(1) to Sr(Kmax) are set randomly, the operation of the allocation may not be randomly performed. For example, the training data associated with the radiation receiving regions Sr(1) to Sr(Kmax/10) may be allocated as the evaluation data.

In S63, the machine learning processor 500 sets a deep structure parameter. The deep structure is a type of a neural network, and is a structure in which functions that mimic the actions of neurons are multilayered.

Figure 16:
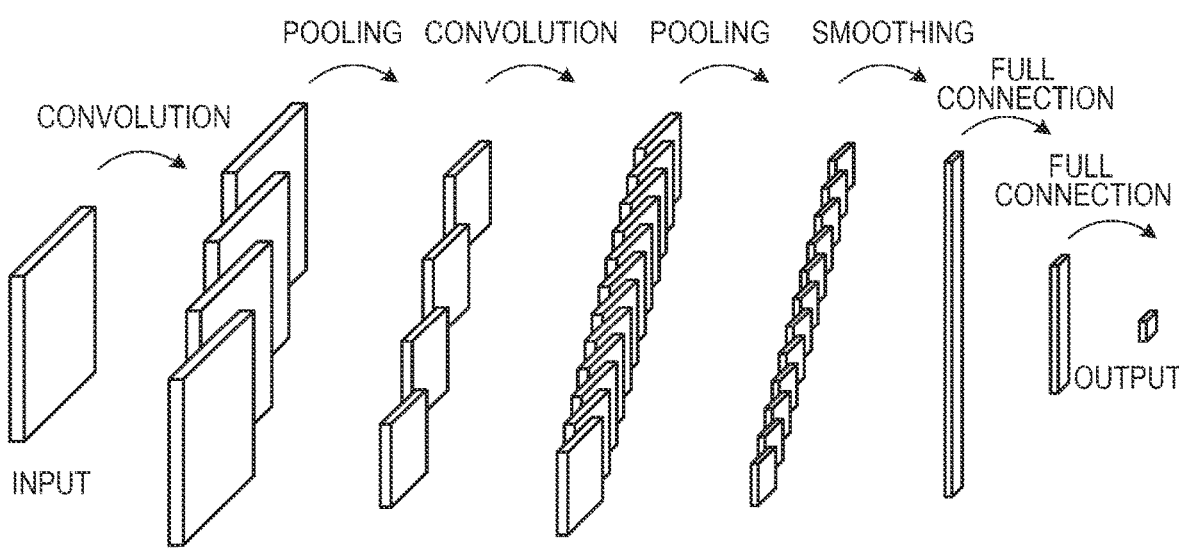
FIG. 16 schematically shows an example of a deep layer structure.

FIG. 16 schematically shows an example of the deep structure. When image data is inputted to the deep structure, the function of each of the layers receives data from the upstream layer and outputs data generated in accordance with the function of the layer to the downstream layer. These functions perform convolution, pooling, smoothing, and full connection.

Referring again to FIG. 15, in S64, the machine learning processor 500 trains the deep structure by using the learning data. Specifically, the image data contained in the learning data is inputted to the deep structure. The values of coefficients contained in each of the functions are then so determined that the sum of errors between the data outputted to the final layer of the deep structure and the data on the measured semiconductor properties contained in the learning data is minimized. The thus trained deep structure is referred to as a learned model in the present disclosure.

At S65, the machine learning processor 500 evaluates the learned model by using the evaluation data. Specifically, the image data contained in the evaluation data is inputted to the learned model. An error between the data outputted to the final layer of the learned model and the data on the measured semiconductor properties contained in the evaluation data is then calculated.

In S66, the machine learning processor 500 evaluates whether the learned model has sufficient accuracy. For example, the accuracy of the learned model is evaluated based on the average or variation of the error calculated in S65. When the accuracy of the learned model is not sufficient (NO in S66), the machine learning processor 500 returns to the process in S63, sets the parameter again, and redoes the deep structure training. When the accuracy of the learned model is sufficient (YES in S66), the machine learning processor 500 terminates the processes of the present flowchart and returns to the processes shown in FIG. 9.

When the accuracy of the learned model is determined to be sufficient, image data in which the semiconductor properties are unknown can be inputted to the learned model, and the output to the final layer of the learned model can be used as an estimate of the semiconductor properties.

Figure 17:
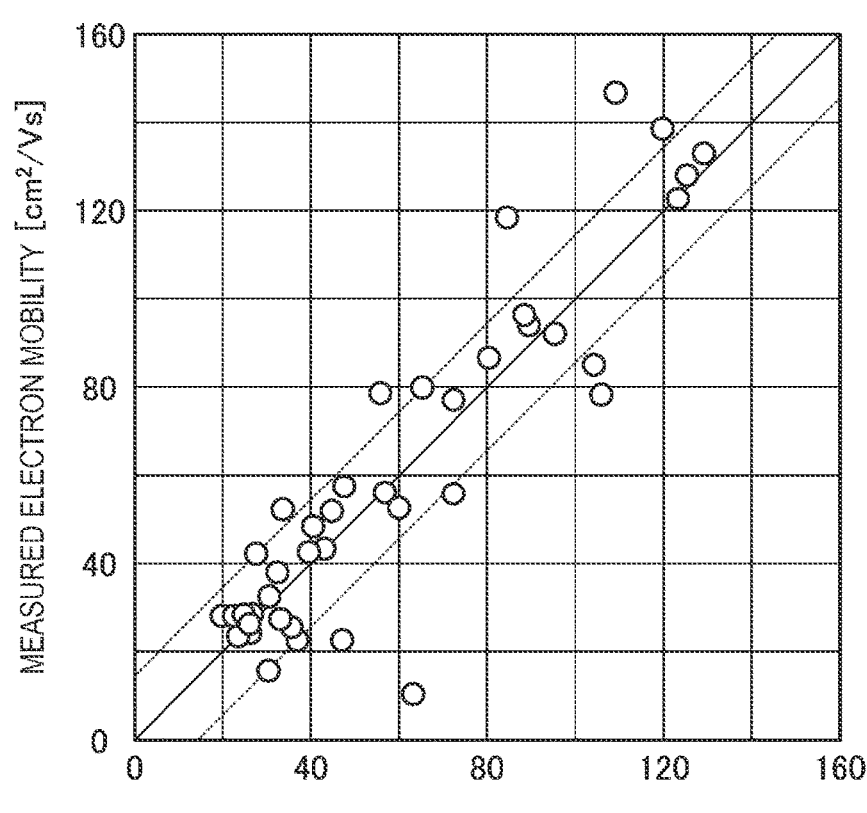
FIG. 17 shows graphs representing the result of evaluation of the learned model using evaluation data in S65 in FIG. 15.

FIG. 17 shows graphs representing the result of the evaluation of the learned model using the evaluation data in S65 in FIG. 15. The electron mobility is employed as the semiconductor properties. The horizontal axis of FIG. 17 represents estimated electron mobility outputted from the learned model after the image data contained in the evaluation data is inputted to the learned model. The vertical axis of FIG. 17 represents the measured electron mobility contained as measured data in the evaluation data.

As shown in FIG. 17, there are errors between the estimated electron mobility and the measured electron mobility, but the two types of electron mobility generally coincide with each other, indicating that the electron mobility can be estimated in a sufficiently accurate manner.

2.3 Effects (1) In the machine learning method according to the first embodiment, image data generated from the reflected light of the illumination light radiated to the radiation receiving region Sr(k) of the semiconductor film on the substrate SUB is acquired, the radiation receiving region Sr(k) annealed by the pulse laser light. Data on measured semiconductor properties of the radiation receiving region Sr(k) is acquired. Training data including the image data as input and the measured data as output associated with each other is generated. Machine learning is performed using a neural network based on the training data to generate a learned model.

The method allows prediction of the semiconductor properties based on the image data of the radiation receiving region Sr(k) in which the semiconductor properties are unknown, and adjustment of the pulse laser light radiation conditions even during the laser annealing.

(2) In the machine learning method according to the first embodiment, after the image data is acquired, a semiconductor device is produced by carrying out semiconductor processes, and the measured data is then acquired.

Therefore, even when the semiconductor properties are those that cannot be measured before the semiconductor device is produced, the semiconductor properties can be predicted based on the image data of the radiation receiving region Sr(k). Examples of the semiconductor properties that cannot be measured before the semiconductor device is produced include the electron mobility and the gate threshold voltage. Another example of the semiconductor properties is contact resistance.

(3) The machine learning method according to the first embodiment further includes evaluating the learned model. The learned model is generated by using a part of the training data as learning data, and the learned model is evaluated by using another part of the training data as evaluation data.

According to the method described above, which uses evaluation data that has not been used as the learning data, the learned model can be properly evaluated.

As for the other points, the first embodiment is the same as Comparative Example.

3. Laser Annealing System 10b that Corrects Radiation Conditions by Estimating Electron Mobility

3.1 Configuration

Figures 18, 19:
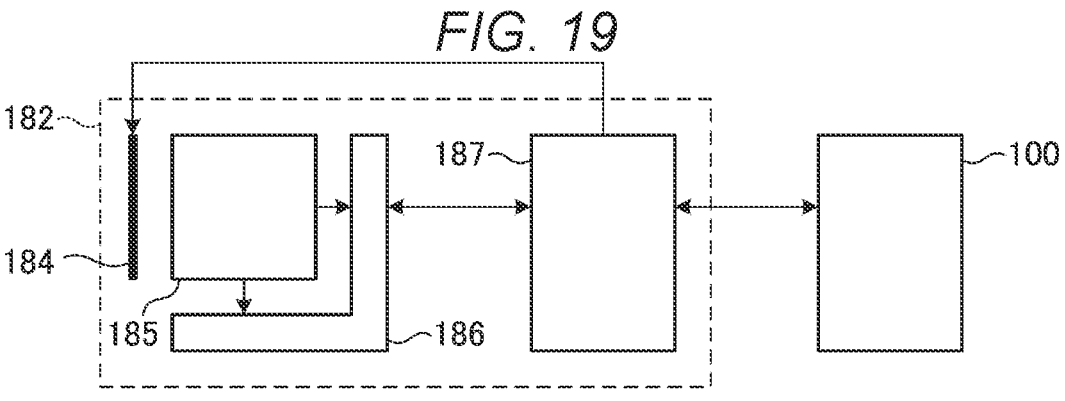
FIG. 18 schematically shows the configuration of the laser annealing system according to a second embodiment.
FIG. 19 diagrammatically shows the configuration of an imaging section.

FIG. 18 schematically shows the configuration of a laser annealing system 10b according to a second embodiment. The laser annealing system 10b includes an image generation unit 180 in addition to the configuration of the laser annealing system 10 according to Comparative Example, and includes a beam splitter 115b in place of the highly reflective mirror 115. The memory 101 stores a learned model that receives image data as input and provides an estimated value Eme(k) of the electron mobility as output, and the laser annealing processor 100 has access to the learned model.

The image generation unit 180 includes an illumination light source 181, an imaging section 182, and a half-silvered mirror 183. The configurations of the components described above are the same as those of the image generation unit 280 in the first embodiment.

The beam splitter 115b is a dichroic mirror that transmits one of visible illumination light outputted from the illumination light source 181 and the ultraviolet pulse laser light outputted from the laser apparatus 12 and reflects the other. In the example shown in FIG. 18, the beam splitter 115b is configured to transmit the illumination light and reflect the pulse laser light.

Instead, the beam splitter 115*b* may be replaced with the same highly reflective mirror 115 as that in Comparative Example, so that the illumination light outputted from the illumination light source 181 may be incident on the substrate SUB at an angle of incidence different from that of the pulse laser light.

Part of the illumination light outputted from the illumination light source 181 is reflected off the half-silvered mirror 183, passes through the beam splitter 115*b* and the projection optical system 145, is radiated to the radiation receiving region Sr(k) of the substrate SUB, and is reflected off the substrate SUB. The imaging section 182 receives part of the reflected illumination light via the projection optical system 145, the beam splitter 115*b*, and the half-silvered mirror 183 to generate image data. The projection optical system 145 may include a combination of a calcium fluoride lens and a synthetic quartz lens to reduce chromatic aberrations produced due to the difference in wavelength between the UV pulse laser light and the visible illumination light.

FIG. 19 diagrammatically shows the configuration of the imaging section 182. The imaging section 182 includes a shutter 184, an image sensor 185, a drive circuit 186, and an imaging controller 187.

The shutter 184 opens and closes in response to a shutter trigger signal received from the imaging controller 187, and blocks the reflected illumination light reflected off the substrate SUB when the shutter 184 is closed. The thus configured shutter 184 adjusts the timing when the reflected light is incident on the image sensor 185 and the length of period for which the reflected light is incident on the image sensor 185. The image sensor 185 includes, for example, charge coupled devices (CCDs) arranged in a matrix and captures an image of the surface of the substrate SUB. The drive circuit 186 reads out the image data by detecting the charge produced by each of the charge coupled devices. The imaging controller 187 controls the charge detection performed by the drive circuit 186 and processes the image data read out by the drive circuit 186. The imaging controller 187 receives a control signal from the laser annealing processor 100 and transmits the image data to the laser annealing processor 100. The imaging controller 187 may instead be provided in the laser annealing processor 100. The image sensor 185 may instead include a complementary metal oxide semiconductor (CMOS) transistors in place of the charge coupled devices.

3.2 Operation

3.2.1 Main Procedure

Figure 20:
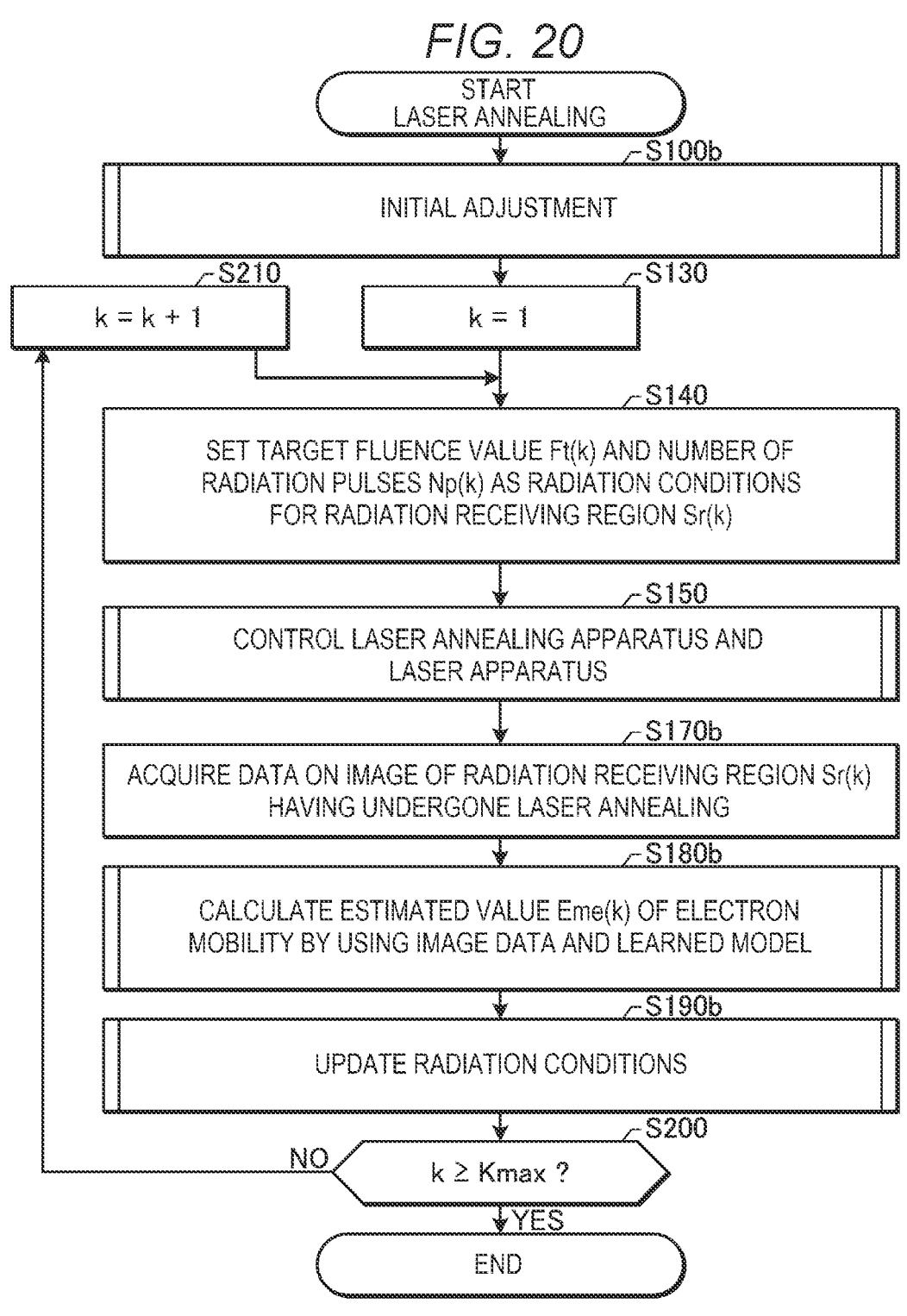
FIG. 20 is a flowchart showing the operation of the laser annealing processor in the second embodiment.

FIG. 20 is a flowchart showing the operation of the laser annealing processor 100 in the second embodiment. In the second embodiment, the laser annealing based on the step-and-repeat scheme is performed in accordance with the method below.

In S100*b*, the laser annealing processor 100 performs the initial adjustment. S100*b* will be described later in detail with reference to FIG. 21.

The processes in S130 to S150 are the same as those described in Comparative Example.

In S170*b*, the laser annealing processor 100 acquires image data of the radiation receiving region Sr(k) having undergone the laser annealing. It is assumed that the XYZ stage 174 has not yet moved until the radiation receiving region Sr(k) is irradiated with the pulse laser light having the Np(k) pulses with the XYZ stage 174 paused in S150 and then the process in S170*b* is carried out. The laser annealing processor 100 controls the illumination light source 181 and the imaging section 182 to acquire image data of the radiation receiving region Sr(k).

In S180*b*, the laser annealing processor 100 calculates the estimated value Eme(k) of the electron mobility by using the image data and the learned model. S180*b* will be described later in detail with reference to FIG. 22.

In S190*b*, the laser annealing processor 100 updates the pulse laser light radiation conditions based on the estimated value Eme(k) of the electron mobility. Updating the radiation conditions includes updating with the radiation conditions unchanged and updating with the radiation conditions corrected. S190*b* will be described later in detail with reference to FIGS. 23 to 29.

The processes in S200 to S210 are the same as those described in Comparative Example. The next radiation receiving region Sr(k+1) is irradiated with the pulse laser light after one is added to the value of k. The update of the radiation conditions in S190*b* is therefore performed before the next radiation receiving region Sr(k+1) is irradiated with the pulse laser light. The next radiation receiving region Sr(k+1) corresponds to the second region in the present disclosure.

3.2.2 Initial Adjustment

FIG. 21 is a flowchart showing the details of an initial adjustment process shown in FIG. 20. The flowchart shown in FIG. 21 corresponds to the subroutine of S100*b* in FIG. 20.

The process in S101 is the same as that in Comparative Example.

In S102*b*, the laser annealing processor 100 reads data used to set the radiation conditions for the radiation receiving region Sr(1) and a target value Emt of the electron mobility. The radiation conditions for the radiation receiving region Sr(1) include the target fluence value Ft(1) and the number of radiation pulses Np(1). The radiation conditions for the radiation receiving region Sr(2) and the following radiation receiving region are set in S190*b*.

After S102*b*, the laser annealing processor 100 terminates the processes of the present flowchart and returns to the processes shown in FIG. 20.

3.2.3 Calculating Estimated Value Eme(k) of Electron Mobility

FIG. 22 is a flowchart showing the details of the process of calculating an estimated value Eme(k) of electron mobility shown in FIG. 20. The flowchart shown in FIG. 22 corresponds to the subroutine of S180*b* in FIG. 20.

In S181, the laser annealing processor 100 reads out the learned model from the memory 101.

In S182, the laser annealing processor 100 inputs the image data acquired in S170*b* to the learned model.

In S183*b*, the laser annealing processor 100 calculates the estimated value Eme(k) of the electron mobility.

After S183*b*, the laser annealing processor 100 terminates the processes of the present flowchart and returns to the processes shown in FIG. 20.

3.2.4 Updating Radiation Conditions

FIG. 23 is a flowchart showing the details of the process of updating the radiation conditions shown in FIG. 20. The flowchart shown in FIG. 23 corresponds to the subroutine of S190*b* in FIG. 20.

In S191$b$, the laser annealing processor 100 calculates a difference $\Delta Em(k)$ between the estimated value $Eme(k)$ of the electron mobility calculated in FIG. 22 and the target value $Emt$ of the electron mobility read in FIG. 21 by using the expression below.

$$\Delta Em(k)=Eme(k)-Emt$$

In S192$b$, the laser annealing processor 100 evaluates whether the absolute value of the difference $\Delta Em(k)$ calculated in S191$b$ is smaller than or equal to a first threshold $Emtr$.

When the absolute value of the difference $\Delta Em(k)$ is smaller than or equal to the first threshold $Emtr$ (YES in S192$b$), the laser annealing processor 100 proceeds to the process in S193. In S193, the laser annealing processor 100 sets the target fluence value $Ft(k)$ and the number of radiation pulses $Np(k)$, which are the current radiation conditions, as the next radiation conditions, $Ft(k+1)$ and $Np(k+1)$, respectively. That is, the radiation conditions are not changed.

When the absolute value of the difference $\Delta Em(k)$ is greater than the first threshold $Emtr$ (NO in S192$b$), the laser annealing processor 100 proceeds to the process in S194$b$. In S194$b$, the laser annealing processor 100 corrects the pulse laser light radiation conditions based on the estimated value $Eme(k)$ of the electron mobility. The process in S194$b$ will be described later in detail with reference to FIGS. 24 to 29.

After S193 or S194$b$, the laser annealing processor 100 terminates the processes of the present flowchart and returns to the processes shown in FIG. 20.

3.2.4.1 First Example of Process of Correcting Radiation Conditions

FIG. 24 is a flowchart showing a first example of the process of correcting the radiation conditions shown in FIG. 23. The flowchart shown in FIG. 24 corresponds to the subroutine of S194$b$ in FIG. 23.

In S1946$b$, the laser annealing processor 100 evaluates whether the product of a change in the estimated value $Eme(k)$ of the electron mobility and a change in the target fluence value $Ft(k)$ is greater than or equal to zero. That is, the laser annealing processor 100 evaluates whether the expression below is satisfied.

$$(Eme(k)-Eme(k-1))\times(Ft(k)-Ft(k-1))\geq 0$$

When the expression is satisfied (YES in S1946$b$), the laser annealing processor 100 proceeds to the process in S1947$b$.

When the expression is not satisfied (NO in S1946$b$), the laser annealing processor 100 proceeds to the process in S1948$b$.

FIG. 25 is a graph showing a typical relationship between the target fluence value $Ft(k)$ and the estimated value $Eme(k)$ of the electron mobility. The curve representing the relationship between the target fluence value $Ft(k)$ and the estimated value $Eme(k)$ of the electron mobility has an upwardly convex shape, and the target value $Emt$ of the electron mobility is set at a value close to the maximum of the estimated value $Eme(k)$. When the estimated value $Eme(k)$ of the electron mobility is greater than or equal to $Emt-Emtr$, which is the result of subtraction of the first threshold $Emtr$ from the target value $Emt$, but smaller than or equal to $Emt+Emtr$, which is the result of addition of the first threshold $Emtr$ to the target value $Emt$, the result of the evaluation in S192$b$ is YES, and the processes shown in FIG. 24 are not carried out. On the other hand, when the estimated value $Eme(k)$ of the electron mobility does not fall within the range described above, the target fluence value $Ft(k)$ is either in a low electron mobility region L or in a high electron mobility region H. When the target fluence value $Ft(k)$ is in the low electron mobility region L, the relationship of the estimated value $Eme(k)$ of the electron mobility with the target fluence value $Ft(k)$ shows a rightward increase. When the target fluence value $Ft(k)$ is in the high electron mobility region H, the relationship of the estimated value $Eme(k)$ of the electron mobility with the target fluence value $Ft(k)$ shows a rightward decrease.

FIG. 26 is a table showing a criterion for determination of the direction in which the target fluence value $Ft(k)$ is controlled in the second embodiment.

In FIG. 26, the direction of a change in the target fluence value $Ft(k)$ indicates whether the amount of change in the target fluence value $Ft(k)$, $Ft(k)-Ft(k-1)$, is positive or negative. That is, when the target fluence value $Ft(k)$ was increased in the previous update, the amount of change $Ft(k)-Ft(k-1)$ is a positive value, and when the target fluence value $Ft(k)$ was decreased in the previous update, the amount of change $Ft(k)-Ft(k-1)$ is a negative value.

The direction of a change in the estimated value $Eme(k)$ of the electron mobility indicates whether the amount of change in the estimated value $Eme(k)$ of the electron mobility, $Eme(k)-Eme(k-1)$, is a positive or negative value. That is, when the estimated value $Eme(k)$ of the electron mobility is greater than that before the previous update, the amount of change $Eme(k)-Eme(k-1)$ is a positive value, and when the estimated value $Eme(k)$ of the electron mobility is smaller than that before the previous update, the amount of change $Eme(k)-Eme(k-1)$ is a negative value.

When both of the amounts of change described above are positive or negative, the product of the amounts of change is positive. When one of the amounts of change described above is positive and the other is negative, the product of the amounts of change is negative.

When the product of the amounts of change is positive (YES in S1946$b$), the current target fluence value $Ft(k)$ is in the low electron mobility region L. Therefore, the estimated value $Eme(k)$ of the electron mobility can be brought closer to the target value $Emt$ by setting the direction in which the target fluence value $Ft(k)$ is controlled to be positive.

When the product of the amounts of change is negative (NO in S1946$b$), the current target fluence value $Ft(k)$ is in the high electron mobility region H. Therefore, the estimated value $Eme(k)$ of the electron mobility can be brought closer to the target value $Emt$ by setting the direction in which the target fluence value $Ft(k)$ is controlled to be negative.

Referring again to FIG. 24, in S1947$b$, the laser annealing processor 100 calculates the next target fluence value $Ft(k+1)$ by adding a positive number $\Delta Ft$ to the current target fluence value $Ft(k)$.

In S1948$b$, the laser annealing processor 100 calculates the next target fluence value $Ft(k+1)$ by subtracting the positive number $\Delta Ft$ from the current target fluence value $Ft(k)$.

After S1947$b$ or S1948$b$, the laser annealing processor 100 terminates the processes of the present flowchart and returns to the processes shown in FIG. 23.

The first example of the process of correcting the radiation conditions is carried out as described above.

3.2.4.2 Second Example of Process of Correcting Radiation Conditions

Figure 27:
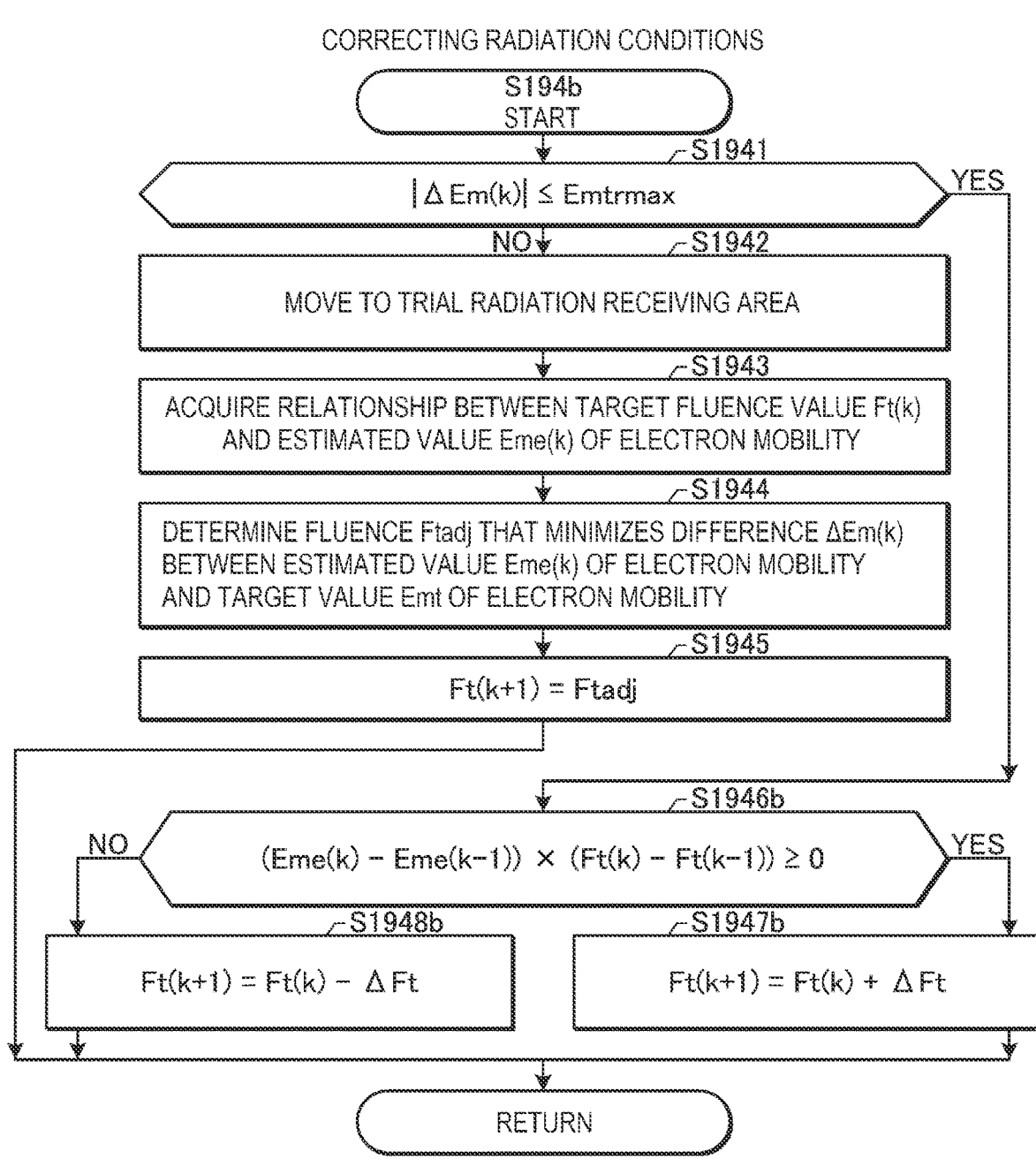
FIG. 27 is a flowchart showing a second example of the process of correcting the radiation conditions shown in FIG. 23.

FIG. 27 is a flowchart showing a second example of the process of correcting the radiation conditions shown in FIG.

US 12,690,409 B2

23

23. The flowchart shown in FIG. 27 corresponds to the subroutine of S194*b* in FIG. 23.

In S1941, the laser annealing processor 100 evaluates whether the absolute value of the difference ΔEm(k) calculated in S191*b* is smaller than or equal to a second threshold Emtrmax. The second threshold Emtrmax is greater than the first threshold Emtr in S192*b*.

When the absolute value of the difference ΔEm(k) is smaller than or equal to the second threshold Emtrmax (YES in S1941), the laser annealing processor 100 proceeds to the process in S1946*b*. The process in step S1946*b* and the following processes are the same as those described with reference to FIG. 24.

When the absolute value of the difference ΔEm(k) is greater than the second threshold Emtrmax (NO in S1941), the laser annealing processor 100 proceeds to the process in S1942.

In S1942, the laser annealing processor 100 controls the XYZ stage 174 to move the substrate SUB in such a way that a trial radiation receiving area of the substrate SUB is irradiated with the pulse laser light. Instead, a substrate for trial radiation that is not shown may be placed at the table 176 in place of the substrate SUB.

In S1943, the laser annealing processor 100 acquires the relationship between the target fluence value Ft(K) and the estimated value Eme(k) of the electron mobility. Specifically, with the target fluence value Ft(K) for each value of k changed, the corresponding radiation receiving region Sr(k) undergoes the laser annealing by using trial radiation, followed by acquisition of image data each time the laser annealing is performed, and calculation of the estimated value Eme(k) of the electron mobility.

In S1944, the laser annealing processor 100 determines fluence Ftadj that minimizes the difference ΔEm(k) between the estimated value Eme(k) of the electron mobility and the target value Emt based on the relationship between the target fluence value Ft(K) and the estimated value Eme(k) of the electron mobility.

In S1945, the laser annealing processor 100 sets the fluence Ftadj as the next target fluence value Ft(k+1).

After S1945, S1947*b*, or S1948*b*, the laser annealing processor 100 terminates the processes of the present flowchart and returns to the processes shown in FIG. 23.

The second example of the process of correcting the radiation conditions is carried out as described above.

According to the second example, even when the difference between the target fluence value Ft(K) and the actual fluence increases due to degradation of the optical system provided in the laser annealing apparatus 14, the relationship between the target fluence value Ft(K) and the estimated value Eme(k) of the electron mobility can be acquired for correction of the target fluence value Ft(K). The correction can be made based on the relationship between the target fluence value Ft(K) and the estimated value Eme(k) of the electron mobility without measurement of the electron mobility with the device analyzer 430.

In S1941, the degradation of the optical system may be evaluated in a different way. For example, an energy monitor that is not shown may be disposed in the optical path of the pulse laser light having passed through the attenuator 120, and when the output from the energy monitor decreases, the processes in S1942 to S1945 may be carried out. The processes in S1942 to S1945 may instead be carried out when the accumulated number of pulses used by the laser annealing apparatus 14 to perform the laser annealing is greater than or equal to a predetermined value.

3.2.4.3 Third Example of Process of Correcting Radiation Conditions

Figure 28:
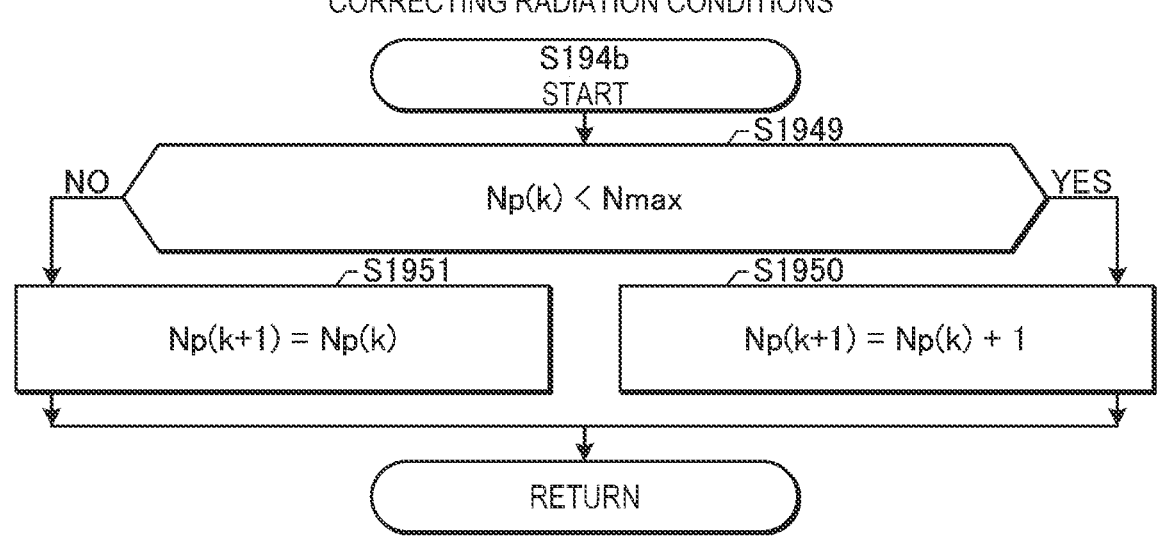
FIG. 28 is a flowchart showing a third example of the process of correcting the radiation conditions shown in FIG. 23.

FIG. 28 is a flowchart showing a third example of the process of correcting the radiation conditions shown in FIG. 23. The flowchart shown in FIG. 28 corresponds to the subroutine of S194*b* in FIG. 23.

In S1949, the laser annealing processor 100 evaluates whether the number of radiation pulses Np(k) is smaller than a threshold Nmax.

When the number of radiation pulses Np(k) is smaller than the threshold Nmax (YES in S1949), the laser annealing processor 100 proceeds to the process in S1950.

When the number of radiation pulses Np(k) is greater than or equal to the threshold Nmax (NO in S1949), the laser annealing processor 100 proceeds to the process in S1951.

Figure 29:
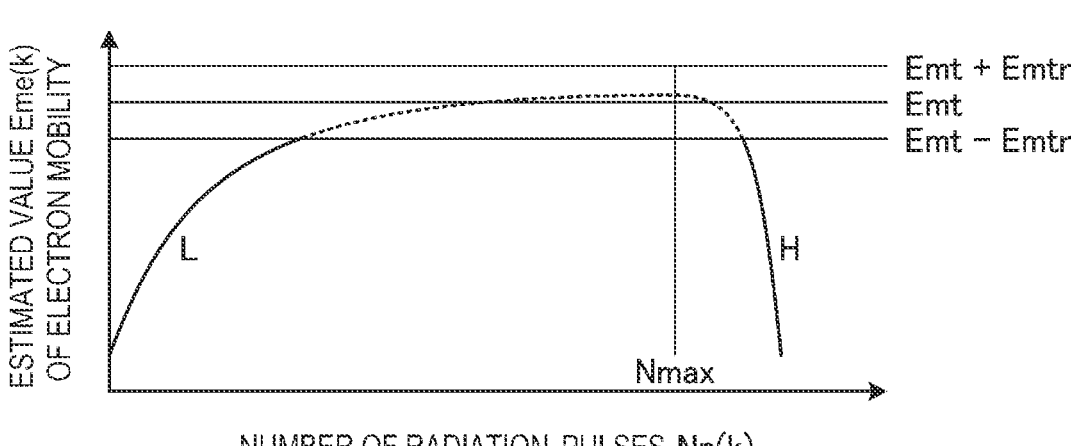
FIG. 29 is a graph showing a typical relationship between the number of radiation pulses Np(k) and the estimated value Eme(k) of the electron mobility.

FIG. 29 is a graph showing a typical relationship between the number of radiation pulses Np(k) and the estimated value Eme(k) of the electron mobility. When the estimated value Eme(k) of the electron mobility is greater than or equal to Emt−Emtr, which is the result of subtraction of the first threshold Emtr from the target value Emt, but smaller than or equal to Emt+Emtr, which is the result of addition of the first threshold Emtr to the target value Emt, the result of the evaluation in S192*b* is YES, and the processes shown in FIG. 28 are not carried out. On the other hand, when the estimated value Eme(k) of the electron mobility does not fall within the range described above, the number of radiation pulses Np(k) is either in a small number region L or in a large number region H. When the number of radiation pulses Np(k) is in the small number region L, the relationship of the estimated value Eme(k) of the electron mobility with the number of radiation pulses Np(k) shows a rightward increase. When the number of radiation pulses Np(k) is in the large number region H, the relationship of the estimated value Eme(k) of the electron mobility with the number of radiation pulses Np(k) shows a steep rightward decrease.

In the region H, it is difficult in some cases to evaluate the direction in which the number of radiation pulses Np(k) is controlled, and the large number of radiation pulses Np(k) increases the time and cost required for the laser annealing in some cases. The threshold Nmax of the number of radiation pulses Np(k) is therefore so set that the number of radiation pulses Np(k) does not fall within the region H.

When the number of radiation pulses Np(k) is smaller than the threshold Nmax (YES in S1949), the number of radiation pulses Np(k) falls within the small number region L, and the estimated value Eme(k) of the electron mobility can therefore be brought closer to the target value Emt by setting the direction in which the number of radiation pulses Np(k) is controlled to be positive.

Referring again to FIG. 28, in S1950, the laser annealing processor 100 calculates the number of next radiation pulses Np(k+1) by adding one to the number of current radiation pulses Np(k).

In S1951, the laser annealing processor 100 sets the number of current radiation pulses Np(k) as the number of next radiation pulses Np(k+1). That is, the radiation conditions are not changed.

After S1950 or S1951, the laser annealing processor 100 terminates the processes of the present flowchart and returns to the processes shown in FIG. 23.

The third example of the process of correcting the radiation conditions is carried out as described above.

One of the first to third examples may be carried out as the process of correcting the radiation conditions. Instead, the combination of the first example and the third example, or the combination of the second example and the third example may be used to correct the target fluence value Ft(k) and the number of radiation pulses Np(k).

3.3 Effects (4) The laser annealing system 10$b$ according to the second embodiment includes the laser apparatus 12, which outputs the pulse laser light for performing the laser annealing of the radiation receiving region Sr(k) of the semiconductor film on the substrate SUB, the illumination light source 181, which irradiates the radiation receiving region Sr(k) with the illumination light, the imaging section 182, which generates image data from the reflected light of the illumination light, and the laser annealing processor 100. The laser annealing processor 100 is configured to have access to a learned model that accepts the image data as input and provides the estimated value Eme(k) of the electron mobility as output, calculates the estimated value Eme (k) by using the image data and the learned model, and corrects the pulse laser light radiation conditions based on the estimated value Eme(k).

In the laser annealing method according to the second embodiment, the radiation receiving region Sr(k) of the semiconductor film on the substrate SUB is annealed with the pulse laser light. The radiation receiving region Sr(k) is irradiated with the illumination light, and the image data is generated from the reflected illumination light. The estimated value Eme(k) is calculated by using the learned model that receives the image data as input and provides the estimated value Eme(k) of the electron mobility as output. The pulse laser light radiation conditions are corrected based on the estimated value Eme(k).

The method allows prediction of the electron mobility based on the image data of the radiation receiving region Sr(k) in which the semiconductor properties are unknown, and adjustment of the pulse laser light radiation conditions even during the laser annealing.

(5) The laser annealing system 10$b$ according to the second embodiment further includes the beam splitter 115$b$ disposed in the optical path of the pulse laser light. The illumination light source 181 irradiates the radiation receiving region Sr(k) with the illumination light via the beam splitter 115$b$, and the imaging section 182 receives the reflected illumination light via the beam splitter 115$b$.

The configuration described above allows radiation of the pulse laser beam and radiation of the illumination light from the illumination light source 181 in almost the same direction via the beam splitter 115$b$, and allows the imaging section 182 to acquire the image data.

(6) In the laser annealing system 10$b$ according to the second embodiment, the pulse laser light contains a first wavelength component in an ultraviolet light band, and the illumination light contains a plurality of second wavelength components in a visible light band. The beam splitter 115$b$ is a dichroic mirror that transmits one of the first and second wavelength components and reflects the other.

The amount of pulse laser light lost by the beam splitter 115$b$ can thus be reduced. The configuration described above can further suppress incidence of the pulse laser light reflected off the substrate SUB on the imaging section 182.

(7) The laser annealing system 10$b$ according to the second embodiment further includes the XYZ stage 174, which moves the substrate SUB in the X-axis and Y-axis directions, which intersect with the direction in which the pulse laser light is incident on the substrate SUB. The radiation receiving region Sr(k) is irradiated with the pulse laser light having the set number of radiation pulses Np(k) with the XYZ stage 174 paused. The XYZ stage 174 then moves the substrate SUB in such a way that the next radiation receiving region Sr(k+1), which differs from the radiation receiving region Sr(k), is irradiated with the pulse laser light. The laser annealing processor 100 corrects the radiation conditions before the next radiation receiving region Sr(k+1) is irradiated with the pulse laser light.

The radiation conditions can thus be corrected whenever the laser annealing of one radiation receiving region Sr(k) is performed based on the step-and-repeat scheme.

(8) In the laser annealing system 10$b$ according to the second embodiment, the radiation conditions include the fluence of the pulse laser light, and the semiconductor properties include the electron mobility. The laser annealing processor 100 corrects the radiation conditions in such a way that when the estimated value Eme(k) of the electron mobility increases as a result of an increase in the fluence, the fluence further increases, and corrects the radiation conditions in such a way that when the estimated value Eme(k) decreases as a result of an increase in the fluence, the fluence decreases. The laser annealing processor 100 corrects the radiation conditions in such a way that when the estimated value Eme(k) increases as a result of a decrease in the fluence, the fluence further decreases, and corrects the radiation conditions in such a way that when the estimated value Eme(k) decreases as a result of a decrease in the fluence, the fluence increases.

The direction of the fluence control (positive or negative) can thus be accurately determined from the relationship between the direction of a change (positive or negative) in the fluence and the direction of a change (positive or negative) in the estimated value Eme(k) of the electron mobility.

(9) In the laser annealing system 10$b$ according to the second embodiment, the laser annealing processor 100 performs the trial radiation while changing the radiation conditions when the absolute value of the difference $\Delta$Em(k) between the estimated value Eme(k) of the electron mobility and the target value Emt is greater than the second threshold Emtrmax, acquires the image data, and calculates the estimated value Eme(k). The relationship between the radiation conditions and the estimated value Eme(k) is thus acquired, and the radiation conditions are corrected based on the relationship.

The radiation conditions can thus be properly corrected based on the relationship between the radiation conditions and the estimated value Eme(k) even when the optical system of the laser annealing apparatus 14 has deteriorated.

(10) In the laser annealing system 10$b$ according to the second embodiment, the radiation conditions include the number of radiation pulses Np(k), which form the pulse laser light radiated to one location on the substrate SUB. The laser annealing processor 100 corrects the radiation conditions to increase the number of radiation pulses Np(k) when the absolute value of the difference $\Delta$Em(k) between the estimated value Eme(k) of the electron mobility and the target value Emt is greater than the first threshold Emtr.

The electron mobility can thus be brought closer to the target value Emt by increasing the number of radiation pulses Np(k).

As for the other points, the second embodiment is the same as Comparative Example.

3.4 Other Configuration Examples

The laser annealing system $10b$ in the second embodiment may be used in place of the laser annealing system 10 and the image data generation section 20 provided in the machine learning system in the first embodiment. That is, the laser annealing of the annealed sample substrate SUB and the acquisition of image data of the annealed sample may be performed by the laser annealing system $10b$ based on the step-and-repeat scheme.

4. Laser Annealing System $10b$ that Corrects Radiation Conditions by Estimating Gate Threshold Voltage

4.1 Configuration

A third embodiment differs from the second embodiment in that the laser annealing processor 100 estimates the gate threshold voltage instead of estimating the electron mobility. The memory 101 provided in the laser annealing processor 100 stores a learned model that receives image data as input and provides an estimated value Vthe(k) of the gate threshold voltage as output.

As for the other points, the third embodiment is the same as the second embodiment in terms of configuration.

4.2 Operation

Figure 30:
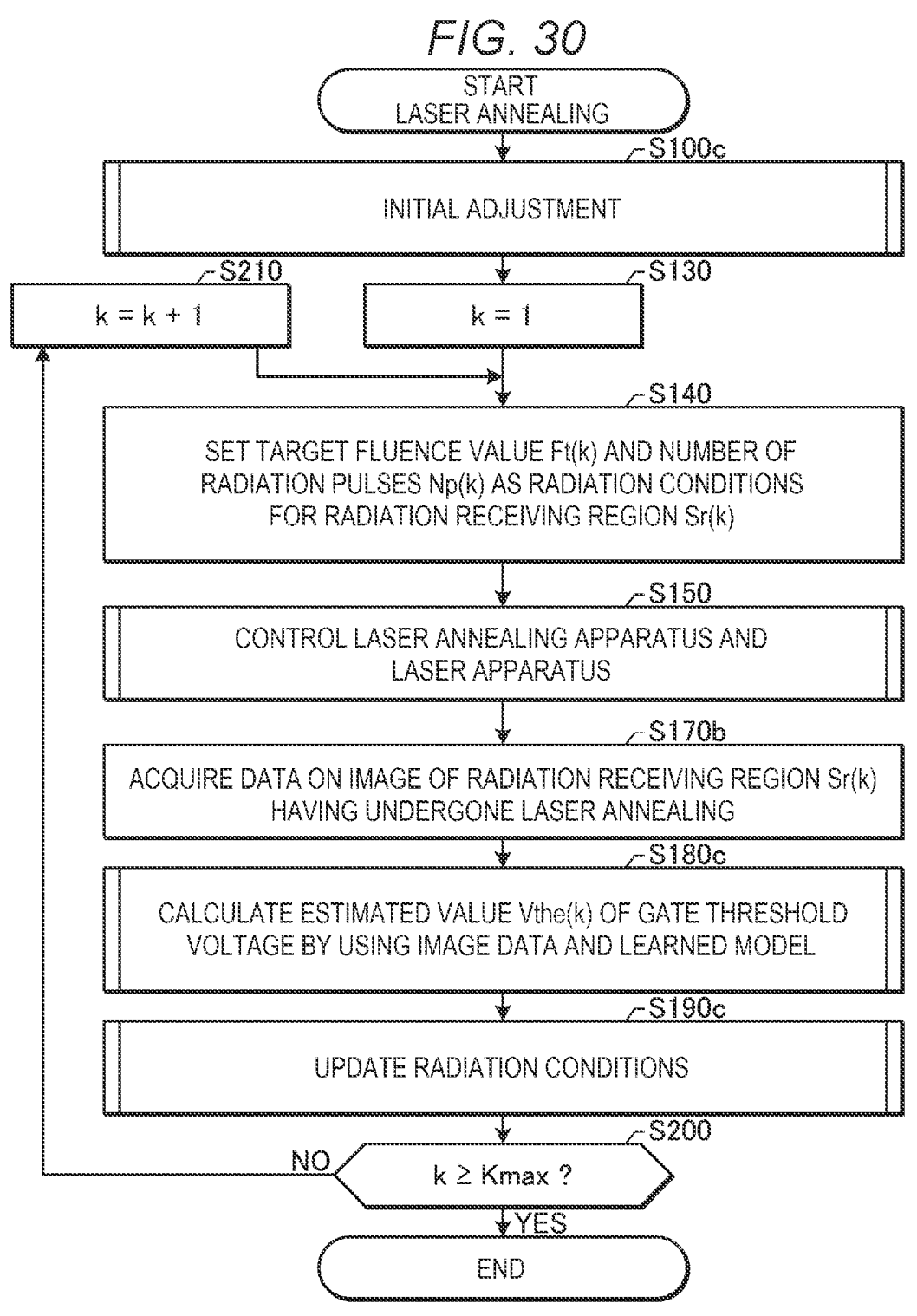
FIG. 30 is a flowchart showing the operation of the laser annealing processor in a third embodiment.

FIG. 30 is a flowchart showing the operation of the laser annealing processor 100 in the third embodiment.

FIG. 31 is a flowchart showing the details of an initial adjustment process shown in FIG. 30.

FIG. 32 is a flowchart showing the details of the process of calculating the estimated value Vthe(k) of the gate threshold voltage shown in FIG. 30.

FIG. 33 is a flowchart showing the details of the process of updating the radiation conditions shown in FIG. 30.

The processes shown in FIGS. 30 to 33 are the same as those shown in FIGS. 20 to 23 except that the electron mobility in FIGS. 20 to 23 is replaced with the gate threshold voltage. Let Vtht be a target value of the gate threshold voltage, Vthe(k) be an estimated value of the gate threshold voltage, ΔVth(k) be the difference between the estimated value Vthe(k) of the gate threshold voltage and the target value Vtht, and Vthtr be a first threshold.

FIG. 34 is a flowchart showing a first example of the process of correcting the radiation conditions shown in FIG. 33. The flowchart shown in FIG. 34 corresponds to the subroutine of S194$c$ in FIG. 33.

FIG. 35 is a graph showing a typical relationship between the target fluence value Ft(k) and the estimated value Vthe(k) of the gate threshold voltage.

FIG. 36 is a table showing the criterion for determination of the direction in which the target fluence value Ft(k) is controlled in the third embodiment.

The curve showing the relationship between the target fluence value Ft(k) and the estimated value Vthe(k) of the gate threshold voltage has a downwardly convex shape, and the target value Vtht of the gate threshold voltage is set at a value close to the minimum of the estimated Vthe(k), as shown in FIG. 35. The direction in which the target fluence value Ft(k) is controlled in accordance with the positive or negative sign of the product of the amounts of change is therefore the opposite direction of the control direction in the second embodiment.

In FIG. 34, when the product of the amount of change in the estimated value Vthe(k) of the gate threshold voltage and the amount of change in the target fluence value Ft(k) is greater than or equal to zero (YES in S1946$c$), the laser annealing processor 100 proceeds to the process in S1947$c$.

When the product of the amounts of change is smaller than zero (NO in S1946$c$), the laser annealing processor 100 proceeds to the process in S1948$c$.

In S1947$c$, the laser annealing processor 100 calculates the next target fluence value Ft(k+1) by subtracting the positive number ΔFt from the current target fluence value Ft(k).

In S1948$c$, the laser annealing processor 100 calculates the next target fluence value Ft(k+1) by adding the positive number ΔFt to the current target fluence value Ft(k).

The first example of the process of correcting the radiation conditions is carried out as described above.

A second example of the process of correcting the radiation conditions is the same as the second embodiment except for (1) and (2) below.

(1) To determine the fluence Ftadj by performing the trial radiation in S1942 to S1945 in FIG. 27, the estimated value Vthe(k) and target value Vtht of the gate threshold voltage are used in place of the estimated value Eme(k) and target value Emt of the electron mobility.

(2) In place of the processes in S1946$b$ to S1948$b$ in FIG. 27, the processes in S1946$c$ to S1948$c$ in FIG. 34 are carried out.

A third example of the process of correcting the radiation conditions is the same as the second embodiment. That is, the number of next radiation pulses Np(k+1) is calculated by adding one to the number of current radiation pulses Np(k) (S1950) whenever the radiation conditions are corrected, as in FIG. 28. However, when the number of radiation pulses Np(k) has reached the threshold Nmax, the number of current radiation pulses Np(k) is set as the number of next radiation pulses Np(k+1) (S1951).

4.3 Effects

(11) In the laser annealing system $10b$ according to the third embodiment, the radiation conditions include the fluence of the pulse laser light, and the semiconductor properties include the gate threshold voltage. The laser annealing processor 100 corrects the radiation conditions in such a way that when the estimated value Vthe(k) of the gate threshold voltage decreases as a result of an increase in the fluence, the fluence further increases, and corrects the radiation conditions in such a way that when the estimated value Vthe(k) increases as a result of an increase in the fluence, the fluence decreases. The laser annealing processor 100 corrects the radiation conditions in such a way that when the estimated value Vthe(k) decreases as a result of a decrease in the fluence, the fluence further decreases, and corrects the radiation conditions in such a way that when the estimated value Vthe(k) increases as a result of a decrease in the fluence, the fluence increases.

The direction of the fluence control (positive or negative) can thus be accurately determined from the relationship between the direction of a change (positive or negative) in the fluence and the direction of a change (positive or negative) in the estimated value Vthe(k) of the gate threshold voltage.

As for the other points, the third embodiment is the same as the second embodiment.

5. Laser Annealing System 10b Based on Step-and-Scan Scheme

5.1 Configuration

A fourth embodiment differs from the second and third embodiments in that the laser annealing is performed based on a step-and-scan scheme in place of the step-and-repeat scheme. In the laser annealing system 10b according to the fourth embodiment, the mask 140 may have a rectangular opening, unlike the dot mask shown in FIG. 2. Instead, the mask 140 may not be used, and the substrate SUB may be irradiated with the pulse laser light having a beam cross-section shaped into a rectangle.

5.2 Operation

FIG. 37 is a plan view showing an example of the method for performing laser annealing of the substrate SUB based on the step-and-scan scheme. In FIG. 37, the surface of the substrate SUB has Mmax scan receiving regions Sc(1) to Sc(Mmax). Let Sc(m) be one of the scan receiving regions Sc(1) to Sc(Mmax). The variable m can be integers ranging from 1 to Mmax.

The broken arrows in FIG. 37 indicate the direction of the movement of a beam cross-section B of the pulse laser light relative to the substrate SUB. The position of the beam cross-section B corresponds to the position where the pulse laser light is incident on the substrate SUB. The beam cross-section B moves by controlling the position of the XYZ stage 174 in the X-axis and Y-axis directions. For example, when the substrate SUB is moved by the XYZ stage 174 in the −X direction, the beam cross-section B relatively moves in the X direction.

The procedure of the laser annealing based on the step-and-scan scheme is as follows:

First, the substrate SUB is so moved that the position of the beam cross-section B coincides with an initial position In(1), which is separate from the scan receiving region Sc(1) in the −X direction. The substrate SUB is then caused to start moving in the −X direction, and the substrate SUB is so accelerated that the speed thereof becomes −Vx before the beam cross-section B reaches the scan receiving region Sc(1). Transmission of the trigger signal at the repetition frequency f to the laser apparatus 12 is then initiated, so that the laser annealing of the scan receiving region Sc(1) is performed. After the laser annealing of the scan receiving region Sc(1) is completed, the transmission of the trigger signal is paused so that the speed of the substrate SUB in the −X direction is decelerated.

The substrate SUB is then so moved that the position of the beam cross-section B coincides with an initial position In(2), which is separate from the scan receiving region Sc(2) in the X direction. The substrate SUB is then caused to start moving in the X direction, and the substrate SUB is so accelerated that the speed thereof becomes Vx before the beam cross-section B reaches the scan receiving region Sc(2). Transmission of the trigger signal at the repetition frequency f to the laser apparatus 12 is then initiated, so that the laser annealing of the scan receiving region Sc(2) is performed. After the laser annealing of the scan receiving region Sc(2) is completed, the transmission of the trigger signal is paused so that the speed of the substrate SUB in the X direction is decelerated.

The laser annealing of the scan receiving regions Sc(3) to Sc(Mmax) is then similarly performed.

Let Bx and By be the lengths of the long and short edges of the rectangular shape of the beam cross-section B. Let Np be the number of radiation pulses that form the pulse laser light radiated to one location on the substrate SUB. The number of radiation pulses Np may be a constant value regardless of the radiation position on the substrate SUB.

The substrate SUB moves over the length Bx at the speed Vx while the laser apparatus 12 outputs the pulse laser light having the radiation pulses Np at the repetition frequency f. That is, the period required to radiate the pulse laser light having the radiation pulses Np at the repetition frequency f is Np/f, and the period required for the beam cross-section B to move over the length Bx at the speed Vx is Bx/Vx. The two periods are equal to each other. The speed Vx is therefore set as follows:

$$Vx=f\cdot Bx/Np$$

FIGS. 38 and 39 are plan views showing an illumination range IL of the substrate SUB, which is illuminated with the illumination light from the illumination light source 181. The illumination range IL illuminated with the illumination light from the illumination light source 181 includes the beam cross-section B of the pulse laser light at the substrate SUB and a portion around the beam cross-section B. The positional relationship between the illumination range IL and the beam cross-section B is fixed. The broken arrows indicate the direction of the movement of the illumination range IL and the beam cross-section B relative to the substrate SUB. That is, when the substrate SUB is moved in the −X direction, the illumination range IL and the beam cross-section B move in the X direction relative to the substrate SUB as shown in FIG. 38, and when the substrate SUB is moved in the X direction, the illumination range IL and the beam cross-section B move in the −X direction relative to the substrate SUB as shown in FIG. 39.

The region having already undergone the laser annealing out of the illumination range IL is hatched. As the beam cross-section B moves, regions that have not yet undergone the laser annealing sequentially undergo the laser annealing.

In the fourth embodiment, the imaging section 182 sequentially acquires data on images of the regions having undergone the laser annealing with the substrate SUB moved by the XYZ stage 174. The region on the substrate SUB that corresponds to the position and size of the beam cross-section B is an example of the first region in the present disclosure. When the substrate SUB is moved in the X direction, the first region also moves in the X direction, and the image data is acquired when the first region coincides with an image acquisition range IM.

The image acquisition range IM is located on the side opposite from the side toward which the beam cross-section B moves. That is, the position as the image acquisition range IM in the illumination range IL at which the imaging section 182 acquires the image data when the substrate SUB is moved by the XYZ stage 174 in the X direction differs from the position as the image acquisition range IM in the illumination range IL at which the imaging section 182 acquires the image data when the substrate SUB is moved by the XYZ stage 174 in the −X direction.

The image acquisition range IM is desirably adjacent to the beam cross-section B. FIGS. 38 and 39 show a case where the image acquisition range IM and the beam cross-section B has the same dimensions, but not necessarily in the present disclosure. The dimensions of the image acquisition range IM may differ from those of the beam cross-section B. It is, however, noted that the dimensions of the image acquisition range IM are desirably equal to those of the imaging target for the image data used to create the learned model.

To prevent the pulse laser light from being captured when the image data of the image acquisition range IM is acquired, it is desirable that the imaging section 182 performs the imaging after the emission of one pulse of the pulse laser light ends but before the emission of the next pulse starts. It is therefore desirable that a period Ts, for which the shutter 184 is open satisfies the following condition:

$$Ts < 1/f - \tau$$

where $\tau$ represents the temporal width of each of the pulses that form pulse laser light. The period Ts, for which shutter 184 is open, is therefore shorter than the repetition cycle 1/f of the pulse laser light. The timing of a shutter trigger signal transmitted from the imaging controller 187 to the shutter 184 is so controlled that after the emission of one pulse of the pulse laser light ends, the shutter 184 opens and closes before the emission of the next pulse starts.

Furthermore, to suppress image blurring caused by the movement of the substrate SUB, the period Ts, for which the shutter 184 is open, desirably satisfies the following condition:

$$Ts < \Delta x / Vx$$

where $\Delta x$ is the amount of allowable image blurring.

5.3 Operation of Laser Annealing Processor 100

5.3.1 Main Procedure

Figure 40:
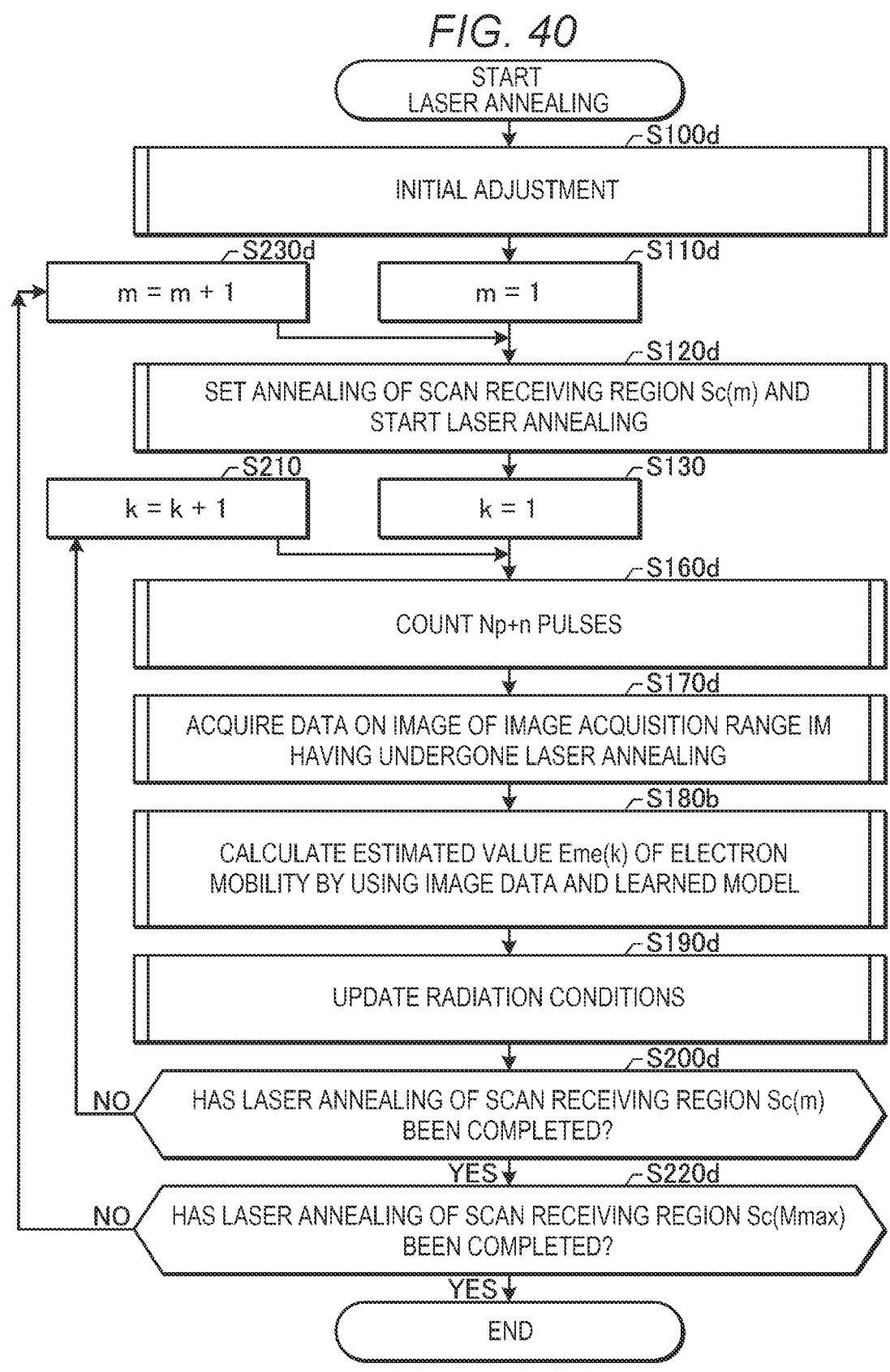
FIG. 40 is a flowchart showing the operation of the laser annealing processor in a fourth embodiment.

FIG. 40 is a flowchart showing the operation of the laser annealing processor 100 in the fourth embodiment. In the fourth embodiment, the laser annealing based on the step-and-scan scheme is performed in the method below.

In S100d, the laser annealing processor 100 performs initial adjustment. S100d will be described later in detail with reference to FIG. 41.

In S110d, the laser annealing processor 100 sets the value of m at one, which is the initial value. The values of m correspond to those described with reference to FIG. 37.

In S120d, the laser annealing processor 100 sets the annealing of the scan receiving region Sc(m) and starts the laser annealing of the scan receiving region Sc(m). S120d will be described later in detail with reference to FIG. 42.

In S130, the laser annealing processor 100 sets the value of k at one, which is the initial value. As described below, in the fourth embodiment, acquisition of image data (S170d), calculation of the estimated value Eme(k) of the electron mobility (S180b), and update of the radiation conditions (S190d) are each performed once with the beam cross-section B moved in the scan receiving region Sc(m), and the value of k is updated whenever the acquisition, calculation, and update are each performed once. During the laser annealing of one scan receiving region Sc(m), the value of k is updated multiple times.

In S160d, the laser annealing processor 100 counts Np+n pulses that form the trigger signal. Assuming that the processes in S170d to S200d take only a short period, the period equivalent to the Np+n pulses approximately corresponds to the cycle in which the radiation conditions are updated.

Reference character n is an integer greater than or equal to zero. S160d will be described later in detail with reference to FIG. 43.

In S170d, the laser annealing processor 100 acquires image data of the image acquisition range IM having undergone the laser annealing. S170d will be described later in detail with reference to FIG. 44.

In S180b, the laser annealing processor 100 calculates the estimated value Eme(k) of the electron mobility by using the image data and the learned model. The process in S180b is the same as that in the second embodiment.

In S190d, the laser annealing processor 100 updates the pulse laser light radiation conditions based on the estimated value Eme(k) of the electron mobility. In S190d, the process of updating the fluence target value Ft(k) as the radiation conditions is the same as that in the second embodiment, and, for example, either the first or second example described above is applicable. Note that the number of radiation pulses Np does not need to be updated in the fourth embodiment.

In S200d, the laser annealing processor 100 evaluates whether the laser annealing of the scan receiving region Sc(m) has been completed.

When the laser annealing of the scan receiving region Sc(m) has not been completed (NO in S200d), the laser annealing processor 100 proceeds to the process in S210. In S210, the laser annealing processor 100 adds one to the value of k to update the value of k. The laser annealing processor 100 then returns to the process in S160d, and after outputting the Np+n pulses, the laser annealing processor 100 acquires the image data (S170d), calculates the estimated value Eme(k) of the electron mobility (S180b), and updates the radiation conditions (S190d).

When the laser annealing of the scan receiving region Sc(m) has been completed (YES in S200d), the laser annealing processor 100 proceeds to the process in S220d.

In S220d, the laser annealing processor 100 evaluates whether the laser annealing of the scan receiving region Sc(Mmax) has been completed. That is, the laser annealing processor 100 evaluates whether the value of m is greater than or equal to Mmax.

When the laser annealing of the scan receiving region Sc(Mmax) has not been completed (NO in S220d), the laser annealing processor 100 proceeds to the process in S230d. In S230d, the laser annealing processor 100 adds one to the value of m to update the value of m. The laser annealing processor 100 then returns to the process in S120d.

When the laser annealing of the scan receiving region Sc(Mmax) has been completed (YES in S220d), the laser annealing processor 100 terminates the processes in the present flowchart.

5.3.2 Initial Adjustment

FIG. 41 is a flowchart showing the details of an initial adjustment process shown in FIG. 40. The flowchart shown in FIG. 41 corresponds to the subroutine of 8100d in FIG. 40.

The process in S101 is the same as that in Comparative Example and the second embodiment.

In S102d, the laser annealing processor 100 reads the target fluence value Ft(1), the number of radiation pulses Np, and the target value Emt of the electron mobility.

In S103d, the laser annealing processor 100 controls the position of the XYZ stage 174 in the Z-axis direction in such a way that the image of the mask 140 is formed at the surface of the substrate SUB, and stops the XYZ stage 174 at that position.

After S103*d*, the laser annealing processor 100 terminates the processes of the present flowchart and returns to the processes shown in FIG. 40.

5.3.3 Setting Annealing of Scan Receiving Region Sc(m) and Starting Annealing FIG. 42 is a flowchart showing the details of setting the annealing of the scan receiving region Sc(m) and starting the annealing shown in FIG. 40. The flowchart shown in FIG. 42 corresponds to the subroutine of S120*d* in FIG. 40.

In S121, the laser annealing processor 100 sets the target fluence value Ft(m) and the number of radiation pulses Np. The target fluence value Ft(m) in a case where the value of m is one is the target fluence value Ft(1) read in S102*d*. The target fluence value Ft(m) in a case where the value of m is greater than or equal to two is the last target fluence value Ft(k) in the previous scan receiving region Sc(m−1).

In S122, the laser annealing processor 100 controls the attenuator 120 based on the target fluence value Ft(m) and the pulse energy of the pulse laser light outputted from the laser apparatus 12.

In S123, the laser annealing processor 100 controls the position of the XYZ stage 174 in the X-axis and Y-axis directions in such a way that the beam cross-section B of the pulse laser light is located at an initial position In(m) of the scan receiving region Sc(m).

In S124, the laser annealing processor 100 sets the scan direction of the beam cross-section B to be the positive direction when m is an odd number, and sets the scan direction of the beam cross-section B to be the negative direction when m is an even number. The scan direction is the X direction or the −X direction indicated by the broken arrows in FIGS. 37 to 39.

In S125, the laser annealing processor 100 causes the XYZ stage 174 to start moving the substrate SUB and accelerates the substrate SUB in such a way that the speed thereof becomes Vx or −Vx.

In S126, the laser annealing processor 100 starts transmitting the trigger signal at the repetition frequency f to the laser apparatus 12. The scan receiving region Sc(m) is thus irradiated with the pulse laser light outputted from the laser apparatus 12 with the substrate SUB moved, and therefore undergoes the laser annealing. When the laser annealing of the scan receiving region Sc(m) is completed (YES in S200*d*), the laser annealing processor 100 may cause the XYZ stage 174 to stop moving the substrate SUB in the X direction or the −X direction, and may stop transmitting the trigger signal until the laser annealing of the next scan receiving region Sc(m+1) starts.

After S126, the laser annealing processor 100 terminates the processes of the present flowchart and returns to the processes shown in FIG. 40.

5.3.4 Counting Np+n Pulses

FIG. 43 is a flowchart showing the details of the process of counting Np+n pulses shown in FIG. 40. The flowchart shown in FIG. 43 corresponds to the subroutine of S160*d* in FIG. 40.

In S161, the laser annealing processor 100 sets the value of a counter Nc, which counts the number of pulses, at an initial value of zero.

In S162, the laser annealing processor 100 evaluates whether the trigger signal has been transmitted to the laser apparatus 12. When the trigger signal has not been transmitted (NO in S162), the laser annealing processor 100 waits until the trigger signal is transmitted. When the trigger signal has been transmitted (YES in S162), the laser annealing processor 100 proceeds to the process in S163.

In S163, the laser annealing processor 100 adds one to the value of the counter Nc to update the value of Nc.

In S164, the laser annealing processor 100 evaluates whether the value of the counter Nc is greater than or equal to Np+n. When the value of Nc is smaller than Np+n (NO in S164), the laser annealing processor 100 returns to the process in S162. When the value of Nc is greater than or equal to Np+n (YES in S164), the laser annealing processor 100 terminates the processes of the present flowchart and returns to the processes shown in FIG. 40.

Since n is an integer greater than or equal to zero, whenever the laser apparatus 12 outputs the pulse laser light having Np or greater number of pulses, an evaluation is made as to whether the pulse laser light radiation conditions should be corrected.

For example, when the value of n is zero, the cycle in which the radiation conditions are updated corresponds approximately to the period for which the Np pulses elapse, and the radiation conditions, such as the target fluence value Ft(k), can be updated frequently.

However, for example, when the target fluence value Ft(k) is corrected and the period corresponding to the Np pulses has elapsed, the image acquisition range IM includes the portion having undergone the laser annealing according to the target fluence value Ft(k−1) before the correction.

It is therefore desirable to evaluate whether to correct the pulse laser light radiation conditions whenever the pulse laser apparatus 12 outputs the pulse laser light having 2×Np or greater number of pulses.

For example, when the value of n is Np, the cycle in which the radiation conditions are updated corresponds approximately to the period for which the 2×Np pulses elapse. When the target fluence value Ft(k) is corrected and the period corresponding to the 2×Np pulses elapse, the image acquisition range IM has undergone the laser annealing according to the corrected target fluence value Ft(k). Using the image data produced by capturing an image of the image acquisition range IM allows more proper correction of the next target fluence value Ft(k+1).

5.3.5 Acquiring Image Data

FIG. 44 is a flowchart showing the details of the process of acquiring the image data shown in FIG. 40. The flowchart shown in FIG. 44 corresponds to the subroutine of S170*d* in FIG. 40.

In S171, the laser annealing processor 100 sets the image acquisition range IM at a position shifted from the beam cross-section B of the pulse laser light in the opposite direction of the scan direction. Examples of the image acquisition range IM have been described with reference to FIGS. 38 and 39.

In S172, the laser annealing processor 100 captures an image of the image acquisition range IM.

After S172, the laser annealing processor 100 terminates the processes of the present flowchart and returns to the processes shown in FIG. 40.

In FIG. 44, an image of the image acquisition range IM is captured after the image acquisition range IM is set so that the amount of data produced by the image capturing is small.

To carry out the process described above, the drive circuit 186 of the imaging section 182 (see FIG. 19) may be configured not to detect the charge of all the pixels of the image sensor 185 but to detect the charge within a specified range out of all the pixels of the image sensor 185. In this case, the imaging controller 187 specifies the range over which the drive circuit 186 detects the charge out of all the pixels of the image sensor 185 and acquires the image data from the drive circuit 186.

The method for acquiring the image data is not limited to the method described above. For example, the drive circuit 186 may acquire an image by detecting the charge from all the pixels of the image sensor 185, and the imaging controller 187 may cut out the image data of the image acquisition range IM from the image to acquire the image data.

5.4 Effects

(12) The laser annealing system 10$b$ according to the fourth embodiment includes the XYZ stage 174, which moves the substrate SUB in the X-axis and Y-axis directions, which intersect with the direction in which the pulse laser light is incident on the substrate SUB. The XYZ stage 174 moves the substrate SUB by a distance corresponding to the beam width Bx of the pulse laser light while the semiconductor film is irradiated with the pulse laser light having the set number of radiation pulses Np. The laser annealing processor 100 evaluates whether to correct the radiation conditions whenever the semiconductor film is irradiated with the pulse laser light having pulses more than or equal to the radiation pulses Np.

The radiation conditions can thus be corrected with the substrate SUB being moved based on the step-and-scan scheme. In addition, the period for which the substrate SUB is paused can be reduced as compared with the period required when the step-and-repeat scheme is employed.

(13) In the laser annealing system 10$b$ according to the fourth embodiment, the laser annealing processor 100 evaluates whether to correct the radiation conditions whenever the semiconductor film is irradiated with the pulse laser light having pulses more than or equal to twice the radiation pulses Np.

Image data of the semiconductor film having undergone the laser annealing can thus be acquired in accordance with the radiation conditions after the previous correction, whereby the radiation conditions can be corrected more properly.

(14) In the laser annealing system 10$b$ according to the fourth embodiment, the imaging section 182 acquires the image data by capturing an image of the first region while the XYZ stage 174 moves the substrate SUB.

The configuration described above can suppress a period for which the substrate SUB is paused to acquire the image data.

(15) In the laser annealing system 10$b$ according to the fourth embodiment, the imaging section 182 includes the shutter 184, which blocks the reflected illumination light, and the period Ts, for which the shutter 184 is open, is shorter than the repetition cycle 1/f of the pulse laser light.

Therefore, to prevent the pulse laser light from being captured when the image data is acquired, the image data can be acquired after the emission of one pulse of the pulse laser light ends but before the emission of the next pulse starts.

(16) The laser annealing system 10$b$ according to the fourth embodiment includes the XYZ stage 174, which moves the substrate SUB in the X-axis and Y-axis directions, which intersect with the direction in which the pulse laser light is incident on the substrate SUB. The illumination light source 181 is configured to irradiate the illumination range IL with the illumination light, the illumination range IL including the position where the pulse laser light is incident on the substrate SUB and a region around the position. The imaging section 182 includes the image sensor 185, which can capture an image of the illumination range IL, the drive circuit 186, which reads out image data of a specified range from the image sensor 185, and the imaging controller 187, which controls the drive circuit 186. When the first region annealed by the pulse laser light is moved by the XYZ stage 174 to another position within the illumination range IL, the imaging controller 187 specifies the moved first region and acquires the image data of the first region.

The imaging controller 187 thus specifies the first region out of the illumination range IL, an image of which can be captured by the image sensor 185, and acquires image data of the first region, whereby the amount of data produced by the imaging is reduced.

(17) In the laser annealing system 10$b$ according to the fourth embodiment, the XYZ stage 174 is configured to be movable in the X direction and the –X direction. The position in the illumination range IL where the imaging section 182 acquires the image data when the XYZ stage 174 moves in the X direction differs from the position in the illumination range IL where the imaging section 182 acquires the image data when the XYZ stage 174 moves in the –X direction.

The range over which the image data is acquired when the XYZ stage 174 moves in the X direction can be different from the range over which the image data is acquired when the XYZ stage 174 moves in the –X direction, whereby the positional relationship between the position where the pulse laser light is incident on the substrate SUB and the illumination range IL illuminated by the illumination light source 181 can be fixed.

(18) The laser annealing system 10$b$ according to the fourth embodiment includes the XYZ stage 174, which moves the substrate SUB in the X-axis and Y-axis directions, which intersect with the direction in which the pulse laser light is incident on the substrate SUB. The illumination light source 181 is configured to irradiate the illumination range IL with the illumination light, the illumination range IL including the position where the pulse laser light is incident on the substrate SUB and a region around the position. The imaging section 182 includes the image sensor 185, which can capture an image of the illumination range IL, and the imaging controller 187, which cuts out a portion of the image of the illumination range IL to acquire the image data of the cut portion. When the first region annealed by the pulse laser light is moved by the XYZ stage 174 to another position within the illumination range IL, the imaging controller 187 cuts out the image of the moved first region from the image of the illumination range IL to acquire image data of the cut portion.

Image data over a required range can thus be cut out from the image of the illumination range IL without a complicated drive circuit 186.

As for the other points, the fourth embodiment is the same as the second embodiment. The electron mobility may not be estimated, but the gate threshold voltage may instead be estimated in the fourth embodiment, as in the third embodiment.

5.5 Other Configuration Examples

The laser annealing system 10b in the fourth embodiment may be used in place of the laser annealing system 10 and the image data generation section 20 provided in the machine learning system in the first embodiment. That is, the laser annealing of the annealed sample substrate SUB and the acquisition of image data of the annealed sample may be performed by the laser annealing system 10b based on the step-and-scan scheme.

6. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A machine learning method comprising:
acquiring image data generated from reflected light of illumination light radiated to a first region of a semiconductor film on a substrate, the first region annealed by pulse laser light;
acquiring data on a measured semiconductor property of the first region;
generating training data including the image data as input and the measured data as output associated with each other; and
performing machine learning using a neural network based on the training data to generate a learned model,
wherein after the image data is acquired, a semiconductor device is produced by carrying out semiconductor processes, and the measured data is then acquired.

2. The machine learning method according to claim 1, further comprising evaluating the learned model,
wherein the learned model is generated by using a part of the training data as learning data, and
the learned model is evaluated by using another part of the training data as evaluation data.

3. A laser annealing system comprising:
a laser apparatus configured to output pulse laser light for performing laser annealing of a first region of a semiconductor film on a substrate;
an illumination light source configured to irradiate the first region with illumination light;
an imaging section configured to generate image data from reflected light of the illumination light; and
a processor,

38 the processor being configured to have access to a learned model that accepts the image data as input and provides an estimated value of a semiconductor property as output,
calculate the estimated value by using the image data and the learned model, and
correct, based on the estimated value, a radiation condition under which the pulse laser light is radiated,
wherein the radiation condition includes fluence of the pulse laser light,
the semiconductor property includes electron mobility, and
the processor is configured to
correct the radiation condition in such a way that when the estimated value increases as a result of an increase in the fluence, the fluence further increases,
correct the radiation condition in such a way that when the estimated value decreases as a result of an increase in the fluence, the fluence decreases,
correct the radiation condition in such a way that when the estimated value increases as a result of a decrease in the fluence, the fluence further decreases, and
correct the radiation condition in such a way that when the estimated value decreases as a result of a decrease in the fluence, the fluence increases.

4. The laser annealing system according to claim 3,
further comprising a beam splitter disposed in an optical path of the pulse laser light,
wherein the illumination light source is configured to irradiate the first region with the illumination light via the beam splitter, and
the imaging section receives the reflected light via the beam splitter.

5. The laser annealing system according to claim 4,
wherein the pulse laser light contains a first wavelength component in an ultraviolet light band,
the illumination light contains a plurality of second wavelength components in a visible light band, and
the beam splitter is a dichroic mirror that transmits one of the first and second wavelength components and reflects another thereof.

6. The laser annealing system according to claim 3,
further comprising a stage configured to move the substrate in a direction that intersects with a direction in which the pulse laser light is incident on the substrate,
wherein the first region is irradiated with the pulse laser light having a set number of radiation pulses with the stage paused,
the stage then moves the substrate in such a way that a second region different from the first region is irradiated with the pulse laser light, and
the processor corrects the radiation condition before the second region is irradiated with the pulse laser light.

7. The laser annealing system according to claim 3,
further comprising a stage configured to move the substrate in a direction that intersects with a direction in which the pulse laser light is incident on the substrate,
wherein the stage moves the substrate by a distance corresponding to a beam width of the pulse laser light while the semiconductor film is irradiated with the pulse laser light having the set number of radiation pulses, and
the processor evaluates whether to correct the radiation condition whenever the semiconductor film is irradiated with the pulse laser light having pulses more than or equal to the radiation pulses.

8. The laser annealing system according to claim 7, wherein the processor evaluates whether to correct the radiation condition whenever the semiconductor film is irradiated with the pulse laser light having pulses more than or equal to twice the radiation pulses.

9. The laser annealing system according to claim 7, wherein the imaging section acquires the image data by capturing an image of the first region while the stage moves the substrate.

10. The laser annealing system according to claim 7, wherein the imaging section includes a shutter configured to block the reflected light, and a period for which the shutter is open is shorter than a repetition cycle of the pulse laser light.

11. The laser annealing system according to claim 3, further comprising a stage configured to move the substrate in a direction that intersects with a direction in which the pulse laser light is incident on the substrate, wherein the illumination light source is configured to irradiate an illumination range with the illumination light, the illumination range including a position where the pulse laser light is incident on the substrate and a region around the position, the imaging section includes an image sensor configured to be capable of capturing an image of the illumination range, a drive circuit configured to read out image data of a specified range from the image sensor, and an imaging controller configured to control the drive circuit, and when the first region annealed by the pulse laser light is moved by the stage to another position within the illumination range, the imaging controller specifies the moved first region and acquires the image data of the first region.

12. The laser annealing system according to claim 11, wherein the stage is configured to be movable in first and second directions, and the position in the illumination range where the imaging section acquires the image data when the stage moves in the first direction differs from the position in the illumination range where the imaging section acquires the image data when the stage moves in the second direction.

13. The laser annealing system according to claim 3, further comprising a stage configured to move the substrate in a direction that intersects with a direction in which the pulse laser light is incident on the substrate, wherein the illumination light source is configured to irradiate an illumination range with the illumination light, the illumination range including a position where the pulse laser light is incident on the substrate and a region around the position, the imaging section includes an image sensor configured to be capable of capturing an image of the illumination range, and an imaging controller configured to cut out a portion of the image of the illumination range to acquire the image data of the cut portion, and when the first region annealed by the pulse laser light is moved by the stage to another position within the illumination range, the imaging controller cuts out an image of the moved first region from the image of the illumination range to acquire the image data of the cut portion.

14. The laser annealing system according to claim 13, wherein the stage is configured to be movable in first and second directions, and the position in the illumination range where the imaging section acquires the image data when the stage moves in the first direction differs from the position in the illumination range where the imaging section acquires the image data when the stage moves in the second direction.

15. A laser annealing method comprising:

annealing a first region of a semiconductor film on a substrate with pulse laser light;

irradiating the first region with illumination light to generate image data from reflected light of the illumination light;

calculating an estimated value of a semiconductor property by using a learned model that accepts the image data as input and provides the estimated value as output; and correcting, based on the estimated value, a radiation condition under which the pulse laser light is radiated, wherein the radiation condition includes fluence of the pulse laser light, the semiconductor property includes electron mobility, and the laser annealing method further comprises:

correcting the radiation condition in such a way that when the estimated value increases as a result of an increase in the fluence, the fluence further increases, correcting the radiation condition in such a way that when the estimated value decreases as a result of an increase in the fluence, the fluence decreases, correcting the radiation condition in such a way that when the estimated value increases as a result of a decrease in the fluence, the fluence further decreases, and correcting the radiation condition in such a way that when the estimated value decreases as a result of a decrease in the fluence, the fluence increases.

* * * * *